(12) United States Patent
Lee et al.

(10) Patent No.: US 12,167,695 B2
(45) Date of Patent: Dec. 10, 2024

(54) VIBRATION APPARATUS AND APPARATUS INCLUDING THE SAME

(71) Applicant: LG Display Co., Ltd., Seoul (KR)

(72) Inventors: Sungtae Lee, Paju-si (KR); Yongjoon Kim, Paju-si (KR); Sungsu Ham, Paju-si (KR); Joongsup Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 714 days.

(21) Appl. No.: 17/460,872

(22) Filed: Aug. 30, 2021

(65) Prior Publication Data

US 2022/0069194 A1     Mar. 3, 2022

(30) Foreign Application Priority Data

Aug. 31, 2020   (KR) .................. 10-2020-0110489

(51) Int. Cl.
| | | |
|---|---|---|
| H01L 41/02 | (2006.01) | |
| H04R 3/04 | (2006.01) | |
| H10N 30/20 | (2023.01) | |
| H10N 30/87 | (2023.01) | |

(52) U.S. Cl.
CPC .............. *H10N 30/20* (2023.02); *H04R 3/04* (2013.01); *H10N 30/872* (2023.02); *H04R 2499/15* (2013.01)

(58) Field of Classification Search
CPC .......................... H10N 30/20; H10N 30/872
USPC ........................ 310/328, 340, 348
See application file for complete search history.

(56) References Cited

U.S. PATENT DOCUMENTS

| | | | |
|---|---|---|---|
| 2008/0303782 A1* | 12/2008 | Grant | ................. G06F 3/016 345/173 |
| 2013/0241352 A1 | 9/2013 | Hayashi et al. | |
| 2015/0054779 A1 | 2/2015 | Horii et al. | |
| 2015/0341714 A1 | 11/2015 | Ahn et al. | |
| 2019/0141424 A1 | 5/2019 | Kim et al. | |
| 2019/0324596 A1 | 10/2019 | Lee et al. | |
| 2020/0059733 A1 | 2/2020 | Shin et al. | |
| 2020/0154214 A1 | 5/2020 | Jang et al. | |
| 2020/0209387 A1 | 7/2020 | Yeon et al. | |

(Continued)

FOREIGN PATENT DOCUMENTS

| | | |
|---|---|---|
| CN | 105096778 A | 11/2015 |
| CN | 109769176 A | 5/2019 |

(Continued)

OTHER PUBLICATIONS

Office Action dated Feb. 16, 2023 issued in corresponding Taiwanese Patent Application No. 110131850.
Partial Search Report issued by the European Patent Office in corresponding EP Application No. 21193282.7, dated Jan. 31, 2022.
Office Action issued in corresponding Taiwanese Patent Application No. 11221238530, dated Dec. 7, 2023. (Note: CN 111464914 A, CN 110854262 A and TW 202027519 A have been previously cited).

(Continued)

*Primary Examiner* — Derek J Rosenau
(74) *Attorney, Agent, or Firm* — Morgan, Lewis & Bockius LLP

(57) ABSTRACT

An apparatus includes a display panel displaying an image and a vibration apparatus disposed at a rear surface of the display panel to vibrate the display panel. The vibration apparatus may include a plurality of vibration generators overlapping one another. Accordingly, a sound may be generated based on a vibration of the display panel, and a sound having an enhanced sound pressure level characteristic may be output in a forward direction of the display panel.

25 Claims, 13 Drawing Sheets

(56) References Cited

U.S. PATENT DOCUMENTS

2020/0233629 A1    7/2020   Yeon et al.
2020/0363708 A1   11/2020   Guo
2021/0266678 A1    8/2021   Miyoshi

FOREIGN PATENT DOCUMENTS

| | | |
|---|---|---|
| CN | 110854262 A | 2/2020 |
| CN | 111182283 A | 5/2020 |
| CN | 111182383 A | 5/2020 |
| CN | 111384134 A | 7/2020 |
| CN | 111464914 A | 7/2020 |
| KR | 10-2019-0041768 A | 4/2019 |
| KR | 20190065761 A | 6/2019 |
| KR | 10-2020-0083893 A | 7/2020 |
| TW | 202027519 A | 7/2020 |

OTHER PUBLICATIONS

Office Action issued in corresponding Chinese Patent Application No. 202111006768.6, dated Mar. 29, 2024. (Note: CN 110854262 A and US 2020/0233629 A1 have been previously cited).

Office Action issued in corresponding European Patent Application No. 21193282.7, dated Feb. 15, 2024. (Note: US 2020/0233629 A1, KR 2019/0041768 A, US 2020/0059733 A1, KR 2019/0065761 A, US 2015/0054779 A1, US 2019/0324596 A1 and US 2013/0241352 A1, have been previously cited).

Extended Search Report issued by the European Patent Office in corresponding EP Application No. 21193282.7, dated May 23, 2022. Note: US 2020/0233629 and KR 10-2019-0041768 cited therein are already of record.

Office Action issued Jan. 5, 2024 for Taiwanese Divisional Patent Application No. 11320025650.

\* cited by examiner

VIBRATION APPARATUS AND APPARATUS INCLUDING THE SAME

CROSS-REFERENCE TO RELATED APPLICATIONS

This application claims the benefit of and priority to Korean Patent Application No. 10-2020-0110489 filed on Aug. 31, 2020, the entirety of which is hereby incorporated by reference.

BACKGROUND

Technical Field

The present disclosure relates to a vibration apparatus and an apparatus including the same.

Discussion of the Related Art

In display apparatuses, a display panel displays an image, and a separate speaker should be installed for providing a sound. When a speaker is in a display apparatus, the speaker occupies a space; due to this, the design and spatial disposition of the display apparatus are limited.

However, because a sound output from a speaker may travel to a rearward or a downward direction of the display apparatus, sound quality may be degraded due to interference between sounds reflected from a wall and the ground. For this reason, it may be difficult to transfer an accurate sound, and the immersion experience of a viewer is reduced.

SUMMARY

The inventors have recognized problems described above and have performed various experiments for implementing a vibration apparatus for enhancing the quality of a sound and a sound pressure characteristic. Therefore, through the various experiments, the inventors have invented an apparatus having a new structure, which includes a vibration apparatus for enhancing the quality of a sound and a sound pressure characteristic.

Accordingly, embodiments of the present disclosure are directed to a vibration apparatus and an apparatus including the same that substantially obviate one or more problems due to limitations and disadvantages of the related art.

An aspect of the present disclosure is to provide a vibration apparatus and an apparatus including the same which vibrates the display panel to generate a sound and includes enhanced a sound pressure level characteristic.

Another aspect of the present disclosure is to provide a vibration apparatus and an apparatus including the same which improves sound characteristics of a low-pitched sound band generated according to the displacement of the display panel by increasing the amplitude displacement of the display panel.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an apparatus comprises a display panel configured to display an image, and a vibration apparatus at a rear surface of the display panel to vibrate the display panel, the vibration apparatus comprises a plurality of vibration generators overlapping one another.

In another aspect of the present disclosure, an apparatus comprises a display panel configured to display an image, and a vibration apparatus at a rear surface of the display panel, and a plate disposed between the display panel and the vibration apparatus, the vibration apparatus comprises a plurality of vibration generators stacked to be displaced in the same direction, and an adhesive member between the plurality of vibration generators.

In another aspect of the present disclosure, a vibration apparatus comprises a plurality of vibration generators stacked to be displaced in the same direction, and an adhesive member between the plurality of vibration generators.

In another aspect of the present disclosure, an apparatus comprises a vibration object, and a vibration apparatus in the vibration object, the vibration apparatus comprises a plurality of vibration generators stacked to be displaced in the same direction, and an adhesive member between the plurality of vibration generators.

The apparatus according to the embodiments of the present disclosure may vibrate a display panel to generate a sound and may output a sound, having an enhanced sound pressure level characteristic, in a forward direction of the display panel.

In the apparatus according to the embodiments of the present disclosure, as an amplitude displacement of the display panel increases, the middle-pitched sound band, low-pitched sound band, and/or middle-low-pitched sound band characteristics of a sound generated based on a displacement of the display panel may be enhanced.

In the vibration apparatus according to the embodiments of the present disclosure, the middle-pitched sound band, low-pitched sound band, and/or middle-low-pitched sound band characteristics of a sound generated based on a displacement of a vibration plate may be enhanced.

Other systems, methods, features and aspects will be, or will become, apparent to one with skill in the art upon examination of the following figures and detailed description. It is intended that all such additional systems, methods, features and aspects be included within this description, be within the scope of the present disclosure, and be protected by the following claims. Nothing in this section should be taken as a limitation on those claims. Further aspects and features are discussed below in conjunction with embodiments of the disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
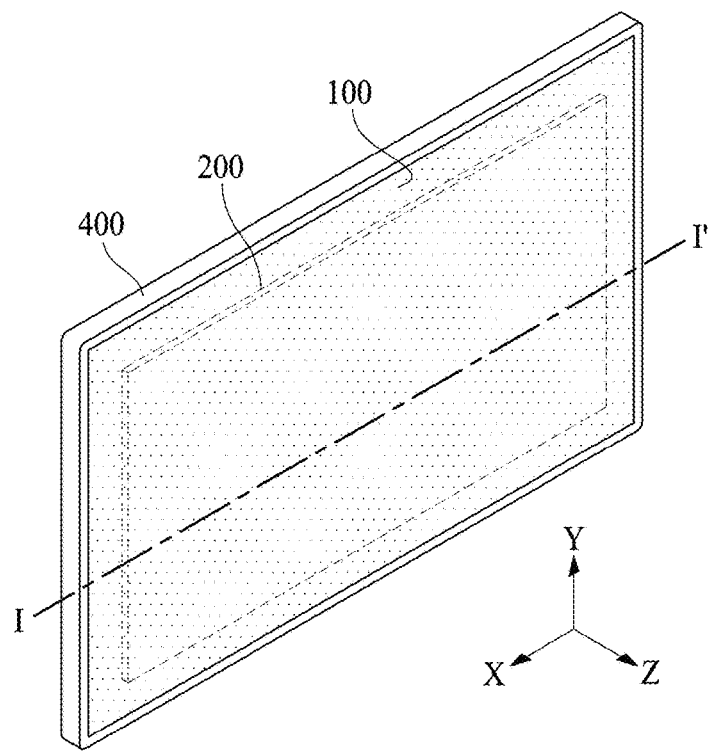
FIG. 1 illustrates an apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic apparatus such as a notebook computer, a TV, a computer monitor, an equipment apparatus including an automotive apparatus or another type apparatus for vehicles, or a mobile electronic device such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set device which is a final consumer device or an application product including the LCM or the OLED module.

In some embodiments, an LCM or an OLED module including a display panel and a driver may be referred to as a narrow-sense display apparatus, and an electronic apparatus which is a final product including an LCM or an OLED module may be referred to as a set apparatus. For example, the narrow-sense display apparatus may include a display panel, such as an LCD or an OLED, and a source printed circuit board (PCB) which is a controller for driving the display panel. The set apparatus may further include a set PCB which is a set controller electrically connected to the source PCB to overall control the set apparatus.

A display panel applied to the present embodiment may use all types of display panels such as a liquid crystal display panel, an organic light emitting diode (OLED) display panel, and an electroluminescent display panel, but the terms are not limited to a specific display panel, which is vibrated by a sound generation device according to the present embodiment to output a sound. Also, a shape or a size of a display panel applied to a display apparatus according to the present embodiment is not limited.

For example, when the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT) which is a switching element for adjusting a light transmittance of each of the plurality of pixels, an upper substrate including a color filter and/or a black matrix, and a liquid crystal layer between the array substrate and the upper substrate.

Moreover, when the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another embodiment of the present disclosure, the layer provided on the array substrate may include a micro light emitting diode.

The display panel may further include a backing such as a metal plate attached on the display panel. However, the present embodiment is not limited to the metal plate, and the display panel may include another structure.

In some embodiments of the present disclosure, the apparatus including a vibration apparatus may be applied to vehicles as a user interface module such as a central control panel for automobiles. For example, the apparatus may be provided between occupants sitting on two front seats in order for a vibration of the display panel to be transferred to the inside of a vehicle. Therefore, an audio experience in a vehicle is improved in comparison with a case where speakers are disposed on interior sides of the vehicle.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Figure 2:
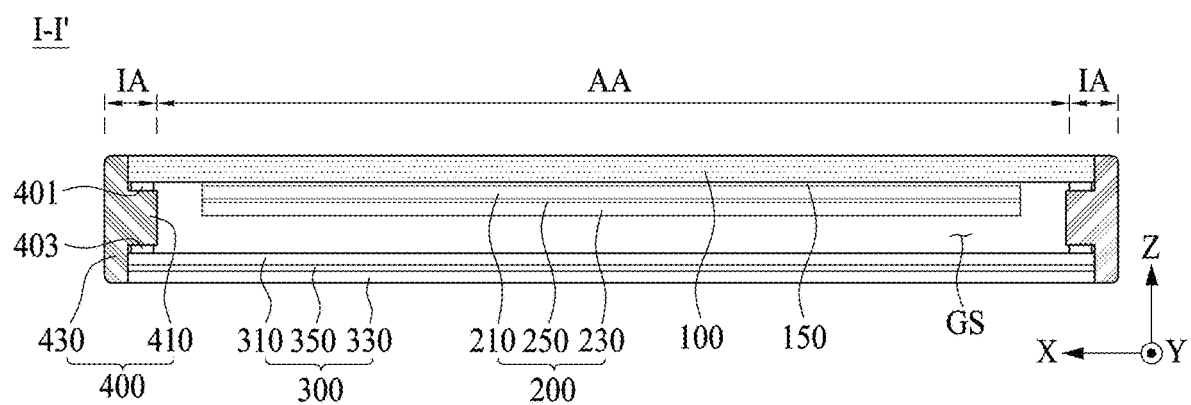
FIG. 2 is a cross-sectional view taken along line I-I' illustrated in FIG. 1.

FIG. 1 illustrates an apparatus according to an embodiment of the present disclosure, and FIG. 2 is a cross-sectional view taken along line I-I' illustrated in FIG. 1. The apparatus according to embodiments of the present disclosure may be a display apparatus or an electronic apparatus including a vibration apparatus, but embodiments of the present disclosure are not limited thereto.

With reference to FIGS. 1 and 2, an apparatus according to an embodiment of the present disclosure may include a display panel 100 to display an image, and a vibration apparatus 200 to vibrate the display panel 100 on a rear surface (or a backside surface) of the display panel 100.

The display panel 100 may display an electronic image or a digital image. For example, the display panel 100 may output light to display an image. The display panel 100 may be a curved display panel, or may be any type of display panel, such as a liquid crystal display panel, an organic light-emitting display panel, a quantum dot light-emitting display panel, a micro light-emitting diode display panel, and an electrophoresis display panel. The display panel 100 may be a flexible display panel. For example, the display panel 100 may a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto.

The display panel 100 according to an embodiment of the present disclosure may include a display area AA (or an active area) for displaying an image according to driving of the plurality of pixels. The display panel 100 may further include a non-display area IA (or an inactive area) surrounding fully or at least partly the display area AA, but the term is not limited thereto.

The display panel 100 according to an embodiment of the present disclosure may include an anode electrode, a cathode electrode, and a light emitting device, and may be configured to display an image in a type such as a top emission type, a bottom emission type, or a dual emission type, according to a structure of a pixel array layer including a plurality of pixels. In the top emission type, an image may be displayed by outputting visible light generated from the pixel array layer to the forward region of a base substrate. In the bottom emission type, an image may be displayed by outputting visible light generated from the pixel array layer to the backward region of the base substrate.

The display panel 110 according to an embodiment of the present disclosure may include a pixel array portion disposed at the display area AA of the substrate. The pixel array portion may include a plurality of pixels which display an image based on a signal supplied through the signal lines. The signal lines may include a gate line, a data line and a pixel driving power line, or the like, but embodiments of the present disclosure are not limited thereto.

Each of the plurality of pixels may include a pixel circuit layer including a driving thin film transistor (TFT) provided at the pixel area which is configured by a plurality of gate lines and/or a plurality of data lines, an anode electrode electrically connected to the driving TFT, a light emitting layer formed over the anode electrode, and a cathode electrode electrically connected to the light emitting layer.

The driving TFT may be configured at a transistor region of each pixel area provided at a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), or low temperature poly-Si or may include oxide such as indium-gallium-zinc-oxide (IGZO), but embodiments of the present disclosure are not limited thereto.

The anode electrode may be provided at an opening region provided at each pixel area and may be electrically connected to the driving TFT.

A light emitting device according to an embodiment of the present disclosure may include an organic light emitting device layer formed over an anode electrode. The organic light emitting device layer may be implemented to emit light having the same color (for example, white light) for each pixel, or may be implemented to emit light having a different color (for example, red light, green light, or blue light) for each pixel. A cathode electrode (or a common electrode) may be connected to the organic light emitting device layer provided in each pixel area in common. For example, the organic light emitting device layer may have a stack structure including a single structure or two or more structures including the same color for each pixel. As another embodiment of the present disclosure, the organic light emitting device layer may have a stack structure including two or more structures including one or more different colors for each pixel. The two or more structures including the one or more different colors may be configured with one or more of blue, red, yellow-green, and green or a combination thereof, but embodiments of the present disclosure are not limited thereto. An example of the combination may include blue and red, red and yellow-green, red and green, red/yellow-green/green, or the like, but embodiments of the present disclosure are not limited thereto. Also, regardless of a stack order thereof, the present disclosure may be applied. The stack structure including two or more structures having the same color or one or more different colors may further include a charge generating layer between the two or more structures. The charge generating layer may have a PN junction structure and may include an N-type charge generating layer and a P-type charge generating layer.

According to another embodiment of the present disclosure, the light emitting device may include a micro light emitting diode device electrically connected to each of an anode electrode and a cathode electrode. The micro light emitting diode device may be a light emitting diode implemented as an integrated circuit (IC) or chip type. The micro light emitting diode device may include a first terminal electrically connected to the anode electrode and a second terminal electrically connected to the cathode electrode. The cathode electrode may be connected to the second terminal of the micro light emitting diode device provided in each pixel area in common.

An encapsulation part may be formed on the substrate to surround the pixel array portion, thereby preventing oxygen or water from penetrating into the light emitting device layer of the pixel array portion. The encapsulation part according to an embodiment of the present disclosure may be formed in a multi-layer structure where an organic material layer and an inorganic material layer are alternately stacked, but embodiments of the present disclosure are not limited thereto. The inorganic material layer may prevent oxygen or water from penetrating into a layer of the light emitting device in the pixel array portion. The organic material layer may be formed to have a thickness which is relatively thicker than the inorganic material layer, so as to cover particles occurring in a manufacturing process. For example, the encapsulation part may include a first inorganic layer, an organic layer on the first inorganic layer, and a second inorganic layer on the organic layer. The organic layer may be a particle cover layer, but the term is not limited thereto. The touch panel may be disposed on the encapsulation part, or may be disposed at a rear surface of the pixel array portion or in the pixel array portion.

The display panel 100 according to an embodiment of the present disclosure may include a first substrate, a second substrate, and a liquid crystal layer. The first substrate may be an upper substrate or a thin film transistor (TFT) array substrate. For example, the first substrate may include a pixel array (or a display portion or a display area) including a plurality of pixels which are respectively provided in a plurality of pixel areas formed by intersections of a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part provided at a first periphery (or a first non-display portion) and a gate driving circuit provided at a second periphery (or a second non-display portion).

The pad part may supply a signal, supplied from the outside, to the pixel array portion and/or the gate driving circuit. For example, the pad part may include a plurality of data pads connected to a plurality of data lines through a plurality of data link lines and/or a plurality of gate input pads connected to the gate driving circuit through a gate control signal line. For example, a size of the first substrate may be greater than the second substrate, but embodiments of the present disclosure are not limited thereto.

The gate driving circuit according to an embodiment of the present disclosure may be embedded (or integrated) into a second periphery portion of the first substrate so as to be connected to the plurality of gate lines. For example, the gate driving circuit may be implemented with a shift register including a transistor, which is formed through the same process as the TFT provided at the pixel area. The gate driving circuit according to another embodiment of the present disclosure may be implemented as an integrated circuit (IC) and may be provided at a panel driving circuit, without being embedded into the first substrate.

The second substrate may be a lower substrate or a color filter array substrate. For example, the second substrate may include a pixel pattern (or a pixel defining pattern) including an opening area overlapping with the pixel area formed in the first substrate, and a color filter layer formed at the opening area. The second substrate may have a size which is smaller than the first substrate, but embodiments of the present disclosure are not limited thereto. For example, the second substrate may overlap a remaining portion, other than the first periphery, of the upper substrate. The second substrate may be attached to a remaining portion, other than the first periphery, of the first substrate with a liquid crystal layer therebetween using a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

A second polarization member may be attached on a lower surface of the second substrate and may polarize light which is incident from the backlight and travels to the liquid crystal layer. A first polarization member may be attached on an upper surface of the first substrate and may polarize light which passes through the first substrate and is output to the outside.

The display panel 110 according to an embodiment of the present disclosure may drive the liquid crystal layer based on an electric field which is generated in each pixel by the data voltage and the common voltage applied to each pixel, and thus, may display an image based on light passing through the liquid crystal layer.

In display panel 110 according to another embodiment of the present disclosure, the first substrate may be implemented as the color filter array substrate, and the second substrate may be implemented as the TFT array substrate. For example, the display panel 110 according to another embodiment of the present disclosure may have a type where an upper portion and a lower portion of the display panel 110 according to an embodiment of the present disclosure are reversed therebetween. For example, a pad part of the display panel 110 according to another embodiment of the present disclosure may be covered by a separate mechanism or structure.

The display panel 100 according to an embodiment of the present disclosure may include a bending portion that may be bent or curved to have a curved shape or a certain curvature radius.

The bending portion of the display panel 100 may be in at least one or more of one periphery portion and the other periphery portion of the display panel 100, which are parallel to each other. The one periphery portion and/or the other periphery portion, where the bending portion is implemented, of the display panel 100 may include only the non-display area IA, or may include a periphery portion of the display area AA and the non-display area IA. The display panel 100 including the bending portion implemented by bending of the non-display area IA may have a one-side bezel bending structure or a both-side bezel bending structure. Also, the display panel 100 including the bending portion implemented by bending of the periphery portion of the display area AA and the non-display area IA may have a one-side active bending structure or a both-side active bending structure.

The vibration apparatus 200 may vibrate the display panel 100 at the rear surface of the display panel 100, thereby providing a sound and/or a haptic feedback based on the vibration of the display panel 100 to a user (or a viewer). The vibration apparatus 200 may be implemented at the rear surface of the display panel 100 to directly vibrate the display panel 100.

As an embodiment of the present disclosure, the vibration apparatus 200 may vibrate according to a voice signal synchronized with an image displayed by the display panel 100 to vibrate the display panel 100. As another embodiment of the present disclosure, the vibration apparatus 200 may be disposed on the display panel 100, and may vibrate according to a haptic feedback signal (or a tactile feedback signal) synchronized with a user touch applied to a touch panel (or a touch sensor layer) embedded into the display panel 100 to vibrate the display panel 100. Accordingly, the display panel 100 may vibrate based on a vibration of the vibration apparatus 200 to provide a user (or a viewer) with at least one of sound and a haptic feedback.

The vibration apparatus 200 according to an embodiment of the present disclosure may be implemented to have a size corresponding to the display area AA of the display panel 100. A size of the vibration apparatus 200 may be 0.9 to 1.1 times a size of the display area AA, but embodiments of the present disclosure are not limited thereto. For example, a size of the vibration apparatus 200 may be the same as or smaller than the size of the display area AA. For example, a size of the vibration apparatus 200 may be the same as or approximately same as the display area AA of the display panel 100, and thus, the vibration apparatus 200 may cover a most region of the display panel 100 and a vibration generated by the vibration apparatus 200 may vibrate a whole portion of the display panel 100, and thus, localization of a sound may be high, and satisfaction of a user may be improved. Also, a contact area (or panel coverage) between the display panel 100 and the vibration apparatus 200 may increase, and thus, a vibration region of the display panel 100 may increase, thereby improving a sound of a middle-low-pitched sound band generated based on a vibration of the display panel 100. Also, a vibration apparatus 200 applied to a large-sized display apparatus may vibrate the entire display panel 100 having a large size (or a large area), and thus, localization of a sound based on a vibration of the display panel 100 may be further enhanced, thereby realizing an improved sound effect. Therefore, the vibration apparatus 200 according to an embodiment of the present disclosure may be disposed at the rear surface of the display panel 100 to sufficiently vibrate the display panel 100 in a vertical (or front-to-rear) direction, thereby outputting a desired sound to a forward region in front of the display apparatus. For example, the vibration apparatus 200 is disposed at the rear surface of the display panel 100 to sufficiently vibrate the display panel 100 in a vertical (or front-to-rear) direction with respect to a first direction (X) of the display panel 100, thereby outputting a desired sound to a forward region in front of the display apparatus.

The vibration apparatus 200 according to an embodiment of the present disclosure may be implemented as a film type. Since the vibration apparatus 200 may be implemented as a film type, it may have a thickness which is thinner than the display panel 100, and thus, a thickness of the display apparatus may not increase due to the arrangement of the vibration apparatus 200. For example, the vibration apparatus 200 may be referred to as a sound generating module, a sound generating device, a film actuator, a film type piezoelectric composite actuator, a film speaker, a film type piezoelectric speaker, or a film type piezoelectric composite speaker, which uses the display panel 100 as a vibration plate, but embodiments of the present disclosure are not limited thereto.

As another embodiment of the present disclosure, the vibration apparatus 200 may not be disposed at the rear surface of the display panel 100 and may be applied to a vibration object (or a vibration member) instead of the display panel. For example, the vibration object may be one or more of a non-display panel, wood, plastic, glass, cloth, a vehicle interior material, a vehicle glass window, a building indoor ceiling, a building glass window, an aircraft interior material, an aircraft glass window, or the like, but embodiments of the present disclosure are not limited thereto. For example, the non-display panel may be a light emitting diode lighting panel (or apparatus), an organic light emitting lighting panel (or apparatus), or an inorganic light emitting lighting panel (or apparatus), but embodiments of the present disclosure are not limited thereto. In this case, the vibration object may be applied as a vibration plate, and the vibration apparatus 200 may vibrate the vibration object to output a sound.

A vibration apparatus including one vibration generator may have a problem where it is unable to output a sufficient sound. For example, when a vibration apparatus including one vibration generator is applied to a display apparatus such as a television (TV) or the like, there may be a problem where it is difficult to secure a sufficient sound. Therefore, when a vibration apparatus implemented with two vibration generators arranged in parallel is applied to a display apparatus, an attachment area of the display panel 100 and the vibration apparatus may be enlarged, but because the attachment area is enlarged, it may be difficult to attach the vibration apparatus on the rear surface of the display panel 100 without an air bubble. For example, when the display panel 100 may be a light emitting display panel, there may be a problem where it is difficult to attach the vibration apparatus on an encapsulation substrate without an air bubble. Also, in a vibration apparatus implemented with two vibration generators arranged in parallel, because vibrations of adjacent vibration generators differ, there may be a problem of a division vibration where different vibrations occur. Due to this, there may be a problem where it is difficult to output a sound having enhanced sound flatness. There may be a problem where a division vibration increases as an attachment area of a vibration apparatus increases. The vibration apparatus 200 according to an embodiment of the present disclosure may include a plurality of vibration generators 210 and 230 which overlap each other. The vibration apparatus 200 may include the plurality of vibration generators 210 and 230 which are overlapped or stacked to be displaced in the same direction. For example, the vibration apparatus 200 may include the plurality of vibration generators 210 and 230 which are overlapped or stacked to have the same driving direction.

The plurality of vibration generators 210 and 230 may overlap or be stacked to be displaced (or driven or vibrated) in the same direction. For example, the plurality of vibration generators 210 and 230 may contract or expand in the same driving direction (or displacement direction) based on a vibration driving signal in a state where the plurality of vibration generators 210 and 230 overlap or are stacked, and thus, a displacement amount (or a bending force or a flexural force) or an amplitude displacement of the display panel 100 may increase or may be maximized. Therefore, the plurality of vibration generators 210 and 230 may increase (or maximize) a displacement amount (or a bending force or a flexural force) or an amplitude displacement of the display panel 100, thereby enhancing a sound pressure level characteristic of a sound and a sound characteristic of a middle-low-pitched sound band generated based on a vibration of the display panel 100. For example, the plurality of vibration generators 210 and 230 may be implemented so that the plurality of vibration generators 210 and 230 overlap or are stacked to have the same driving direction, and thus, a driving force of each of the plurality of vibration generators 210 and 230 may increase or may be maximized, thereby enhancing a sound pressure level characteristic of a sound and a sound characteristic of a middle-low-pitched sound band generated by the display panel 100 based on vibrations of the plurality of vibration generators 210 and 230. For example, the middle-low-pitched sound band may be 200 Hz to 1 kHz, but embodiments of the present disclosure are not limited thereto. For example, a high-pitched sound band may be 1 kHz or more or 3 kHz or more, but embodiments of the present disclosure are not limited thereto.

Each of the plurality of vibration generators 210 and 230 may include a piezoelectric structure (a vibration portion or a piezoelectric vibration portion) including piezoelectric ceramic having a piezoelectric characteristic, but embodiments of the present disclosure are not limited thereto. For example, each of the plurality of vibration generators 210 and 230 may include piezoelectric ceramic having a perovskite crystalline structure, and thus, may vibrate (or mechanical displacement) in response to an electrical signal applied from the outside. For example, when a vibration driving signal (or a voice signal) is applied, each of the plurality of vibration generators 210 and 230 may alternately and repeatedly contract and expand based on an inverse piezoelectric effect of the piezoelectric structure (the vibration portion or the piezoelectric vibration portion), and thus, may be displaced (or vibrated or driven) in the same direction based on a bending phenomenon where a bending direction is alternately changed, thereby increasing or maximizing a displacement amount (or a bending force or a flexural force) or an amplitude displacement of the vibration apparatus 200 or/and the display panel 100.

A first vibration generator 210 disposed at the display panel 100 among the plurality of vibration generators 210 and 230 may be one main vibration generator. For example, the remaining second vibration generator 230 among the plurality of vibration generators 210 and 230 may be at least one auxiliary vibration generator which is stacked on the first vibration generator 210. The second vibration generator 230 may have the same structure as that of the first vibration generator 210, but embodiments of the present disclosure are not limited thereto.

The vibration apparatus 200 according to an embodiment of the present disclosure may further include an adhesive member 250 (or a first connection member) disposed between the plurality of vibration generators 210 and 230. The adhesive member 250 according to an embodiment of the present disclosure may be disposed between the plurality of vibration generators 210 and 230.

According to an embodiment of the present disclosure, the adhesive member 250 may include a material including an adhesive layer which is good in adhesive force or attaching force with respect to each of the plurality of vibration generators 210 and 230. For example, the adhesive member 250 may include a foam pad, a double-sided tape, an adhesive, or the like, but embodiments of the present disclosure are not limited thereto. For example, the adhesive layer of the adhesive member 250 may include epoxy, acryl, silicone, or urethane, but embodiments of the present disclosure are not limited thereto. For example, the adhesive layer of the adhesive member 250 may include a urethane-based material which relatively has a ductile characteristic compared to acrylic among acrylic and urethane. Accordingly, the vibration loss of the vibration apparatus 200 caused by displacement interference between the plurality of vibration generators 210 and 230 may be minimized, or each of the plurality of vibration generators 210 and 230 may be freely displaced.

According to another embodiment of the present disclosure, the adhesive member 250 may include one or more of a thermo-curable adhesive, a photo-curable adhesive, and a thermal bonding adhesive. For example, the adhesive member 250 may include the thermal bonding adhesive. The thermal bonding adhesive may be a heat-active type or a thermo-curable type. For example, the adhesive member 250 including the thermal bonding adhesive may attach or couple two adjacent vibration generators 210 and 230 by heat and pressure.

The plurality of vibration generators 210 and 230 according to an embodiment of the present disclosure may be integrated as one structure (or an element or a component) by a laminating process using the adhesive member 250. For example, the plurality of vibration generators 210 and 230 may be integrated as one structure by a laminating process using a roller.

A method of manufacturing the vibration apparatus 200 according to an embodiment of the present disclosure will be described below.

First, the first vibration generator 210 of the plurality of vibration generators 210 and 230 may be disposed at a predetermined position of a stage, and the adhesive member 250 may be aligned and placed on the first vibration generator 210 (a first loading/aligning process). For example, a first portion 210a of each vibration structure 211 of the first vibration generator 210 may be aligned or placed on a virtual extension line VL.

Subsequently, the second vibration generator 230 of the plurality of vibration generators 210 and 230 may be loaded onto a stage and may be aligned and placed on the first vibration generator 210 (a second loading/aligning process). For example, the second vibration generator 230 may be aligned and placed on the first vibration generator 210 through an align process of aligning and placing a second portion (an end portion, an end, an outer surface, or each periphery portion) 230a of each vibration structure 211 of the second vibration generator 230 on the virtual extension line VL or the first portion 210a of each vibration structure 211 of the first vibration generator 210.

Subsequently, the first vibration generator 210 may be preliminarily bonded or coupled to the second vibration generator 230 by the adhesive member 250 (a preliminary bonding process). For example, the preliminary bonding process may press at least one of the first vibration generator 210 and the second vibration generator 230 with a predetermined pressure. For example, the preliminary bonding process may be omitted.

Subsequently, the first vibration generator 210 and the second vibration generator 230 preliminarily bonded or coupled to each other may be completely bonded or couple to each other (a main bonding process).

As an embodiment of the present disclosure, when the adhesive member 250 includes a photo-curable adhesive, the main bonding process may irradiate light onto the adhesive member 250 disposed between the first vibration generator 210 and the second vibration generator 230, and then, the first vibration generator 210 may be mainly bonded or coupled to the second vibration generator 230 by a photo-curing process of curing the adhesive member 250. For example, the photo-curing process may irradiate light onto the first vibration generator 210 and the second vibration generator 230 in a state where at least one of the first vibration generator 210 and the second vibration generator 230 is pressed with a certain pressure, but embodiments of the present disclosure are not limited thereto.

As another embodiment of the present disclosure, when the adhesive member 250 includes a thermo-curable adhesive, the main bonding process may bond or couple the first vibration generator 210 to the second vibration generator 230 by a thermal curing process of curing the adhesive member 250 by applying heat to the adhesive member 250 disposed between the first vibration generator 210 and the second vibration generator 230. For example, the thermal curing process may apply heat to the first vibration generator 210 and the second vibration generator 230 in a state where at least one of the first vibration generator 210 and the second vibration generator 230 is pressed with a certain pressure, but embodiments of the present disclosure are not limited thereto.

As another embodiment of the present disclosure, when the adhesive member 250 includes a thermal bonding adhesive, the main bonding process may bond or couple the first vibration generator 210 to the second vibration generator 230 through a thermal bonding process of curing the adhesive member 250 by applying predetermined heat and a predetermined pressure to the adhesive member 250 disposed between the first vibration generator 210 and the second vibration generator 230.

Subsequently, the plurality of vibration generators 210 and 230 integrated as one structure (or an element) may be unloaded from the stage by the adhesive member 250.

The apparatus according to an embodiment of the present disclosure may further include a connection member 150 (or a second connection member) disposed between the display panel 100 and the vibration apparatus 200.

The connection member 150 may be disposed between the display panel 100 and the vibration apparatus 200, and thus, may connect or couple the vibration apparatus 200 to the rear surface of the display panel 100. For example, the vibration apparatus 200 may be connected or coupled to the rear surface of the display panel 100 by the connection member 150, and thus, may be supported by or disposed at the rear surface of the display panel 100.

The connection member 150 according to an embodiment of the present disclosure may include a material including an adhesive layer which is good in adhesive force or attaching force with respect to each of the rear surface of the display panel 100 and the vibration apparatus 200. For example, the connection member 150 may include a foam pad, a double-sided tape, or an adhesive, but embodiments of the present disclosure are not limited thereto. For example, the adhesive layer of the connection member 150 may include epoxy, acryl, silicone, or urethane, but embodiments of the present disclosure are not limited thereto. For example, the adhesive layer of the connection member 150 may differ from the adhesive layer of the adhesive member 250. For example, the adhesive layer of the connection member 150 may include an acrylic-based material which is relatively better in adhesive force and hardness among acrylic and urethane. Accordingly, a vibration of the vibration apparatus 200 may be transferred to the display panel 100 well.

The adhesive layer of the connection member 150 may further include an additive, such as a tackifier or an adhesion enhancing agent, a wax component, an anti-oxidation agent, or the like. The additive may prevent or reduce the connection member 150 from being detached (stripped) from the display panel 100 by a vibration of the vibration apparatus 200. For example, the tackifier may be rosin derivative or the like, and the wax component may be paraffin wax or the like. For example, the anti-oxidation agent may be a phenol-based anti-oxidation agent, such as thioester, but embodiments of the present disclosure are not limited thereto.

The connection member 150 according to another embodiment of the present disclosure may further include a hollow portion between the display panel 100 and the vibration apparatus 200. The hollow portion of the connection member 150 may provide an air gap between the display panel 100 and the vibration apparatus 200. Due to the air gap, a sound wave (or a sound pressure) based on a vibration of the vibration apparatus 200 may not be dispersed by the connection member 150, and may concentrate on the display panel 100. Thus, the loss of a vibration caused by the connection member 150 may be minimized, thereby increasing a sound pressure characteristic of a sound generated based on a vibration of the display panel 100.

The apparatus according to an embodiment of the present disclosure may further include a supporting member 300 disposed at a rear surface of the display panel 100.

The supporting member 300 may cover a rear surface of the display panel 100. For example, the supporting member 300 may cover a whole rear surface of the display panel 100 with a gap space GS therebetween. For example, the supporting member 300 may include at least one or more among a glass material, a metal material, and a plastic material. For example, the supporting member 300 may be a rear surface structure or a set structure. For example, the supporting member 300 may be referred to as the other term such as a cover bottom, a plate bottom, a back cover, a base frame, a metal frame, a metal chassis, a chassis base, or m-chassis. Therefore, the supporting member 300 may be implemented as an arbitrary type frame or a plate-shaped structure disposed at a rear surface of the display panel 100.

The supporting member 300 according to an embodiment of the present disclosure may include a first supporting member 310 and a second supporting member 330.

The first supporting member 310 may cover a rear surface of the display panel 100. For example, the first supporting member 310 may be a plate-shaped member which covers a whole rear surface of the display panel 100. For example, the first supporting member 310 may be an inner plate which includes at least one or more among a glass material, a metal material, and a plastic material.

The first supporting member 310 may be spaced apart from a rearmost surface of the display panel 100 with a gap space GS therebetween. For example, the gap space GS may be referred to as an air gap, a vibration space, a sound resonance box, or the like, but embodiments of the present disclosure are not limited thereto.

The second supporting member 330 may be disposed at a rear surface of the first supporting member 310. The second supporting member 330 may be a plate-shaped member which covers the whole rear surface of the first supporting member 310. For example, the second supporting member 330 may include at least one or more among a glass material, a metal material, and a plastic material. For example, the second supporting member 330 may be referred to as an outer plate, a rear plate, a back plate, a back cover, or a rear cover, but embodiments of the present disclosure are not limited thereto.

The supporting member 300 according to an embodiment of the present disclosure may further include a connection member (or a third connection member) 350.

The connection member 350 may be disposed between the first supporting member 310 and the second supporting member 330. For example, the first supporting member 310 and the second supporting member 330 may be coupled or connected to each other by the connection member 350. For example, the connection member 350 may be an adhesive resin, a double-sided tape, or a double-sided adhesive foam pad, but embodiments of the present disclosure are not limited thereto. For example, the connection member 350 may have elasticity for absorbing an impact, but embodiments of the present disclosure are not limited thereto. As an embodiment of the present disclosure, the connection member 350 may be disposed at a whole region between the first supporting member 310 and the second supporting member 330. As another embodiment of the present disclosure, the connection member 350 may be provided in a mesh structure including an air gap between the first supporting member 310 and the second supporting member 330.

The apparatus according to an embodiment of the present disclosure may further include a middle frame 400.

The middle frame 400 may be disposed between a rear periphery portion of the display panel 100 and a front periphery portion of the supporting member 300. The middle frame 400 may support at least one or more among the rear periphery portion of the display panel 100 and the front periphery portion of the supporting member 300, and may surround one or more of side surfaces among each of the display panel 100 and the supporting member 300. The middle frame 400 may provide a gap space GS between the display panel 100 and the supporting member 300. The middle frame 400 may be referred to as a middle cabinet, a middle cover, a middle chassis, or the like, but embodiments of the present disclosure are not limited thereto.

The middle frame 400 according to an embodiment of the present disclosure may include a first supporting portion 410 and a second supporting portion 430.

The first supporting portion 410 may be disposed between the rear periphery portion of the display panel 100 and the front periphery portion of the supporting member 300, and thus, may provide a gap space GS between the display panel 100 and the supporting member 300. A front surface of the first supporting portion 410 may be coupled or connected to the rear periphery portion of the display panel 100 by a first frame connection member 401. A rear surface of the first supporting portion 410 may be coupled or connected to the front periphery portion of the supporting member 300 by a second frame connection member 403. For example, the first supporting portion 410 may have a single picture frame structure having a square shape or a frame structure having a plurality of divided bar shapes.

The second supporting portion 430 may be vertically coupled to an outer surface of the first supporting portion 410 in parallel with a thickness direction Z of the apparatus. The second supporting portion 430 may surround one or more among an outer surface of the display panel 100 and an outer surface of the supporting member 300, thereby protecting the outer surface of each of the display panel 100 and the supporting member 300. The first supporting portion 410 may protrude from an inner surface of the second supporting portion 430 toward the gap space GS between the display panel 100 and the support member 300.

The apparatus according to an embodiment of the present disclosure may include a panel connection member instead of the middle frame 400.

The panel connection member may be disposed between the rear periphery portion of the display panel 100 and the front periphery portion of the supporting member 300 and may provide the gap space GS between the display panel 100 and the supporting member 300. The panel connection member may be disposed between the rear periphery portion of the display panel 100 and the front periphery portion of the supporting member 300 to adhere the display panel 100 and the support member 300. For example, the panel connection member may be a double-sided tape, a single-sided tape, or a double-sided adhesive foam pad, but embodiments of the present disclosure are not limited thereto. For example, the panel connection member may include epoxy, acryl, silicone, or urethane, but embodiments of the present disclosure are not limited thereto. For example, an adhesive layer of the panel connection member may include a urethane-based material which relatively has a ductile characteristic compared to acryl among acrylic and urethane. Accordingly, a vibration of the display panel 100 transmitted to the support member 300 may be minimized.

In the apparatus according to an embodiment of the present disclosure, when the apparatus includes a panel connection member instead of a middle frame 400, the supporting member 300 may include a bending sidewall which is bent from an end (or an end portion) of the second supporting member 330 and surrounds an outer surface (or an outer sidewall) of each of the first supporting member 310, the panel connection member, and the display panel 100. The bending sidewall according to an embodiment of the present disclosure may have a single sidewall structure or a hemming structure. The hemming structure may be a structure where end portions of an arbitrary member are bent in a curve shape and overlap each other or are apart from each other in parallel. For example, in order to enhance a sense of beauty in design, the bending sidewall may include a first bending sidewall, bent from one side of the second supporting member 330, and a second bending sidewall bent from the first bending sidewall to a region between the first bending sidewall and an outer surface of the display panel 100. The second bending sidewall may be apart from an inner surface of the first bending sidewall. Therefore, the second bending sidewall may prevent the outer surface of the display panel 100 from contacting an inner surface of the first bending sidewall or may prevent a lateral-direction external impact from being transferred to the outer surface of the display panel 100.

Figure 3:
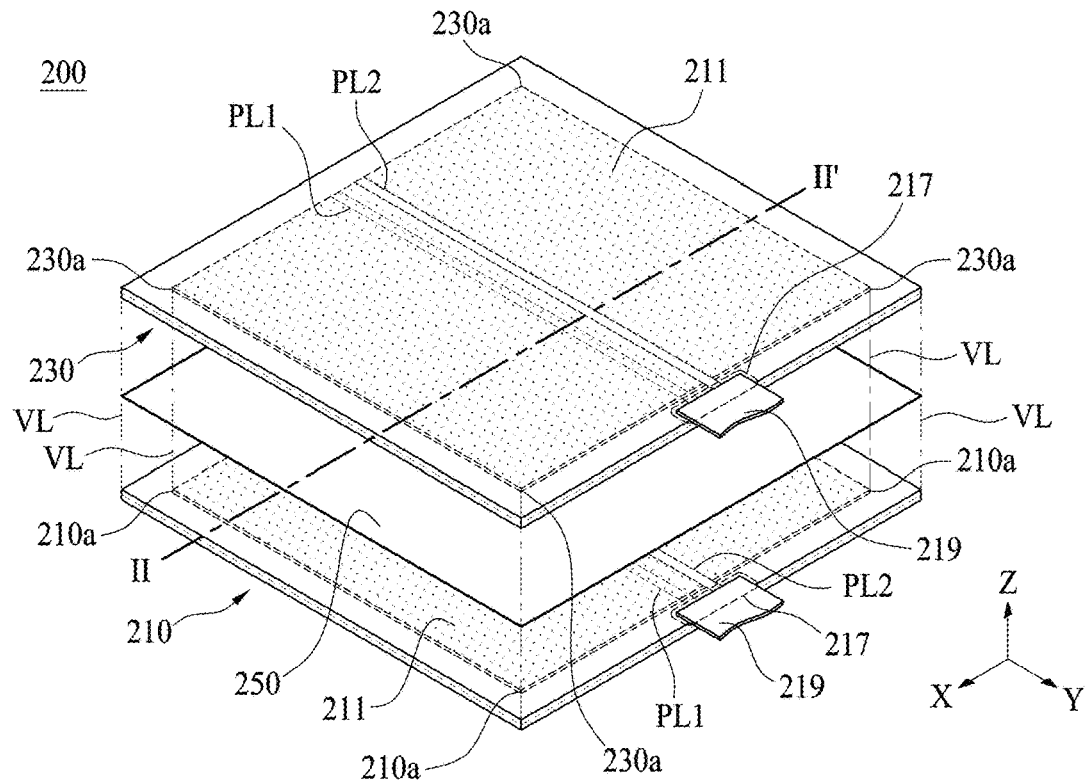
FIG. 3 illustrates a vibration apparatus according to an embodiment of the present disclosure.
Figure 4:
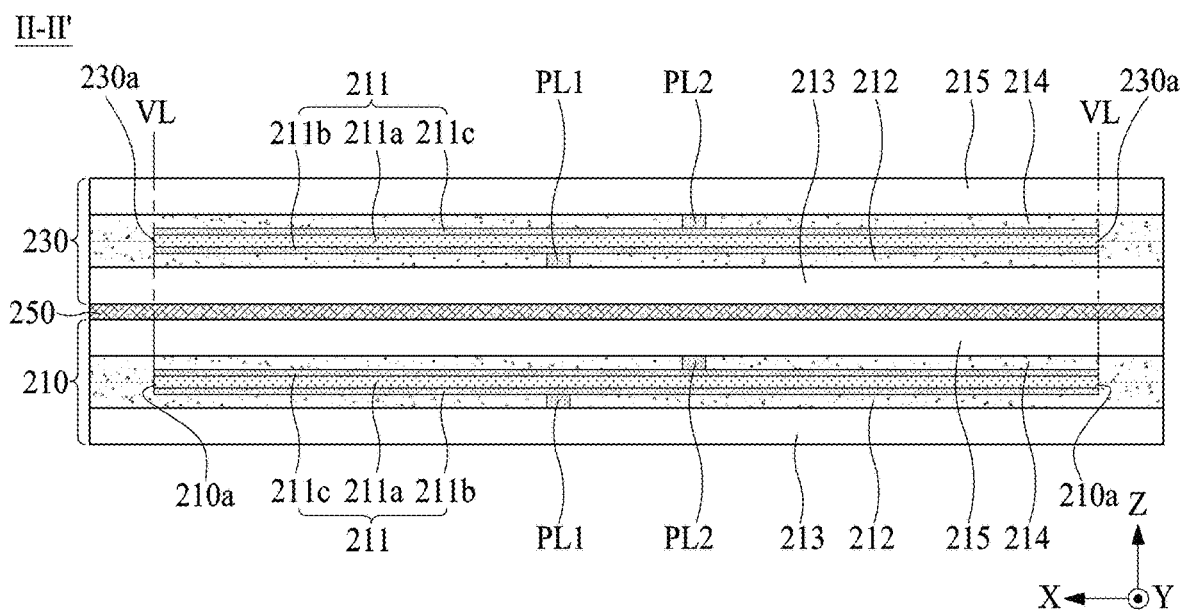
FIG. 4 is a cross-sectional view taken along line II-II' illustrated in FIG. 3.

FIG. 3 illustrates a vibration apparatus according to an embodiment of the present disclosure. FIG. 4 is a cross-sectional view taken along line II-IP illustrated in FIG. 3.

With reference to FIGS. 2 to 4, the vibration apparatus 200 according to an embodiment of the present disclosure may include a plurality of vibration generators 210 and 230 and an adhesive member 250.

The plurality of vibration generators 210 and 230 may overlap or be stacked to be displaced (or driven or vibrated) in the same direction. For example, the plurality of vibration generators 210 and 230 may have substantially the same size, but embodiments of the present disclosure are not limited thereto. For example, the plurality of vibration generators 210 and 230 may have substantially the same size within an error range of a manufacturing process, but embodiments of the present disclosure are not limited thereto. Therefore, the plurality of vibration generators 210 and 230 may maximize an amplitude displacement of the vibration apparatus 200 and/or an amplitude displacement of the display panel 100. One sides (or end portions, or end, or outer surfaces, or each corner portion) 210a and 230a of each of the plurality of vibration generators 210 and 230 may be aligned on a virtual extension line VL extending in a thickness direction Z of the display panel 100, or may be disposed at the virtual extension line VL.

For example, in at least one of the plurality of vibration generators 210 and 230, displacement directions and amplitude displacements of the plurality of vibration generators 210 and 230 may not match, and thus, an amplitude displacement of the vibration apparatus 200 may not be maximized. For example, when at least one of the plurality of vibration generators 210 and 230 has a different size departing from an error range of a manufacturing process, the displacement directions and the amplitude displacements of the plurality of vibration generators 210 and 230 may not match, and thus, the amplitude displacement of the vibration apparatus 200 may not be maximized. Also, when at least one of the plurality of vibration generators 210 and 230 is displaced in a different direction, the displacement directions of the plurality of vibration generators 210 and 230 may not match, and thus, the amplitude displacement of the vibration apparatus 200 may not be maximized.

The vibration apparatus 200 according to an embodiment of the present disclosure may include two or more vibration generators 210 and 230 which are stacked to be displaced in the same direction. In the following description, an example where the vibration apparatus 200 includes the vibration generators 210 and 230 will be described.

According to an embodiment of the present disclosure, a first vibration generator 210 may be connected to or disposed on a rear surface of the display panel 100 by a connection member 150 (or a second connection member). A second vibration generator 230 may be disposed or attached on the first vibration generator 210 by an adhesive member 250 (or a first connection member).

The first and second vibration generators 210 and 230 according to an embodiment of the present disclosure may each include a vibration structure 211, a first protection member 213, and a second protection member 215.

The vibration structure 211 may include a piezoelectric material (or a piezoelectric element) having a piezoelectric characteristic (or a piezoelectric effect). For example, the piezoelectric material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto.

The vibration structure 211 according to an embodiment of the present disclosure may include a vibration portion 211a including a piezoelectric material, a first electrode portion 211b disposed at a first surface of the vibration portion 211a, and a second electrode portion 211c disposed at a second surface, which is opposite to the first surface, of the vibration portion 211a.

The vibration portion 211a may include a piezoelectric material. The vibration portion 211a may be referred to as a vibration layer, a piezoelectric layer, a piezoelectric material layer, an electroactive layer, a piezoelectric vibration portion, a piezoelectric material portion, an electroactive portion, an inorganic material layer, or an inorganic material portion, but embodiments of the present disclosure are not limited thereto.

The vibration portion 211a may be formed of a transparent, semitransparent, or opaque piezoelectric material, and the vibration portion 211a may be transparent, semitransparent, or opaque.

The vibration portion 211a may be configured as a ceramic-based material for generating a relatively high vibration, or may be configured as a piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". In the chemical formula, "A" may include a divalent metal element, and "B" may include a tetravalent metal element. As an embodiment of the present disclosure, in the chemical formula "$ABO_3$", "A", and "B" may be cations, and "O" may be anions. For example, the chemical formula "$ABO_3$" may include at least one or more of $PbTiO_3$, $PbZrO_3$, $PbZrTiO_3$, $BaTiO_3$, and $SrTiO_3$, but embodiments of the present disclosure are not limited thereto.

The vibration portion 211a according to an embodiment of the present disclosure may include one or more among lead (Pb), zirconium (Zr), titanium (Ti), zinc (Zn), nickel (Ni), and niobium (Nb), but embodiments of the present disclosure are not limited thereto.

The vibration portion 211a according to another embodiment of the present disclosure may include a lead zirconate titanate (PZT)-based material including lead (Pb), zirconium (Zr), and titanium (Ti) or may include a lead zirconate nickel niobate (PZNN)-based material including lead (Pb), zirconium (Zr), nickel (Ni), and niobium (Nb), but embodiments of the present disclosure are not limited thereto. Also, the vibration portion 211a may include at least one or more of $CaTiO_3$, $BaTiO_3$, and $SrTiO_3$ without Pb, but embodiments of the present disclosure are not limited thereto.

According to another embodiment of the present disclosure, the vibration portion 211a may have a piezoelectric deformation coefficient "$d_{33}$" of 1,000 pC/N or more in a thickness direction Z. Thus, the vibration apparatus 200 may be applied to a display panel having a large size and may need to have a high piezoelectric deformation coefficient "$d_{33}$", for having a sufficient vibration characteristic or piezoelectric characteristic. For example, the vibration portion 211a may include a PZT-based material ($PbZrTiO_3$) as a main component and may include a softener dopant material doped into "A" site (Pb) and a relaxor ferroelectric material doped into "B" site (ZrTi).

The softener dopant material may enhance a piezoelectric characteristic and a dielectric characteristic of the vibration portion 211a, and for example, may increase the piezoelectric deformation coefficient "$d_{33}$" of the vibration portion 211a. When the softener dopant material includes a monovalent element "+1", the inventors have confirmed that a piezoelectric characteristic and a dielectric characteristic are reduced. For example, when the softener dopant material includes kalium (K) and rubidium (Rb), a piezoelectric characteristic and a dielectric characteristic may be reduced. Therefore, by performing various experiments, the inventors have recognized that the softener dopant material should include a dyad element "+2" to a triad element "+3", for enhancing a piezoelectric characteristic and a dielectric characteristic. The softener dopant material according to an embodiment of the present disclosure may include a dyad element "+2" to a triad element "+3". Morphotropic phase boundary (MPB) may be implemented by adding the softener dopant material to the PZT-based material ($PbZrTiO_3$), and thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, ions ($Sr^{2+}$, $La^{2+}$, $Nd^{3+}$, $Ca^{2+}$, $Y^{3+}$, $Er^{3+}$, $Yb^{3+}$) of the softener dopant material doped into the PZT-based material ($PbZrTiO_3$) may substitute a portion of lead (Pb) in the PZT-based material ($PbZrTiO_3$), and a substitution rate thereof may be about 2 mol % to about 20 mol %. For example, when the substitution rate is less than 2 mol % or greater than 20 mol %, a perovskite crystal structure may be broken, and thus, an electromechanical coupling coefficient "kP" and the piezoelectric deformation coefficient "$d_{33}$" may decrease. When the softener dopant material is substituted, the MPB may be formed, and a piezoelectric characteristic and a dielectric characteristic may be high in the MPB, thereby implementing a vibration apparatus having a high piezoelectric characteristic and a high dielectric characteristic.

According to an embodiment of the present disclosure, the relaxor ferroelectric material doped into the PZT-based material ($PbZrTiO_3$) may enhance an electric deformation characteristic of the vibration portion 211a. The relaxor ferroelectric material according to an embodiment of the present disclosure may include a lead magnesium niobate (PMN)-based material or a lead nickel niobate (PNN)-based material, but embodiments of the present disclosure are not limited thereto. The PMN-based material may include Pb, Mg, and Nb, and for example, may include $Pb(Ni, Nb)O_3$. For example, the relaxor ferroelectric material doped into the PZT-based material ($PbZrTiO_3$) may substitute a portion of each of zirconium (Zr) and titanium (Ti) in the PZT-based material ($PbZrTiO_3$), and a substitution rate thereof may be about 5 mol % to about 25 mol %. For example, when the substitution rate is less than 5 mol % or greater than 25 mol %, a perovskite crystal structure may be broken, and thus, the electromechanical coupling coefficient "kP" and the piezoelectric deformation coefficient "$d_{33}$" may decrease.

According to an embodiment of the present disclosure, the vibration portion 211a may further include a donor material doped into "B" site (ZrTi) of the PZT-based material ($PbZrTiO_3$), in order to more enhance a piezoelectric coefficient. For example, the donor material doped into the "B" site (ZrTi) may include a tetrad element "+4" or a hexad element "+6". For example, the donor material doped into the "B" site (ZrTi) may include tellurium (Te), germanium (Ge), uranium (U), bismuth (Bi), niobium (Nb), tantalum (Ta), antimony (Sb), or tungsten (W).

The vibration portion 211a according to an embodiment of the present disclosure may be expressed as the following Formula 1.

$$(Pb_{A-B}C_B)((Mg_{1/3}Nb_{2/3})_a(Ni_{1/3}Nb_{2/3})_bZr_cTi_d)O_3 \quad \text{[Formula 1]}$$

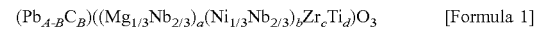

Here, C may be one of Ca, Sr, and Ba. Also, a+b+c+d=1, 0.02≤B≤0.20, 0.80≤A−B≤0.98, 0.05≤a≤0.25, 0.05≤b≤0.25, 0.10≤c≤0.50, and 0.10≤d≤0.50.

The vibration portion 211a according to an embodiment of the present disclosure may have a piezoelectric deformation coefficient "$d_{33}$" of 1,000 pC/N or more in a thickness direction Z, thereby implementing a vibration apparatus having an enhanced vibration characteristic. For example, a vibration apparatus having an enhanced vibration characteristic may be implemented in a large-area apparatus.

The vibration portion 211a according to an embodiment of the present disclosure may be configured in a circular shape, an ellipse shape, or a polygonal shape, but embodiments of the present disclosure are not limited thereto.

The first electrode portion 211b may be disposed at a first surface (or an upper surface) of the vibration portion 211a. For example, the first electrode portion 211b may be electrically coupled or connected to the first surface of the vibration portion 211a. For example, the first electrode portion 211b may have a single-body electrode type which is disposed at a whole first surface of the vibration portion 211a. For example, the first electrode portion 211b may have the same shape as the vibration portion 211a, but embodiments of the present disclosure are not limited thereto. The first electrode portion 211b according to an embodiment of the present disclosure may be formed of a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), Mg, or the like, or an alloy thereof, but embodiments of the present disclosure are not limited thereto.

The second electrode portion 211c may be disposed at a second surface (or a rear surface) opposite to or different from the first surface the vibration portion 211a. For example, the second electrode portion 211c may be electrically coupled or connected to the second surface of the vibration portion 211a. For example, the second electrode portion 211c may have a single-body electrode type which is disposed at a whole second surface of the vibration portion 211a. For example, the second electrode portion 211c may have the same shape as the vibration portion 211a, but embodiments of the present disclosure are not limited thereto. The second electrode portion 211c according to an embodiment of the present disclosure may be formed of a transparent conductive material, a semitransparent conductive material, or an opaque conductive material. For example, the second electrode portion 211c may be formed of the same material as the first electrode portion 211b, but embodiments of the present disclosure are not limited thereto. As another embodiment of the present disclosure, the second electrode portion 211c may be formed of a different material than the first electrode portion 211b.

In each of the first and second vibration generators 210 and 230, the first electrode portion 211b may be disposed closer to the display panel 100 than the second electrode portion 211c, but embodiments of the present disclosure are not limited thereto. For example, in the vibration apparatus 200 including the plurality of vibration generators 210 and 230 according to an embodiment of the present disclosure, the first electrode portion 211b of each of the plurality of vibration generators 210 and 230 may be disposed closer to the display panel 100 than the second electrode portion 211c.

The vibration portion 211a may be polarized by a certain voltage applied to the first electrode portion 211b and the second electrode portion 211c in a certain temperature atmosphere or a temperature atmosphere which is changed from a high temperature to a room temperature, but embodiments of the present disclosure are not limited thereto. For example, the vibration portion 211a may alternately and repeatedly contract and expand based on an inverse piezoelectric effect according to a vibration driving signal (or a sound signal or a voice signal) applied to the first electrode portion 211b and the second electrode portion 211c from the outside, and thus, may be displaced or vibrated.

The vibration structure 211 (or the vibration portion 211a) of the first vibration generator 210 may have the same size as that of the vibration structure 211 (or the vibration portion 211a) of the second vibration generator 230. In order to maximize or increase a displacement amount or an amplitude displacement of the vibration apparatus 200, the vibration structure 211 (or the vibration portion 211a) of the first vibration generator 210 may substantially overlap or stack the vibration structure 211 (or the vibration portion 211a) of the second vibration generator 230 without being staggered. For example, the vibration structure 211 (or the vibration portion 211a) of the first vibration generator 210 may substantially overlap or stack the vibration structure 211 (or the vibration portion 211a) of the second vibration generator 230 within an error range of a manufacturing process without being staggered. For example, the vibration structure 211 (or the vibration portion 211a) of the first vibration generator 210 and the vibration structure 211 (or the vibration portion 211a) of the second vibration generator 230 may be implemented in a stack structure which has the same size and overlaps without being staggered, and thus, the displacement amount or the amplitude displacement of the vibration apparatus 200 may be maximized or increase. For example, the vibration structure 211 (or the vibration portion 211a) of the first vibration generator 210 and the vibration structure 211 (or the vibration portion 211a) of the second vibration generator 230 may be implemented in a stack structure which has the same size and accurately overlaps without being staggered, and thus, the displacement amount or the amplitude displacement of the vibration apparatus 200 may be maximized or increase.

According to an embodiment of the present disclosure, a first portion (or an end portion, an end, an outer surface, or each corner portion) 210a of each vibration structure 211 (or vibration portion 211a) of the first vibration generator 210 may be aligned on a virtual extension line VL, or may be disposed on the virtual extension line VL. For example, the first portion (or an end portion, an end, an outer surface, or each corner portion) 210a of each vibration structure 211 (or vibration portion 211a) of the first vibration generator 210 may be accurately aligned on a virtual extension line VL, or may be accurately disposed on the virtual extension line VL. A second portion (or an end portion, an end, an outer surface, or each corner portion) 230a of each vibration structure 211 (or vibration portion 211a) of the second vibration generator 230 may be aligned on the virtual extension line VL, or may be disposed on the virtual extension line VL. For example, the second portion (or an end portion, an end, an outer surface, or each corner portion) 230a of each vibration structure 211 (or vibration portion 211a) of the second vibration generator 230 may be accurately aligned on the virtual extension line VL, or may be accurately disposed on the virtual extension line VL. The first portion 210a of each vibration structure 211 (or vibration portion 211a) of the first vibration generator 210 may be aligned with or overlap the second portion 230a of each vibration structure 211 (or vibration portion 211a) of the second vibration generator 230. For example, the first portion 210a of the vibration structure 211 (or the vibration portion 211a) of the first vibration generator 210 may be accurately aligned with or accurately overlap the second portion 230a of each vibration structure 211 (or vibration portion 211a) of the second vibration generator 230. For example, the first portion 210a of the vibration structure 211 (or the vibration portion 211a) of the first vibration generator 210 may correspond to the second portion 230a of each vibration structure 211 (or vibration portion 211a) of the second vibration generator 230. Therefore, in the vibration apparatus 200 according to an embodiment of the present disclosure, the vibration structure 211 (or a first vibration structure) of the first vibration generator 210 and the vibration structure 211 (or a second vibration structure) of the second vibration generator 230 may be displaced in the same direction, and thus, the displacement amount or the amplitude displacement of the vibration apparatus 200 may be maximized or increase. Accordingly, a displacement amount (or a bending force or a flexural force) or an amplitude displacement of the display panel 100 may increase (or maximized).

In the first vibration generator 210, the first protection member 213 may be disposed at the first electrode portion 211b. The first protection member 213 may protect the first electrode portion 211b. The second protection member 215 may be disposed at the second electrode portion 211c. The second protection member 215 may protect the second electrode portion 211c. For example, the first protection member 213 and the second protection member 215 of the first vibration generator 210 may be formed of a plastic material, a fiber material, or wood material, but embodiments of the present disclosure are not limited thereto. For example, in the first vibration generator 210, the first protection member 213 may be formed of the same or different material as the second protection member 215. Any one of the first protection member 213 and the second protection member 215 of the first vibration generator 210 may be connected or coupled to the display panel 100 by a connection member (or a second connection member) 150. For example, the first protection member 213 of the first vibration generator 210 may be connected or coupled to the display panel 100 by the connection member (or the second connection member) 150.

In the second vibration generator 230, the first protection member 213 may be disposed at the first electrode portion 211b. The first protection member 213 may protect the first electrode portion 211b. The second protection member 215 may be disposed at the second electrode portion 211c. The second protection member 215 may protect the second electrode portion 211c. For example, the first protection member 213 and the second protection member 215 of the second vibration generator 230 may be formed of a plastic material, a fiber material, or wood material, but embodiments of the present disclosure are not limited thereto. For example, in the second vibration generator 230, the first protection member 213 may be formed of the same or different material as the second protection member 215. One of the first protection member 213 and the second protection member 215 of the second vibration generator 230 may be connected or coupled to the first vibration generator 210 by an adhesive member (or a first connection member) 250. For example, the first protection member 213 of the second vibration generator 230 may be connected or coupled to the second protection member 215 of the first vibration generator 210 by the adhesive member 250. In addition, the first vibration generator 210 and the second vibration generator 230 may be symmetric to each other with respect to the adhesive member 250 as shown in FIG. 4.

In each of the first vibration generator 210 and the second vibration generator 230, each of the first protection member 213 and the second protection member 215 may be a polyimide (PI) film or a polyethylene terephthalate (PET) film, but embodiments of the present disclosure are not limited thereto.

One or more of the first vibration generator 210 and the second vibration generator 230 according to an embodiment of the present disclosure may further include a first adhesive layer 212 and a second adhesive layer 214.

In the first vibration generator 210, the first adhesive layer 212 may be disposed between the vibration structure 211 and the first protection member 213. For example, the first adhesive layer 212 may be disposed between the first electrode portion 211b of the vibration structure 211 and the first protection member 213. The first protection member 213 may be disposed at a first surface (or the first electrode portion 211b) of the vibration structure 211 by the first adhesive layer 212. For example, the first protection member 213 may be coupled or connected to the first surface (or the first electrode portion 211b) of the vibration structure 211 by a film laminating process using the first adhesive layer 212.

In the first vibration generator 210, the second adhesive layer 214 may be disposed between the vibration structure 211 and the second protection member 215. For example, the second adhesive layer 214 may be disposed between the second electrode portion 211c of the vibration structure 211 and the second protection member 215. The second protection member 215 may be disposed at a second surface (or the second electrode portion 211c) of the vibration structure 211 by the second adhesive layer 214. For example, the second protection member 215 may be coupled or connected to the second surface (or the second electrode portion 211c) of the vibration structure 211 by a film laminating process using the second adhesive layer 214.

In the first vibration generator 210, the first and the second adhesive layers 212 and 214 may be connected or coupled to each other between the first protection member 213 and the second protection member 215. For example, in the first vibration generator 210, the first and the second adhesive layers 212 and 214 may be connected or coupled to each other at a periphery portion between the first protection member 213 and the second protection member 215. Accordingly, in the first vibration generator 210, the vibration structure 211 may be surrounded by the first and second adhesive layers 212 and 214. For example, the first and second adhesive layers 212 and 214 may completely surround the whole vibration structure 211. For example, the first and second adhesive layers 212 and 214 may be referred to as a cover member, but embodiments of the present disclosure are not limited thereto. When the first and second adhesive layers 212 and 214 are a cover member, the first protection member 213 may be disposed at a first surface of the cover member, and the second protection member 215 may be disposed at a second surface of the cover member.

In the second vibration generator 230, the first adhesive layer 212 may be disposed between the vibration structure 211 and the first protection member 213. For example, the first adhesive layer 212 may be disposed between the first electrode portion 211b of the vibration structure 211 and the first protection member 213. The first protection member 213 may be disposed at a first surface (or the first electrode portion 211b) of the vibration structure 211 by the first adhesive layer 212. For example, the first protection member 213 may be coupled or connected to the first surface (or the first electrode portion 211b) of the vibration structure 211 by a film laminating process using the first adhesive layer 212.

In the second vibration generator 230, the second adhesive layer 214 may be disposed between the vibration structure 211 and the second protection member 215. For example, the second adhesive layer 214 may be disposed between the second electrode portion 211c of the vibration structure 211 and the second protection member 215. The second protection member 215 may be disposed at a second surface (or the second electrode portion 211c) of the vibration structure 211 by the second adhesive layer 214. For example, the second protection member 215 may be coupled or connected to the second surface (or the second electrode portion 211c) of the vibration structure 211 by a film laminating process using the second adhesive layer 214.

In the second vibration generator 230, the first and the second adhesive layers 212 and 214 may be connected or coupled to each other between the first protection member 213 and the second protection member 215. For example, in the second vibration generator 230, the first and the second adhesive layers 212 and 214 may be connected or coupled to each other at a periphery portion between the first protection member 213 and the second protection member 215. Accordingly, in the second vibration generator 230, the vibration structure 211 may be surrounded by the first and second adhesive layers 212 and 214. For example, the first and second adhesive layers 212 and 214 may completely surround the whole vibration structure 211. For example, the first and second adhesive layers 212 and 214 may be referred to as a cover member, but embodiments of the present disclosure are not limited thereto. When the first and second adhesive layers 212 and 214 are a cover member, the first protection member 213 may be disposed at a first surface of the cover member, and the second protection member 215 may be disposed at a second surface of the cover member.

In each of the first and the second vibration generators 210 and 230, each of the first and second adhesive layers 212 and 214 may include an electric insulating material. For example, the electric insulating material may have adhesiveness and may include a material capable of compression and decompression. For example, one or more of the first and second adhesive layers 212 and 214 may include an epoxy resin, an acryl resin, a silicone resin, or a urethane resin, but embodiments of the present disclosure are not limited thereto.

One or more of the first and second vibration generators 210 and 230 according to an embodiment of the present disclosure may further include a first power supply line PL1, a second power supply line PL2, and a pad part 217.

The first power supply line PL1 of one or more of the first and second vibration generators 210 and 230 may extend long in a second direction Y. The first power supply line PL1 may be disposed at the first protection member 213 and may be electrically connected to the first electrode portion 211b. For example, the first power supply line PL1 may be disposed at a rear surface of the first protection member 213 facing the first electrode portion 211b and may be electrically connected to the first electrode portion 211b. For example, the first power supply line PL1 may be disposed at the rear surface of the first protection member 213 directly facing the first electrode portion 211b and may be directly and electrically connected to the first electrode portion 211b. For example, the first power supply line PL1 may be electrically connected to the first electrode portion 211b by an anisotropic conductive film. As another embodiment of the present disclosure, the first power supply line PL1 may be electrically connected to the first electrode portion 211b by a conductive material (or particles) included in the first adhesive layer 212.

For example, the first power supply line PL1 of one or more of the first and second vibration generators 210 and 230 may include at least one or more first power lines which protrude along a first direction X crossing the second direction Y. The at least one or more first power lines may extend long from at least one or more among one surface and the other surface of the first power supply line PL1 along the first direction X and may be electrically connected to the first electrode portion 211b. Accordingly, the at least one or more first power lines may enhance the uniformity of the vibration driving signal applied to the first electrode portion 211b.

The second power supply line PL2 of one or more of the first and second vibration generators 210 and 230 may be disposed at the second protection member 215 and may be electrically connected to the second electrode portion 211c. For example, the second power supply line PL2 may be disposed at a rear surface of the second protection member 215 facing the second electrode portion 211c and may be electrically connected to the second electrode portion 211c. For example, the second power supply line PL2 may be disposed at the rear surface of the second protection member 215 directly facing the second electrode portion 211c and may be directly and electrically connected to the second electrode portion 211c. For example, the second power supply line PL2 may be electrically connected to the second electrode portion 211c by an anisotropic conductive film. As another embodiment of the present disclosure, the second power supply line PL2 may be electrically connected to the second electrode portion 211c by a conductive material (or particles) included in the second adhesive layer 214.

For example, the second power supply line PL2 of one or more of the first and second vibration generators 210 and 230 may include at least one or more second power lines which protrude along the first direction X. The at least one or more second power lines may extend long from at least one or more among one surface and the other surface of the second power supply line PL2 along the first direction X and may be electrically connected to the second electrode portion 211c. The at least one or more second power lines may overlap or stack the at least one or more first power lines. Accordingly, the at least one or more second power lines may enhance the uniformity of the vibration driving signal applied to the second electrode portion 211c.

The pad part 217 may be electrically connected to one portion (or one end or one side) of one or more among the first power supply line PL1 and the second power supply line PL2. For example, the pad part 217 may be disposed at a first periphery portion of one or more among the first protection member 213 and the second protection member 215. The pad part 217 may be electrically connected to one portion (or one end or one side) of one or more among the first power supply line PL1 and the second power supply line PL2 at a first periphery portion of one or more among the first protection member 213 and the second protection member 215.

The pad part 217 according to an embodiment of the present disclosure may include a first pad electrode electrically connected to one portion (or one end or one side) of the first power supply line PL1 and a second pad electrode electrically connected to one portion (or one end or one side) of the second power supply line PL2. For example, one or more of the first pad electrode and the second pad electrode may be exposed at the first periphery portion of one or more among the first protection member 213 and the second protection member 215.

One or more of the first and second vibration generators 210 and 230 according to an embodiment of the present disclosure may further include a flexible cable 219.

The flexible cable 219 may be electrically connected to the pad part 217 of one or more among the first and second vibration generators 210 and 230. Thus, the flexible cable 219 may supply a corresponding vibration structure 211 with vibration driving signals (or a sound signal) provided from a vibration driving circuit. The flexible cable 219 according to an embodiment of the present disclosure may include a first terminal electrically connected to the first pad electrode of the pad part 217 and a second terminal electrically connected to the second pad electrode of the pad part 217. For example, the flexible cable 219 may be a flexible printed circuit cable or a flexible flat cable, but embodiments of the present disclosure are not limited thereto.

The vibration driving circuit (or a sound processing circuit) may generate an alternating current (AC) vibration driving signal including a first vibration driving signal and a second vibration driving signal based on a sound source. The first vibration driving signal may be one of a positive (+) vibration driving signal and a negative (−) vibration driving signal, and the second vibration driving signal may be one of a positive (+) vibration driving signal and a negative (−) vibration driving signal. According to another embodiment of the present disclosure, the first vibration driving signal may be supplied to the first electrode portion 211b of the vibration structure 211 through the first terminal of the flexible cable 219, the first pad electrode of the pad part 217, and the first power supply line PL1. The second vibration driving signal may be supplied to the second electrode portion 211c of the vibration structure 211 through the second terminal of the flexible cable 219, the second pad electrode of the pad part 217, and the second power supply line PL2. As another embodiment of the present disclosure, the first vibration driving signal may be supplied to the second electrode portion 211c of the vibration structure 211 through the first terminal of the flexible cable 219, the second pad electrode of the pad part 217, and the second power supply line PL2. The second vibration driving signal may be supplied to the first electrode portion 211b of the vibration structure 211 through the second terminal of the flexible cable 219, the first pad electrode of the pad part 217, and the first power supply line PL1.

The adhesive member 250 according to an embodiment of the present disclosure may be disposed between the first and second vibration generators 210 and 230. For example, the adhesive member 250 may be disposed between the first protection member 213 of the first vibration generator 210 and the second protection member 215 of the second vibration generator 230. For example, the adhesive member 250 may include a material including an adhesive layer which is good in adhesive force or attaching force with respect to the first and second vibration generators 210 and 230. For example, the adhesive member 250 may include a foam pad, a double-sided tape, or an adhesive, but embodiments of the present disclosure are not limited thereto. For example, an adhesive layer of the adhesive member 250 may include epoxy, acryl, silicone, or urethane, but embodiments of the present disclosure are not limited thereto.

In FIGS. 3 and 4 and description relevant thereto, the vibration apparatus 200 according to an embodiment of the present disclosure has been described as including the first and second vibration generators 210 and 230 and the adhesive member 250 disposed between the first and second vibration generators 210 and 230, but embodiments of the present disclosure are not limited thereto. For example, the vibration apparatus 200 according to an embodiment of the present disclosure may include a plurality of (for example, three or more) vibration generators 210 and 230 and an adhesive member 250 disposed between the plurality of vibration generators 210 and 230 based on a sound pressure level characteristic and an output characteristic of a sound generated based on a displacement of the display panel 100 based on a size and weight of the display panel 100. In this case, in order to maximize or increase the displacement amount or the amplitude displacement of the vibration apparatus 200, the plurality of vibration generators 210 and 230 may have the same size and may overlap or stack. For example, first and second portions (or end portions, ends, outer surfaces, or each corner portion) 210a and 230a of each vibration structure 211 (or vibration portion 221a) of one or more of the plurality of vibration generators 210 and 230 may substantially overlap or stack without being staggered. For example, the first and second portions (or end portions, ends, outer surfaces, or each corner portion) 210a and 230a of each vibration structure 211 (or vibration portion 221a) of one or more of the plurality of vibration generators 210 and 230 may substantially overlap or stack within an error range of a manufacturing process without being staggered. For example, the first and second portions (or end portions, ends, outer surfaces, or each corner portion) 210a and 230a of each vibration structure 211 (or vibration portion 221a) of each of the plurality of vibration generators 210 and 230 may be aligned on a virtual extension line VL, or may be disposed on the virtual extension line VL. For example, the first and second portions (or end portions, ends, outer surfaces, or each corner portion) 210a and 230a of each vibration structure 211 (or vibration portion 221a) of each of the plurality of vibration generators 210 and 230 may be accurately aligned on the virtual extension line VL, or may be accurately disposed on the virtual extension line VL.

Figure 5:
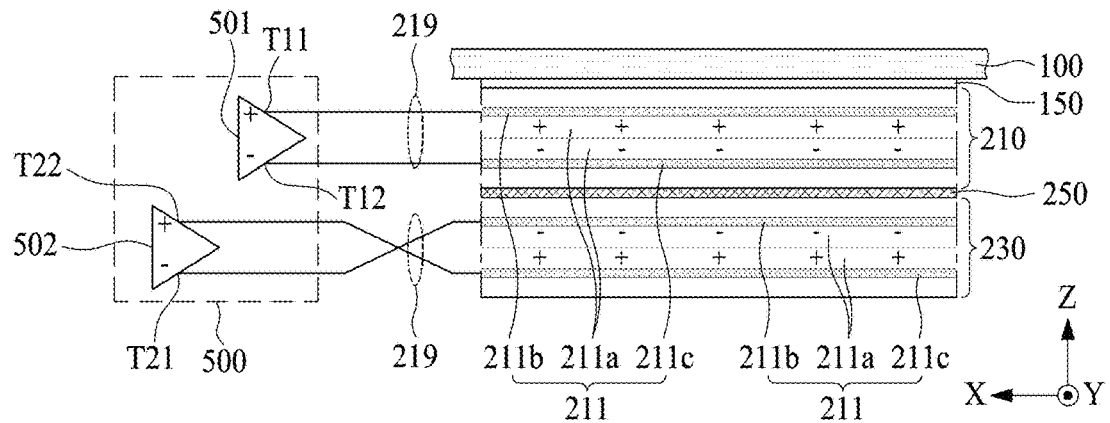
FIG. 5 illustrates a vibration driving circuit according to an embodiment of the present disclosure.

FIG. 5 illustrates a vibration driving circuit according to an embodiment of the present disclosure. FIG. 5 illustrates a vibration driving circuit connected to the vibration apparatus illustrated in FIG. 3.

With reference to FIGS. 3 to 5, the vibration driving circuit 500 according to an embodiment of the present disclosure may be electrically connected to the vibration apparatus 200 and may generate a vibration driving signal based on a sound source to supply the vibration driving signal to the vibration apparatus 200, thereby vibrating or displacing the vibration apparatus 200.

The vibration driving circuit 500 according to an embodiment of the present disclosure may include a plurality of amplifiers 501 and 502 respectively connected to the plurality of vibration generators 210 and 230 configuring the vibration apparatus 200. For example, the vibration driving circuit 500 may include first and second amplifiers 501 and 502 respectively connected to the first and second vibration generators 210 and 230 configuring the vibration apparatus 200.

The first amplifier 501 may generate an alternating current (AC) vibration driving signal including a first vibration driving signal and a second vibration driving signal based on a sound source.

The first amplifier 501 according to an embodiment of the present disclosure may include a first output terminal T11 outputting the first vibration driving signal and a second output terminal T12 outputting the second vibration driving signal.

In the first amplifier 501, the first output terminal T11 may be electrically connected to one of the first electrode portion 211b and the second electrode portion 211c of the first vibration generator 210. The second output terminal T12 may be electrically connected to the other of the first electrode portion 211b and the second electrode portion 211c of the first vibration generator 210. For example, the first output terminal T11 of the first amplifier 501 may be electrically connected to the first electrode portion 211b of the first vibration generator 210, and the second output terminal T12 of the first amplifier 501 may be electrically connected to the second electrode portion 211c of the first vibration generator 210. For example, the first vibration driving signal output from the first output terminal T11 of the first amplifier 501 may be supplied to the first electrode portion 211b through the flexible cable 219, the pad part 217, and the first power supply line PL1 of the first vibration generator 210. The second vibration driving signal output from the second output terminal T12 of the first amplifier 501 may be supplied to the second electrode portion 211c through the flexible cable 219, the pad part 217, and the second power supply line PL2 of the first vibration generator 210.

The second amplifier 502 according to an embodiment of the present disclosure may include a first output terminal T21 outputting the first vibration driving signal and a second output terminal T22 outputting the second vibration driving signal.

The first and second output terminals T21 and T22 of the second amplifier 502 may be respectively connected to the first electrode portion 211b and the second electrode portion 211c of the second vibration generator 230 so that second vibration generator 230 is displaced in the same direction as a displacement direction of the first vibration generator 210. In the second amplifier 502, the first output terminal T21 may be electrically connected to one of the first electrode portion 211b and the second electrode portion 211c of the second vibration generator 230, and the second output terminal T22 may be electrically connected to the other of the first electrode portion 211b and the second electrode portion 211c of the second vibration generator 230. For example, the first output terminal T21 of the second amplifier 502 may be electrically connected to the second electrode portion 211c of the second vibration generator 230, and the second output terminal T22 of the second amplifier 502 may be electrically connected to the first electrode portion 211b of the second vibration generator 230. For example, the first vibration driving signal output from the first output terminal T21 of the second amplifier 502 may be supplied to the second electrode portion 211c through the flexible cable 219, the pad part 217, and the second power supply line PL2 of the second vibration generator 230. The second vibration driving signal output from the second output terminal T22 of the second amplifier 502 may be supplied to the first electrode portion 211b through the flexible cable 219, the pad part 217, and the first power supply line PL1 of the second vibration generator 230.

In FIG. 5 and description relevant thereto, the vibration driving circuit 500 according to an embodiment of the present disclosure has been described as including the first and second amplifiers 501 and 502, but embodiments of the present disclosure are not limited thereto. For example, the vibration driving circuit 500 according to an embodiment of the present disclosure may include a plurality of (for example, three or more) amplifiers 501 and 502 corresponding to the number of vibration generators 210 and 230 included in the vibration apparatus 200. Each of the three or more amplifiers 501 and 502 may supply a vibration driving signal for displacing each of the three or more vibration generators 210 and 230 in the same direction. According to an embodiment of the present disclosure, in order for each of the three or more vibration generators 210 and 230 to be displaced in the same direction, the three or more vibration generators 210 and 230 may include first and second groups, and the plurality of amplifiers 501 and 502 may include first and second amplifier groups.

A vibration generator 210 of the first group (for example, an odd-numbered vibration generator) may be displaced by a vibration driving signal applied from an amplifier 501 of the first amplifier group (for example, an odd-numbered amplifier), and a vibration generator 230 of the second group (for example, an even-numbered vibration generator) may be displaced by a vibration driving signal applied from an amplifier 502 of the second amplifier group (for example, an even-numbered amplifier), whereby three or more vibration generators 210 and 230 may be displaced in the same direction. For example, in the amplifier 501 of the first amplifier group, a first output terminal T11 may be electrically connected to a first electrode portion 211b of the vibration generator 210 of the first group, and a second output terminal T12 may be electrically connected to a second electrode portion 211c of the vibration generator 210 of the first group. Also, in the amplifier 502 of the second amplifier group, a first output terminal T21 may be electrically connected to a second electrode portion 211c of the vibration generator 230 of the second group, and a second output terminal T22 may be electrically connected to a first electrode portion 211b of the vibration generator 210 of the second group.

Figure 6A:
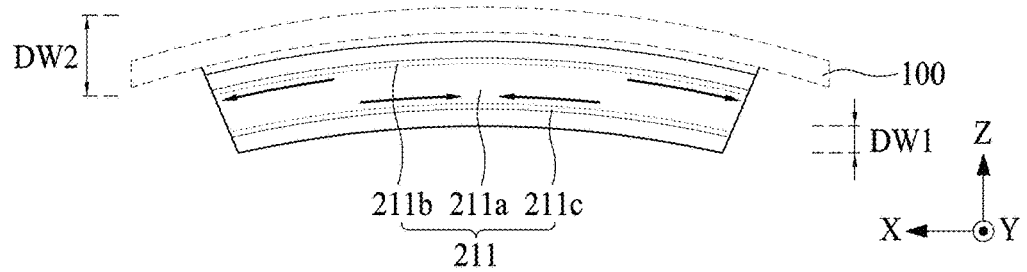
FIG. 6A illustrates a displacement of a vibration generator according to an embodiment of the present disclosure.
Figure 6B:
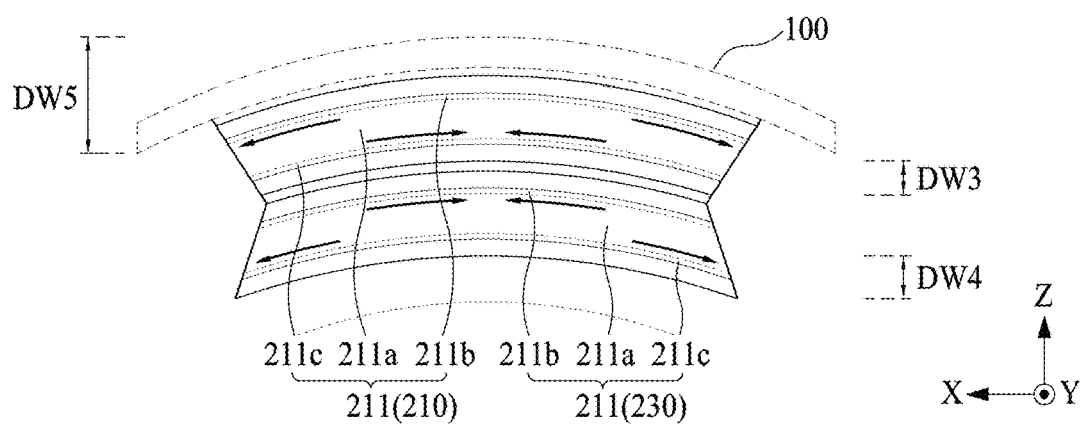
FIG. 6B illustrates a displacement of a vibration apparatus according to an embodiment of the present disclosure.

FIG. 6A illustrates a displacement of a vibration generator according to an embodiment of the present disclosure. FIG. 6B illustrates a displacement of a vibration apparatus according to an embodiment of the present disclosure.

With reference to FIG. 6A, a plurality of vibration generators 210 and 230 according to an embodiment of the present disclosure may be displaced (or vibrated) based on a first amplitude DW1 according to a vibration driving signal, with respect to a thickness direction Z of a display panel 100. For example, a vibration portion 211a of each of the vibration generators 210 and 230 may include a first region (or a first polarization region) adjacent to a first electrode portion 211a and a second region (or a second polarization region) adjacent to a second electrode portion 211c. The vibration portion 211a may be displaced based on the first amplitude DW1, based on expansion of the first region based on a positive (+) vibration driving signal and contraction of the second region based on a negative (−) vibration driving signal. Accordingly, the display panel 100 may be displaced (or vibrated) based on a second amplitude DW2 corresponding to the first amplitude DW1 based on displacements of the vibration generators 210 and 230 having the first amplitude DW1.

With reference to FIG. 6B, first and second vibration generators 210 and 230 according to an embodiment of the present disclosure may be displaced (or vibrated) based on a third amplitude DW3 according to a vibration driving signal, with respect to a thickness direction Z of a display panel 100. The first and second vibration generators 210 and 230 may be displaced (or vibrated) in the same direction based on a stack structure where the first and second vibration generators 210 and 230 overlap each other, and thus, a vibration apparatus including the first and second vibration generators 210 and 230 having the stack structure may be displaced (or vibrated) based on an amplitude which is relatively greater than a vibration apparatus including a vibration generator having a single structure. For example, a vibration portion 211a of each of the vibration generators 210 and 230 may include a first region (or a first polarization region) adjacent to a first electrode portion 211b and a second region (or a second polarization region) adjacent to a second electrode portion 211c. The vibration portion 211a of the first vibration generator 210 may be displaced based on the third amplitude DW3, based on expansion of the first region based on a positive (+) vibration driving signal and contraction of the second region based on a negative (−) vibration driving signal, and simultaneously, the vibration portion 211a of the second vibration generator 230 may be displaced based on a fourth amplitude DW4, based on contraction of the first region based on the negative (−) vibration driving signal and expansion of the second region based on the positive (+) vibration driving signal. Therefore, the display panel 100 may be displaced (or vibrated) based on a fifth amplitude DW5 corresponding to the third amplitude DW3 of the first vibration generator 210 and the fourth amplitude DW4 of the second vibration generator 230, and thus, may be vibrated based on an amplitude which is relatively greater than a vibration of a vibration apparatus including a vibration generator having a single structure. For example, the vibration apparatus 200 according to an embodiment of the present disclosure may have a driving direction which matches a driving direction of the vibration apparatus including the vibration generator having the single structure, and thus, a driving force of the vibration apparatus 200 may be maximized or enhanced. Accordingly, a displacement amount (or a bending force or a flexural force) or an amplitude displacement of the display panel 100 may be increased (or maximized) by a displacement of the vibration apparatus 200, and thus, a sound pressure level characteristic of a sound and a sound characteristic of a middle-low-pitched sound band generated based on a vibration of the display panel 100.

Figure 7:
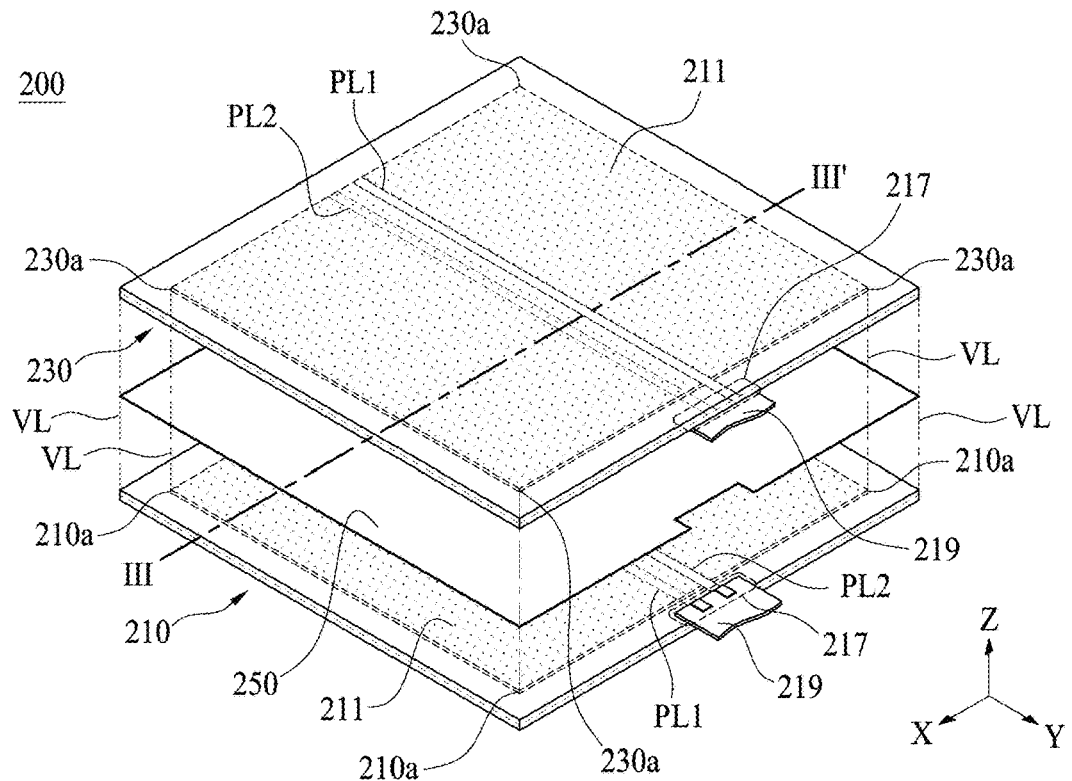
FIG. 7 illustrates a vibration apparatus according to another embodiment of the present disclosure.
Figure 8:
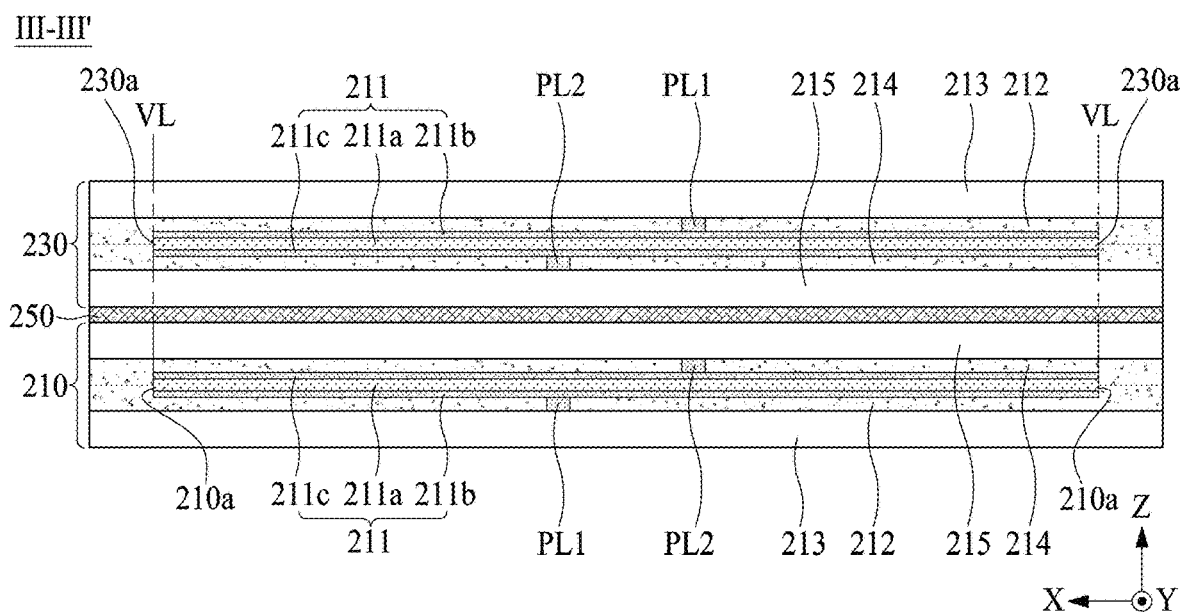
FIG. 8 is a cross-sectional view taken along line III-III' illustrated in FIG. 7.

FIG. 7 illustrates a vibration apparatus according to another embodiment of the present disclosure. FIG. 8 is a cross-sectional view taken along line III-III' illustrated in FIG. 7. FIG. 8 illustrates an embodiment implemented by modifying the second vibration generator of the vibration apparatus illustrated in FIG. 3. Therefore, in the following description, repetitive descriptions of elements other than a second vibration generator and elements relevant thereto may be omitted or will be briefly given.

With reference to FIGS. 7 and 8, in the vibration apparatus 200 according to another embodiment of the present disclosure, a second vibration generator 230 may include a vibration structure 211, a first protection member 213, and a second protection member 215. The second vibration generator 230 may be attached on a first vibration generator 210 as a vertically reversed type.

The second vibration generator 230 may be disposed at a rear surface of the first vibration generator 210 by an adhesive member 250 (or a first connection member) in a state which is vertically reversed to have a stack structure opposite to a stack structure of the first vibration generator 230, with respect to a rear surface of the display panel 100.

According to an embodiment of the present disclosure, the first protection member 213 of the first vibration generator 210 may be connected or coupled to the rear surface of the display panel 100 by a connection member 150 (or a second connection member). In this case, the second protection member 215 of the second vibration generator 230 may be connected or coupled to the second protection member 215 of the first vibration generator 210 by an adhesive member 250. For example, in order for the first and second vibration generators 210 and 230 to be simultaneously displaced in the same direction, a first electrode portion 211b of the first vibration generator 210 may be disposed closer to the display panel 100 than a second electrode portion 211c, and a second electrode portion 211c of the second vibration generator 230 may be disposed closer to the display panel 100 than a first electrode portion 211b.

According to another embodiment of the present disclosure, the second protection member 215 of the first vibration generator 210 may be connected or coupled to the rear surface of the display panel 100 by the connection member 150. In this case, the first protection member 213 of the second vibration generator 230 may be connected or coupled to the first protection member 213 of the first vibration generator 210 by the adhesive member 250. For example, in order for the first and second vibration generators 210 and 230 to be simultaneously displaced in the same direction, the second electrode portion 211c of the first vibration generator 210 may be disposed closer to the display panel 100 than the first electrode portion 211b, and the first electrode portion 211b of the second vibration generator 230 may be disposed closer to the display panel 100 than the second electrode portion 211c.

Therefore, in the vibration apparatus 200 according to another embodiment of the present disclosure, the second vibration generator 230 may be disposed at the first vibration generator 210 in a vertically reversed state, and thus, in performing an electrical connection to a vibration driving circuit, each of the first and second vibration generators 210 and 230 may be electrically connected to the vibration driving circuit based on the same electrical connection type, even without changing an electrical connection structure between the second vibration generator 230 and the vibration driving circuit.

Figure 9:
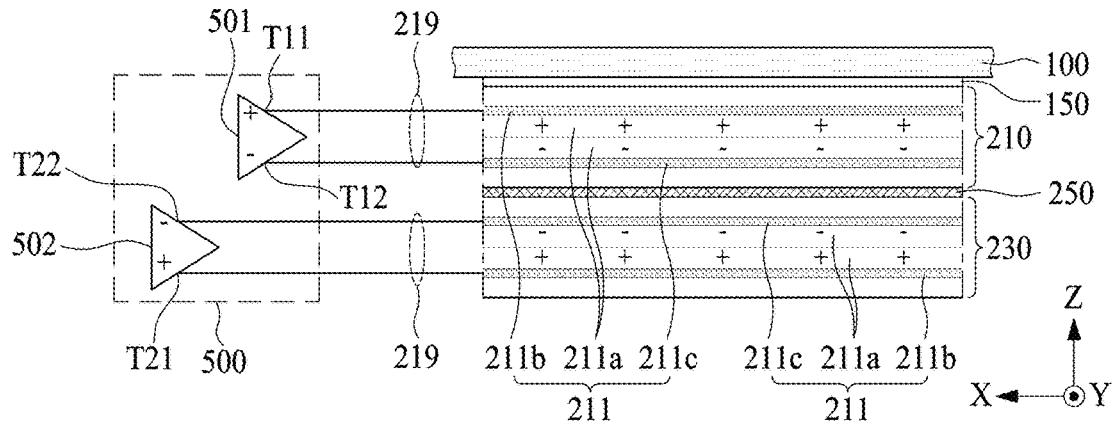
FIG. 9 illustrates a vibration driving circuit according to another embodiment of the present disclosure.

FIG. 9 illustrates a vibration driving circuit according to another embodiment of the present disclosure. FIG. 9 illustrates a vibration driving circuit connected to the vibration apparatus illustrated in FIG. 7.

With reference to FIGS. 7 to 9, the vibration driving circuit 500 according to another embodiment of the present disclosure may be electrically connected to the vibration apparatus 200 and may generate a vibration driving signal based on a sound source to supply the vibration driving signal to the vibration apparatus 200, thereby vibrating or displacing the vibration apparatus 200.

The vibration driving circuit 500 according to an embodiment of the present disclosure may include a plurality of amplifiers 501 and 502 respectively connected to the plurality of vibration generators 210 and 230 configuring the vibration apparatus 200. For example, the vibration driving circuit 500 may include first and second amplifiers 501 and 502 respectively connected to the first and second vibration generators 210 and 230 configuring the vibration apparatus 200.

The first amplifier 501 may generate an AC vibration driving signal including a first vibration driving signal and a second vibration driving signal based on a sound source. The first amplifier 501 according to an embodiment of the present disclosure may include a first output terminal T11 outputting the first vibration driving signal and a second output terminal T12 outputting the second vibration driving signal. The first amplifier 501 may be substantially the same as the first amplifier 501 described above with reference to FIG. 5, and thus, the repetitive description thereof may be omitted.

The second amplifier 502 according to an embodiment of the present disclosure may include a first output terminal T21 outputting the first vibration driving signal and a second output terminal T22 outputting the second vibration driving signal.

The first and second output terminals T21 and T22 of the second amplifier 502 may be respectively connected to the first electrode portion 211b and the second electrode portion 211c of the second vibration generator 230 so that second vibration generator 230 is displaced in the same direction as a displacement direction of the first vibration generator 210. For example, the first output terminal T21 of the second amplifier 502 may be electrically connected to the first electrode portion 211b of the second vibration generator 230, and the second output terminal T22 of the second amplifier 502 may be electrically connected to the second electrode portion 211c of the second vibration generator 230. For example, the first vibration driving signal output from the first output terminal T21 of the second amplifier 502 may be supplied to the first electrode portion 211b through the flexible cable 219, the pad part 217, and the first power supply line PL1 of the second vibration generator 230. The second vibration driving signal output from the second output terminal T22 of the second amplifier 502 may be supplied to the second electrode portion 211c through the flexible cable 219, the pad part 217, and the second power supply line PL2 of the second vibration generator 230.

In the vibration driving circuit 500 according to another embodiment of the present disclosure, the second vibration generator 230 may be disposed at or attached on the first vibration generator 210 as a vertically reversed type, and thus, the second amplifier 502 may be electrically connected to the second vibration generator 230 without changing of positions of the first and second output terminals T21 and T22 of the second amplifier 502. For example, the second vibration generator 230 illustrated in FIGS. 2 to 5 may be disposed at or attached on the first vibration generator 210 without being vertically reversed, and thus, in order for the three or more vibration generators 210 and 230 to be displaced in the same direction, the second amplifier 502 may be electrically connected to the second vibration generator 230 in a state where positions of the first and second output terminals T21 and T22 of the second amplifier 502 have been changed. For example, the second vibration generator 230 illustrated in FIGS. 7 to 9 may be disposed in or attached on the first vibration generator 210 in a vertically reversed state, and thus, in order for the three or more vibration generators 210 and 230 to be displaced in the same direction, positions of the first and second output terminals T21 and T22 of the second amplifier 502 may not need to be changed therebetween. Therefore, an electrical connection type between the first and second output terminals T21 and T22 of the second amplifier 502 and the second vibration generator 230 may be the same as an electrical connection type between the first and second output terminals T11 and T12 of the first amplifier 501 and the first vibration generator 210, and thus, the easiness of assembly between each of the first and second vibration generators 210 and 230 and the first and second amplifiers 501 and 502 may be increased or enhanced. For example, the first output terminal T11 of the first amplifier 501 may be electrically connected to the first electrode portion 211b of the first vibration generator 210, and the second output terminal T12 of the first amplifier 501 may be electrically connected to the second electrode portion 211c of the first vibration generator 210. Likewise, the first output terminal T21 of the second amplifier 502 may be electrically connected to the first electrode portion 211b of the second vibration generator 230, and the second output terminal T22 of the second amplifier 502 may be electrically connected to the first electrode portion 211c of the second vibration generator 230.

In FIGS. 7 to 9 and description relevant thereto, the vibration apparatus 200 according to another embodiment of the present disclosure has been described as including the first and second vibration generators 210 and 230, but embodiments of the present disclosure are not limited thereto. For example, the vibration apparatus 200 according to another embodiment of the present disclosure may include a plurality of (for example, three or more) vibration generators 210 and 230. In order for each of the three or more vibration generators 210 and 230 to be displaced in the same direction, the three or more vibration generators 210 and 230 may include first and second groups.

As an embodiment of the present disclosure, a vibration generator 210 of the first group (for example, an odd-numbered vibration generator) may be displaced in a state which is not vertically reversed, and a vibration generator 230 of the second group (for example, an even-numbered vibration generator) may be displaced in a state which is vertically reversed. For example, a first electrode portion 211b of the vibration generator 210 of the first group may be disposed closer to the display panel 100 than a second electrode portion 211c, and a second electrode portion 211c of the vibration generator 230 of the second group may be disposed closer to the display panel 100 than a first electrode portion 211b.

As another embodiment of the present disclosure, the vibration generator 210 of the first group (for example, the odd-numbered vibration generator) may be displaced in a state which is vertically reversed, and the vibration generator 230 of the second group (for example, the even-numbered vibration generator) may be displaced in a state which is not vertically reversed. For example, the second electrode portion 211c of the vibration generator 210 of the first group may be disposed closer to the display panel 100 than the first electrode portion 211b, and the first electrode portion 211b of the vibration generator 230 of the second group may be disposed closer to the display panel 100 than the second electrode portion 211c.

According to another embodiment of the present disclosure, the vibration driving circuit 200 may include a plurality of (for example, three or more) amplifiers 501 and 502 corresponding to the number of vibration generators 210 and 230 included in the vibration apparatus 200. Each of the three or more amplifiers 501 and 502 may supply a vibration driving signal for displacing each of the three or more vibration generators 210 and 230 in the same direction. For example, a first electrode portion 211b of each of the three or more vibration generators 210 and 230 may be supplied with a first vibration driving signal from first output terminals T11 and T21 of corresponding amplifiers 501 and 502 of the three or more amplifiers 501 and 502. A second electrode portion 211c of each of the three or more vibration generators 210 and 230 may be supplied with a second vibration driving signal from second output terminals T11 and T21 of corresponding amplifiers 501 and 502 of the three or more amplifiers 501 and 502.

Figure 10:
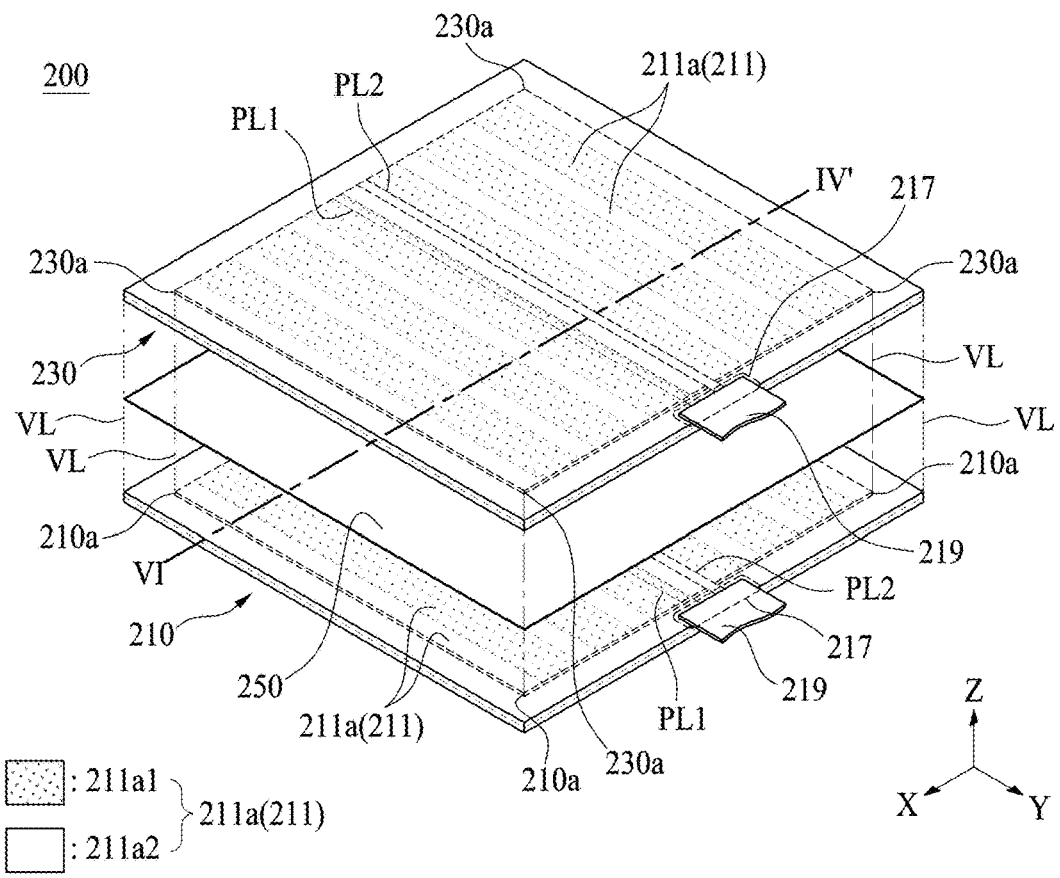
FIG. 10 illustrates a vibration apparatus according to another embodiment of the present disclosure.
Figure 11:
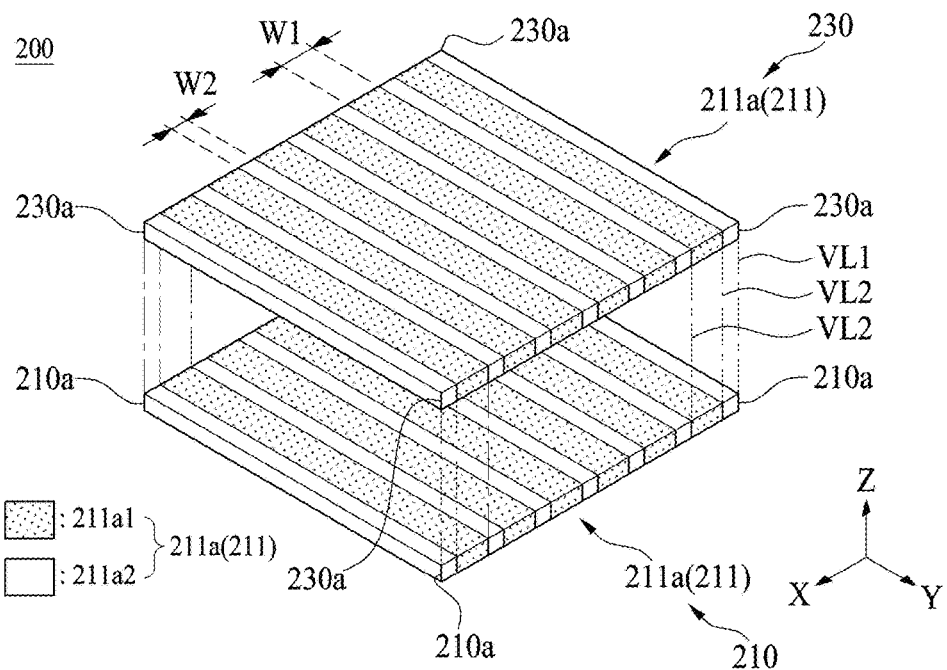
FIG. 11 illustrates a vibration portion illustrated in FIG. 10.
Figure 12:
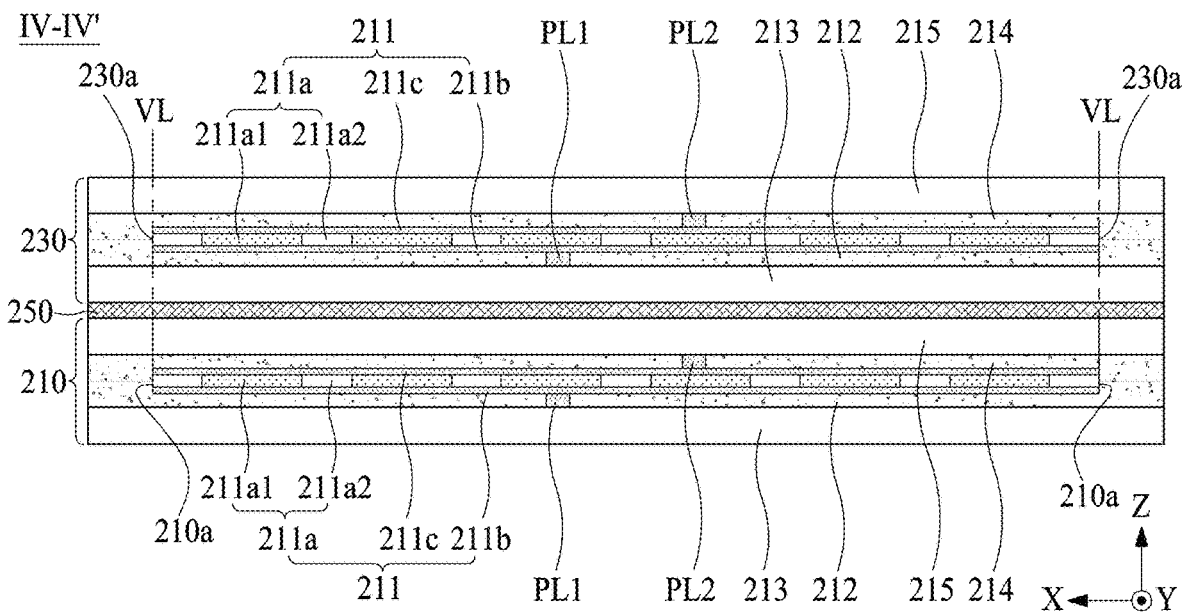
FIG. 12 is a cross-sectional view taken along line IV-IV' illustrated in FIG. 10.

FIG. 10 illustrates a vibration apparatus according to another embodiment of the present disclosure. FIG. 11 illustrates a vibration portion illustrated in FIG. 10. FIG. 12 is a cross-sectional view taken along line IV-IV' illustrated in FIG. 10 and illustrates an embodiment implemented by modifying a vibration structure in the vibration apparatus illustrated in FIGS. 2 to 5 or the vibration apparatus illustrated in FIGS. 7 to 9. Therefore, in the following description, repetitive descriptions of elements other than a vibration structure and elements relevant thereto may be omitted or will be briefly given.

With reference to FIGS. 10 to 13, in the vibration apparatus 200 according to an embodiment of the present disclosure, the vibration structure 211 of each of the vibration generators 210 and 230 may include a vibration portion 211a, a first electrode portion 211b, and a second electrode portion 211c.

The vibration portion 211a may include a piezoelectric material, a composite piezoelectric material, or an electroactive material, and the piezoelectric material, the composite piezoelectric material and the electroactive material may have a piezoelectric effect. The vibration portion 211a may include an inorganic material and an organic material. For example, the vibration portion 211a may include a plurality of inorganic material portion configured as a piezoelectric material and at least one organic material portion configured as a flexible material. For example, the vibration portion 211a may be referred to as a piezoelectric vibration portion, a piezoelectric composite layer, a piezoelectric composite, or a piezoelectric ceramic composite, but embodiments of the present disclosure are not limited thereto. The vibration portion 211a may be formed of a transparent, semitransparent, or opaque piezoelectric material, and the vibration portion 211a may be transparent, semitransparent, or opaque. The vibration structure 211 including the vibration portion 211a, or each of the vibration generators 210 and 230 may be referred to as a flexible vibration generator, a flexible actuator, a flexible speaker, a flexible piezoelectric speaker, a film actuator, a film type piezoelectric composite actuator, a film speaker, a film type piezoelectric speaker, a film type piezoelectric composite speaker, or the like, but embodiments of the present disclosure are not limited thereto.

The vibration portion 211a according to an embodiment of the present disclosure may include a plurality of first portions 211a1 and a plurality of second portions 211a2. For example, the plurality of first portions 211a1 and the plurality of second portions 211a2 may be alternately and repeatedly arranged in a first direction X (or a second direction Y). For example, the first direction X may be a widthwise direction of the vibration portion 211a, the second direction Y may be a lengthwise direction of the vibration portion 211a, but embodiments of the present disclosure are not limited thereto. For example, the first direction X may be the lengthwise direction of the vibration portion 211a, and the second direction Y may be the widthwise direction of the vibration portion 211a.

Each of the plurality of first portions 211a1 may be configured as an inorganic material portion. The inorganic material portion may include the piezoelectric material described above. For example, each of the plurality of first portions 211a1 may include a piezoelectric material which is be substantially the same as the vibration portion 211a described above with reference to FIGS. 3 and 4, and thus, their repetitive descriptions may be omitted.

Each of the plurality of first portions 211a1 according to an embodiment of the present disclosure may be disposed between the plurality of second portions 211a2. Each of the plurality of second portions 211a2 may be disposed (or arranged) parallel to each other with the first portions 211a1 therebetween. For example, the plurality of first portions 211a1 may have a first width W1 parallel to the first direction X (or the second direction Y) and a length parallel to the second direction Y (or the first direction X). Each of the plurality of second portions 211a2 may have a second width W2 parallel to the first direction X (or the second direction Y) and may have a length parallel to the second direction Y (or the first direction X). The first width W1 may be the same as or different from the second width W2. Each of the plurality of second portions 211a2 may have the same size, for example, the same width, area, or volume. For example, each of the plurality of second portions 211a2 may have the same size (for example, the same width, area, or volume) within a process error range (or an allowable error) occurring in a manufacturing process. For example, the first width W1 may be greater than the second width W2. For example, the first portion 211a1 and the second portion 211a2 may include a line shape or a stripe shape which has the same size or different sizes. Therefore, the vibration portion 211a may include a 2-2 composite structure and thus may have a resonance frequency of 20 kHz or less, but embodiments of the present disclosure are not limited thereto. For example, the resonance frequency of the vibration portion 211a may vary based on at least one or more of a shape, a length, and a thickness.

In the vibration portion 211a, the plurality of first portions 211a1 and the plurality of second portions 211a2 may be disposed (or arranged) on the same plane (or the same layer) in parallel. Each of the plurality of second portions 211a2 may fill a gap between two adjacent first portions of the plurality of first portions 211a1. Each of the plurality of second portions 211a2 may be connected to or attached to first portions 211a1 adjacent thereto. For example, each of the plurality of second portions 211a2 may be configured to fill a gap between two adjacent first portions 211a1 and may be connected or attached to adjacent second portion 211a2. Thus, the vibration portion 211a may extend by a desired size or length based on the side coupling (or connection) of the first portions 211a1 and the second portions 211a2.

In the vibration portion 211a, a width (or a size) W2 of each of the plurality of second portions 211a2 may progressively decrease in a direction from a center portion to both periphery portions (or both ends) of the vibration portion 211a.

According to an embodiment of the present disclosure, a second portion 211a2, having a largest width W2 among the plurality of second portions 211a2, may be located at a portion at which a highest stress may concentrate when the vibration portion 211a is vibrating in a vertical (or upper and lower) direction Z (or a thickness direction). A second portion 211a2, having a smallest width W2 among the plurality of second portions 211a2, may be disposed at a portion where a relatively low stress may occur when the vibration portion 211a is vibrating in the vertical direction Z. For example, the second portion 211a2, having the largest width W2 among the plurality of second portions 211a2, may be disposed at the center portion of the vibration portion 211a, and the second portion 211a2, having the smallest width W2 among the plurality of second portions 211a2 may be disposed at one or more of the both periphery portions of the vibration portion 211a. Therefore, when the vibration portion 211a is vibrating in the vertical direction Z, interference of a sound wave or overlapping of a resonance frequency, occurring in the portion on which the highest stress concentrates, may be reduced or minimized. Thus, dipping phenomenon of a sound pressure level occurring in the low-pitched sound band may be reduced, thereby improving flatness of a sound characteristic in the low-pitched sound band. For example, flatness of a sound characteristic may be a level of a deviation between a highest sound pressure level and a lowest sound pressure level.

In the vibration portion 211a, each of the plurality of first portions 211a1 may have different sizes (or widths). For example, a size (or a width) of each of the plurality of first portions 211a1 may progressively decrease or increase in a direction from the center portion to the both periphery portions (or both ends) of the vibration portion 211a. In the vibration portion 211a, a sound pressure level characteristic of a sound may be enhanced and a sound reproduction band may increase, based on various natural vibration frequencies according to a vibration of each of the plurality of first portions 211a1 having different sizes.

Each of the plurality of second portions 211a2 may be disposed between the plurality of first portions 211a1. Therefore, in the vibration portion 211a, vibration energy by a link in a unit lattice of the first portion 211a1 may increase by a corresponding second portion 211a2. Thus, a vibration characteristic may increase, and a piezoelectric characteristic and flexibility may be secured. For example, the second portion 211a2 may include one or more among an epoxy-based polymer, an acryl-based polymer, and a silicone-based polymer, but embodiments of the present disclosure are not limited thereto.

The plurality of second portions 211a2 according to an embodiment of the present disclosure may be configured as an organic material portion. For example, the organic material portion may be disposed between the inorganic material portions and may absorb an impact applied to the inorganic material portion (or the first portion), may release a stress concentrating on the inorganic material portion to enhance the total durability of the vibration portion 211a, and may provide flexibility to the vibration portion 211a.

The plurality of second portions 211a2 according to an embodiment of the present disclosure may have modulus and viscoelasticity that are lower than those of the first portion 211a1, and thus, the second portion 211a2 may enhance the reliability of the first portion 211a1 vulnerable to an impact due to a fragile characteristic.

For example, when the vibration apparatus 200 for vibrating the display panel 100 has an impact resistance and high stiffness, the vibration apparatus 200 may have a high or maximum vibration characteristic. For the vibration apparatus 200 to have an impact resistance and high stiffness, each of the plurality of second portions 211a2 may include a material having a relatively high damping factor (tan δ) and relatively high stiffness. For example, each of the plurality of second portions 211a2 may include a material having a damping factor (tan δ) of about 0.1 [GPa] to about 1 [GPa] and relatively high stiffness of about 0 [GPa] to about 10 [GPa]. Also, a damping factor (tan δ) and a stiff characteristic may be described based on a correlation between a loss coefficient and modulus. For example, the second portion 211a2 may include a material having a loss coefficient of about 0.01 to about 1.0 and modulus of about 0.1 [GPa] to about 10 [GPa].

The organic material portion included in the second portion 211a2 may include one or more of an organic material, an organic polymer, an organic piezoelectric material, and an organic non-piezoelectric material that has a flexible characteristic in comparison with the inorganic material portion of the first portions 211a1. For example, the second portion 211a2 may be referred to as an adhesive portion, an elastic portion, a bending portion, a damping portion, or a flexible portion having flexibility, but embodiments of the present disclosure are not limited thereto.

An organic material portion including an organic piezoelectric material may absorb an impact applied to the inorganic material portion (or the first portion 211a1). Thus, the organic material portion may enhance the total durability of the vibration apparatus 200, and may provide a piezoelectric characteristic corresponding to a certain level or more. The organic piezoelectric material according to an embodiment of the present disclosure may be an organic material. The organic piezoelectric material according to an embodiment of the present disclosure may be an organic material having an electroactive characteristic. For example, the organic piezoelectric material may include at least one of polyvinylidene fluoride (PVDF), β-polyvinylidene fluoride (β-PVDF), and polyvinylidene-trifluoroethylene (PVDF-TrFE), but embodiments of the present disclosure are not limited thereto.

An organic material portion including an organic non-piezoelectric material may include a curable resin composition and an adhesive including the curable resin composition. Thus, the organic material portion may absorb an impact applied to the inorganic material portion (or the first portion), thereby enhancing the total durability of the vibration apparatus 200. The organic non-piezoelectric material according to an embodiment of the present disclosure may include at least one of an epoxy-based polymer, an acryl-based polymer, and a silicone-based polymer, but embodiments of the present disclosure are not limited thereto.

According to an embodiment of the present disclosure, an organic material portion including an organic non-piezoelectric material may include an adhesion promoter or an adhesion enhancing agent for adhesiveness between epoxy resin and an inorganic material portion, for a high stiffness characteristic for the vibration apparatus 200. For example, the adhesion promoter may be phosphate or the like, but embodiments of the present disclosure are not limited thereto. The organic material portion may be cured by at least one curing process of a thermal curing process and a photo-curing process. In a process of curing the organic material portion, solvent free type epoxy resin may be used for avoiding or preventing the thickness uniformity of the vibration apparatus 200 from being reduced by contraction of the organic material portion caused by volatilization of a solvent.

The organic material portion including the organic non-piezoelectric material may further include a reinforcing agent, e.g., for a damping characteristic in addition to high stiffness of the vibration apparatus 200. For example, the reinforcing agent may be methylmethacrylate-butadiene-styrene (MBS) having a core shell type, and a content thereof may be about 5 wt % to about 40 wt %. The reinforcing agent may be an elastic body having the core cell type, and may have a high coupling force to epoxy resin, such as an acryl-based polymer. Thus, the reinforcing agent may enhance an impact resistance or a damping characteristic of the vibration apparatus 200.

The plurality of first portions 211a1 and the second portion 211a2 may be disposed on (or connected to) the same plane, and thus, the vibration portion 211a according to an embodiment of the present disclosure may have a single thin film-type. For example, the vibration portion 211a may have a structure in which a plurality of first portions 211a1 is connected to one side of the vibration portion 211a. For example, the plurality of first portions 211a1 may have a structure connected to a whole the vibration portion 211a. For example, the vibration portion 211a may be vibrated in a vertical (or upper and lower) direction (or a thickness direction) by the first portion 211a1 having a vibration characteristic and may be bent in a curved shape by the second portion 211a2 having flexibility. Also, in the vibration portion 211a according to an embodiment of the present disclosure, a size of the first portion 211a1 and a size of the second portion 211a2 may be adjusted based on a piezoelectric characteristic and flexibility needed for the vibration portion 211a. For example, when the vibration portion 211a needs a piezoelectric characteristic rather than flexibility, a size of the first portion 211a1 may be adjusted to be greater than the second portion 211a2. As another embodiment of the present disclosure, when the vibration portion 211a needs flexibility rather than a piezoelectric characteristic, a size of the second portion 211a2 may be adjusted to be greater than the first portion 211a1. Accordingly, a size of the vibration portion 211a may be adjusted based on a characteristic needed therefor, and thus, the vibration portion 211a may be easy to design.

To maximize or increase a displacement amount or an amplitude displacement of the vibration apparatus 200, the vibration structure 211 of the first vibration generator 210 and the vibration structure 211 of the second vibration generator 230 may have the same size and may overlap each other. For example, a first portion (or an end portion, an end, an outer surface, or each corner portion) 210a of the vibration structure 211 (or vibration portion 211a) of the first vibration generator 210 may be substantially aligned with or overlap a second portion (or an end portion, an end, an outer surface, or each corner portion) 230a of each vibration structure 211 (or vibration portion 211a) of the second vibration generator 230 without being staggered. For example, the first portion (or an end portion, an end, an outer surface, or each corner portion) 210a of the vibration structure 211 (or vibration portion 211a) of the first vibration generator 210 may be substantially aligned with or overlap the second portion (or an end portion, an end, an outer surface, or each corner portion) 230a of each vibration structure 211 (or vibration portion 211a) of the second vibration generator 230 within an error range of a manufacturing process without being staggered. For example, the first portion (or an end portion, an end, an outer surface, or each corner portion) 210a of each vibration structure 211 (or vibration portion 211a) of the first vibration generator 210 may be aligned on a first virtual extension line VL1, or may be disposed on the first virtual extension line VL1. The second portion (or an end portion, an end, an outer surface, or each corner portion) 230a of each vibration structure 211 (or vibration portion 211a) of the second vibration generator 230 may be accurately aligned on the first virtual extension line VL1, or may be accurately disposed on the first virtual extension line VL1. The second portion (or an end portion, an end, an outer surface, or each corner portion) 230a of each vibration structure 211 (or vibration portion 211a) of the second vibration generator 230 may be aligned on the first virtual extension line VL1, or may be disposed on the first virtual extension line VL1. The second portion (or an end portion, an end, an outer surface, or each corner portion) 230a of each vibration structure 211 (or vibration portion 211a) of the second vibration generator 230 may be accurately aligned on the first virtual extension line VL1, or may be accurately disposed on the first virtual extension line VL1.

According to another embodiment of the present disclosure, the plurality of first portions 211a1 of the first vibration generator 210 and the plurality of first portions 211a1 of the second vibration generator 230 may have the same size as each other, and may substantially overlap or stack without being staggered. For example, the plurality of first portions 211a1 of the first vibration generator 210 and the plurality of first portions 211a1 of the second vibration generator 230 may have the same size as each other, and may substantially overlap or stack within an error range of a manufacturing process without being staggered. According to another embodiment of the present disclosure, the first portions of the plurality of first portions 211a1 included in the first vibration generator 210 may substantially overlap or stack the first portions of the plurality of first portions 211a1 included in the second vibration generator 230 without being staggered. For example, the first portions of the plurality of first portions 211a1 included in the first vibration generator 210 may substantially overlap or stack the first portions of the plurality of first portions 211a1 included in the second vibration generator 230 within an error range of a manufacturing process without being staggered. For example, the first portions of the plurality of first portions 211a1 included in the first vibration generator 210 and the first portions of the plurality of first portions 211a1 included in the second vibration generator 230 may be aligned on or disposed on a second virtual extension line VL2 without being staggered. For example, the first portions of the plurality of first portions 211a1 included in the first vibration generator 210 and the first portions of the plurality of first portions 211a1 included in the second vibration generator 230 may be accurately aligned on or accurately disposed on the second virtual extension line VL2 within an error range of a manufacturing process without being staggered.

According to another embodiment of the present disclosure, the plurality of second portions 211a2 of the first vibration generator 210 and the plurality of second portions 211a2 of the second vibration generator 230 may have the same size as each other, and may substantially overlap or stack without being staggered. For example, the plurality of second portions 211a2 of the first vibration generator 210 and the plurality of second portions 211a2 of the second vibration generator 230 may have the same size as each other, and may substantially overlap or stack within an error range of a manufacturing process without being staggered. According to another embodiment of the present disclosure, each of the plurality of second portions 211a2 of the first vibration generator 210 may substantially overlap or stack each of the plurality of second portions 211a2 of the second vibration generator 230 without being staggered. For example, each of the plurality of second portions 211a2 of the first vibration generator 210 and each of the plurality of second portions 211a2 of the second vibration generator 230 may be aligned on or disposed on the second virtual extension line VL2 without being staggered. For example, an end (or an end portion or one portion) of each of the plurality of second portions 211a2 included in the first vibration generator 210 and an end (or an end portion or one portion) of each of the plurality of second portions 211a2 included in the second vibration generator 230 may be accurately aligned on or accurately disposed on the second virtual extension line VL2 within an error range of a manufacturing process without being staggered. Therefore, in the vibration apparatus 200 according to an embodiment of the present disclosure, the vibration portion 211a of the first vibration generator 210 and the vibration portion 211a of the second vibration generator 230 may be displaced in the same direction, and thus, the displacement amount or the amplitude displacement of the vibration apparatus 200 may be maximized or increase. Accordingly, a displacement amount (or a bending force or a flexural force) or an amplitude displacement of the display panel 100 may increase (or maximized).

The first electrode portion 211b may be disposed at a first surface (or an upper surface) of the vibration portion 211a. For example, the first electrode portion 211b may be disposed at or coupled to a first surface of each of the plurality of first portions 211a1 and a first surface of each of the plurality of second portions 211a2 in common. The first electrode portion 211b may be electrically connected to the first surface of each of the plurality of first portions 211a1. For example, the first electrode portion 211b may be disposed at a whole first surface of the vibration portion 211a. The first electrode portion 211b may have a single-body electrode type. For example, the first electrode portion 211b may substantially have the same shape as the vibration portion 211a, but embodiments of the present disclosure are not limited thereto. The first electrode portion 211b according to an embodiment of the present disclosure may be formed of a transparent conductive material, a semitransparent conductive material, or an opaque conductive material, but embodiments of the present disclosure are not limited thereto.

The second electrode portion 211c may be disposed at a second surface (or a rear surface) opposite to or different from the first surface the vibration portion 211a. The second electrode portion 211c may be disposed at or coupled to a second surface of each of the plurality of first portions 211a1 and a second surface of each of the plurality of second portions 211a2 in common. The second electrode portion 211c may be electrically connected to the second surface of each of the plurality of first portions 211a1. For example, the second electrode portion 211c may be disposed at a whole second surface of the vibration portion 211a. The second electrode portion 211c may have a single-body electrode type. For example, the second electrode portion 211c may substantially have the same shape as the vibration portion 211a, but embodiments of the present disclosure are not limited thereto. The second electrode portion 211c according to an embodiment of the present disclosure may be formed of a transparent conductive material, a semitransparent conductive material, or an opaque conductive material, but embodiments of the present disclosure are not limited thereto.

The first electrode portion 211b may be covered by the first protection member 213 described above. The second electrode portion 211c may be covered by the second protection member 215 described above.

The vibration portion 211a of each of the first vibration generator 210 and the second vibration generator 230 may be polarized (or poling) by a certain voltage applied to the first electrode portion 211b and the second electrode portion 211c in a certain temperature atmosphere or a temperature atmosphere which is changed from a high temperature to a room temperature, but embodiments of the present disclosure are not limited thereto. For example, the vibration portion 211a of each of the first vibration generator 210 and the second vibration generator 230 may alternately and repeatedly contract and expand based on an inverse piezoelectric effect according to a vibration driving signal applied to the first electrode portion 211b and the second electrode portion 211c from the outside, and thus, may be vibrated. For example, the vibration portion 211a of each of the first vibration generator 210 and the second vibration generator 230 may vibrate based on a vertical-direction (or a thickness direction Z) vibration d33 and a horizontal-direction (or a planar direction) vibration d31 according to a vibration driving signal applied to the first electrode portion 211b and the second electrode portion 211c. The vibration portion 211a may increase the displacement of the vibration apparatus 200 by contraction and expansion in the horizontal-direction, thereby further improving the vibration of the vibration apparatus 200 or the display panel.

In FIGS. 10 to 12 and description relevant thereto, the vibration apparatus 200 according to another embodiment of the present disclosure has been described as including the first and second vibration generators 210 and 230, but embodiments of the present disclosure are not limited thereto. For example, the vibration apparatus 200 according to another embodiment of the present disclosure may include a plurality of (for example, three or more) vibration generators 210 and 230. In this case, in order to maximize or increase the displacement amount or the amplitude displacement of the vibration apparatus 200, the plurality of vibration generators 210 and 230 may have the same size and may overlap or stack. According to an embodiment of the present disclosure, a first portion 211a1 of a vibration generator 210 disposed on an upper layer (or a top layer) among the three or more vibration generators 210 and 230 and a first portion 211a1 of a vibration generator 230 disposed on a lower layer (or a bottom layer) among the three or more vibration generators 210 and 230 may substantially overlap or stack without being staggered. For example, the first portion 211a1 of the vibration generator 210 disposed on the upper layer among the three or more vibration generators 210 and 230 and the first portion 211a1 of the vibration generator 230 disposed on the lower layer among the three or more vibration generators 210 and 230 may substantially overlap or stack within an error range of a manufacturing process without being staggered. For example, the first portion 211a1 of the vibration generator 210 disposed on the upper layer among the three or more vibration generators 210 and 230 and the first portion 211a1 of the vibration generator 230 disposed on the lower layer among the three or more vibration generators 210 and 230 may be aligned on or disposed on a virtual extension line VL. For example, the first portion 211a1 of the vibration generator 210 disposed on the upper layer among the three or more vibration generators 210 and 230 and the first portion 211a1 of the vibration generator 230 disposed on the lower layer among the three or more vibration generators 210 and 230 may be accurately aligned on or accurately disposed on the virtual extension line VL. Also, a second portion 211a2 of the vibration generator 210 disposed on the upper layer among the three or more vibration generators 210 and 230 and a second portion 211a2 of the vibration generator 230 disposed on the lower layer among the three or more vibration generators 210 and 230 may substantially overlap or stack without being staggered. For example, the second portion 211a2 of the vibration generator 210 disposed on the upper layer among the three or more vibration generators 210 and 230 and the second portion 211a2 of the vibration generator 230 disposed on the lower layer among the three or more vibration generators 210 and 230 may substantially overlap or stack within the error range of the manufacturing process without being staggered. For example, the second portion 211a2 of the vibration generator 210 disposed on the upper layer among the three or more vibration generators 210 and 230 and the second portion 211a2 of the vibration generator 230 disposed on the lower layer among the three or more vibration generators 210 and 230 may be aligned on or disposed on the virtual extension line VL. For example, the second portion 211a2 of the vibration generator 210 disposed on the upper layer among the three or more vibration generators 210 and 230 and the second portion 211a2 of the vibration generator 230 disposed on the lower layer among the three or more vibration generators 210 and 230 may be accurately aligned on or accurately disposed on the virtual extension line VL.

Figure 13:
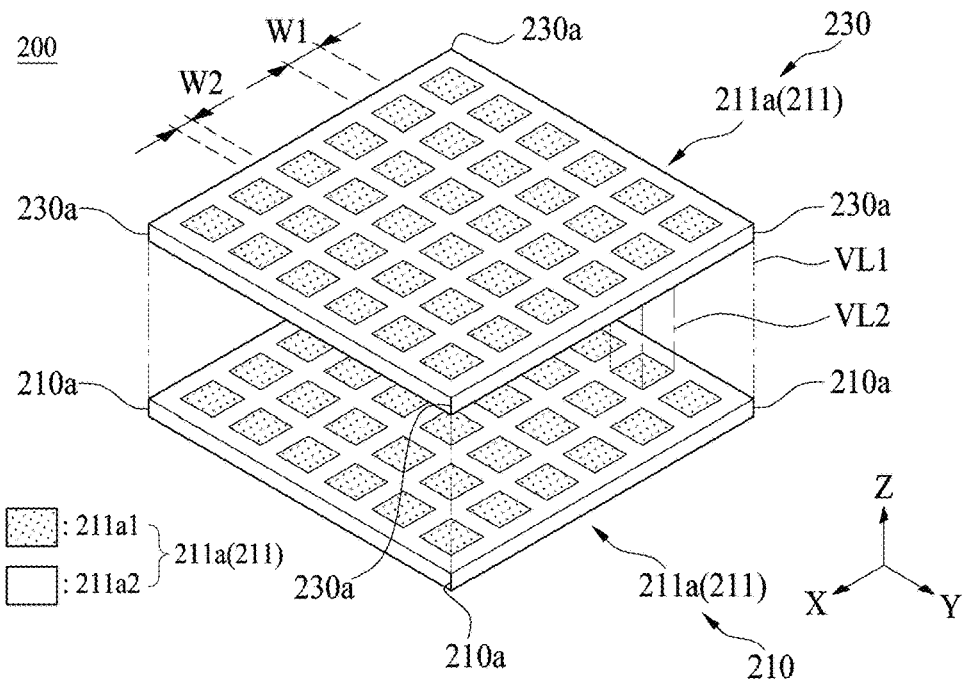
FIG. 13 illustrates a vibration apparatus according to another embodiment of the present disclosure.

FIG. 13 illustrates a vibration apparatus according to another embodiment of the present disclosure and illustrates an embodiment implemented by modifying the vibration portion described above with reference to FIGS. 10 to 12. Therefore, in the following description, repetitive descriptions of elements other than a vibration portion may be omitted or will be briefly given.

With reference to FIG. 13, in the vibration apparatus 200 according to another embodiment of the present disclosure, the vibration portion 211a of the vibration structure 211 included in each of the vibration generators 210 and 230 may include a plurality of first portions 211a1 and a second portion 211a2 disposed between the plurality of first portions 211a1. The plurality of first portions 211a1 may be disposed to be spaced apart from one another along the first direction X and the second direction Y.

Each of the plurality of first portions 211a1 may be disposed to be spaced apart from one another along each of the first direction X and the second direction Y. For example, each of the plurality of first portions 211a1 may have a hexahedral shape (or a six-sided object shape) having the same size and may be disposed in a lattice shape. Each of the plurality of first portions 211a1 may include a piezoelectric material which is be substantially the same as the vibration portion 211a described above with reference to FIGS. 3 and 4, and the first portion 211a1 described above with reference to FIGS. 10 to 12, thus, like reference numerals refer to like elements and their repetitive descriptions may be omitted.

The second portion 211a2 may be disposed between the plurality of first portions 211a1 along each of the first direction X and the second direction Y. The second portion 211a2 may be configured to fill a gap or a space between two adjacent first portions 211a1 or to surround each of the plurality of first portions 211a1, and thus, may be connected or attached to an adjacent first portion 211a1. According to an embodiment of the present disclosure, a width of a second portion 211a2 disposed between two first portions 211a1 adjacent to each other along the first direction X may be the same as or different from the first portion 211a1, and a width of a second portion 211a2 disposed between two first portions 211a1 adjacent to each other along the second direction Y may be the same as or different from the first portion 211al. For example, the second portion 211a2 may include an organic material which is be substantially the same as the second portion 211a2 described above with reference to FIGS. 10 to 12, and thus, like reference numerals refer to like elements and their repetitive descriptions may be omitted.

In FIG. 13 and description relevant thereto, the vibration apparatus 200 according to another embodiment of the present disclosure has been described as including the first and second vibration generators 210 and 230, but embodiments of the present disclosure are not limited thereto. For example, the vibration apparatus 200 according to another embodiment of the present disclosure may include a plurality of (for example, three or more) vibration generators 210 and 230. In this case, in order to maximize or increase the displacement amount or the amplitude displacement of the vibration apparatus 200, the plurality of vibration generators 210 and 230 may have the same size and may overlap or stack. According to an embodiment of the present disclosure, a first portion 211a1 of a vibration generator 210 disposed on an upper layer (or a top layer) among the three or more vibration generators 210 and 230 and a first portion 211a1 of a vibration generator 230 disposed on a lower layer (or a bottom layer) among the three or more vibration generators 210 and 230 may substantially overlap or stack without being staggered. For example, the first portion 211a1 of the vibration generator 210 disposed on the upper layer among the three or more vibration generators 210 and 230 and the first portion 211a1 of the vibration generator 230 disposed on the lower layer among the three or more vibration generators 210 and 230 may substantially overlap or stack within an error range of a manufacturing process without being staggered. Also, a second portion 211a2 of the vibration generator 210 disposed on the upper layer among the three or more vibration generators 210 and 230 and a second portion 211a2 of the vibration generator 230 disposed on the lower layer among the three or more vibration generators 210 and 230 may substantially overlap or stack without being staggered. For example, the second portion 211a2 of the vibration generator 210 disposed on the upper layer among the three or more vibration generators 210 and 230 and the second portion 211a2 of the vibration generator 230 disposed on the lower layer among the three or more vibration generators 210 and 230 may substantially overlap or stack within the error range of the manufacturing process without being staggered.

Therefore, the vibration portion 211a of each of the first vibration generator 210 and the second vibration generator 230 may include a 1-3 composite structure and thus may have a resonance frequency of 30 MHz or less, but embodiments of the present disclosure are not limited thereto. For example, the resonance frequency of the vibration portion 211a may vary based on one or more of a shape, a length, and a thickness.

Figure 14:
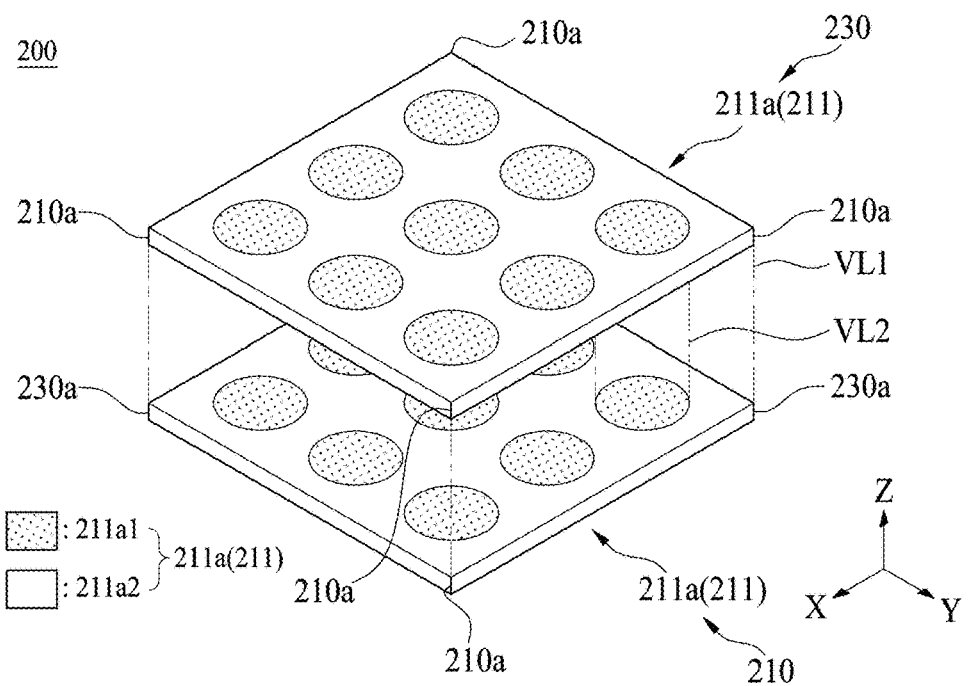
FIG. 14 illustrates a vibration apparatus according to another embodiment of the present disclosure.

FIG. 14 illustrates a vibration apparatus according to another embodiment of the present disclosure and illustrates an embodiment of the present disclosure where the vibration portion illustrated in FIGS. 10 to 12 is modified. Hereinafter, therefore, repetitive descriptions of elements other than the vibration portion may be omitted or will be briefly given.

With reference to FIG. 14, in the vibration apparatus 200 according to another embodiment of the present disclosure, the vibration portion 211a of the vibration structure 211 included in each of the vibration generators 210 and 230 may include a plurality of first portions 211al, which are spaced apart from one another along a first direction X and a second direction Y, and a second portion 211a2 disposed between the plurality of first portions 211a1.

Each of the plurality of first portions 211a1 according to an embodiment of the present disclosure may have a flat structure of a circular shape. For example, each of the plurality of first portions 211a1 may have a circular plate shape, but embodiments of the present disclosure are not limited thereto. For example, each of the plurality of first portions 211a1 may have a dot shape including an oval shape, a polygonal shape, or a donut shape. Each of the plurality of first portions 211a1 may include a piezoelectric material which is be substantially the same as the first portion 211a1 described above with reference to FIGS. 10 to 12, thus, like reference numerals refer to like elements and their repetitive descriptions may be omitted.

The second portion 211a2 may be disposed between the plurality of first portions 211a1 along each of the first direction X and the second direction Y. The second portion 211a2 may be configured to surround each of the plurality of first portions 211a1, and thus, may be connected to or attached on a side surface of each of the plurality of first portions 211a1. Each of the plurality of first portions 211a1 and the second portion 211a2 may be disposed (or arranged) in parallel on the same plane (or the same layer). The second portion 211a2 may include an organic material which is be substantially the same as the second portion 211a2 described above with reference to FIGS. 10 to 12, and thus, like reference numerals refer to like elements and their repetitive descriptions may be omitted.

In the vibration portion 211a of each of the vibration generators 210 and 230 according to another embodiment of the present disclosure, each of the plurality of first portions 211a1 may have a flat structure of a triangular shape instead of a flat structure of a circular shape. For example, each of the plurality of first portions 211a1 may have a triangular plate shape.

According to an embodiment of the present disclosure, four adjacent first portions 211a1 among the plurality of first portions 211a1 may be adjacent to one another to form a tetragonal or quadrilateral shape (or a square shape). Vertices of the four adjacent first portions 211a1 forming a tetragonal shape may be adjacent to one another in a center portion (or a central portion) of the tetragonal shape.

According to another embodiment of the present disclosure, six adjacent first portions 211a1 among the plurality of first portions 211a1 may be adjacent to one another to form a hexagonal shape (or a regularly hexagonal shape). Vertices of the six adjacent first portions 211a1 forming a hexagonal shape may be adjacent to one another in a center portion (or a central portion) of the hexagonal shape.

In FIG. 14 and description relevant thereto, the vibration apparatus 200 according to another embodiment of the present disclosure has been described as including the first and second vibration generators 210 and 230, but embodiments of the present disclosure are not limited thereto. For example, the vibration apparatus 200 according to another embodiment of the present disclosure may include a plurality of (for example, three or more) vibration generators 210 and 230. In this case, in order to maximize or increase the displacement amount or the amplitude displacement of the vibration apparatus 200, the plurality of vibration generators 210 and 230 may have the same size and may overlap or stack. According to an embodiment of the present disclosure, a first portion 211a1 of a vibration generator 210 disposed on an upper layer among the three or more vibration generators 210 and 230 and a first portion 211a1 of a vibration generator 230 disposed on a lower layer among the three or more vibration generators 210 and 230 may substantially overlap or stack without being staggered. For example, the first portion 211a1 of the vibration generator 210 disposed on the upper layer among the three or more vibration generators 210 and 230 and the first portion 211a1 of the vibration generator 230 disposed on the lower layer among the three or more vibration generators 210 and 230 may substantially overlap or stack within an error range of a manufacturing process without being staggered. Also, a second portion 211a2 of the vibration generator 210 disposed on the upper layer among the three or more vibration generators 210 and 230 and a second portion 211a2 of the vibration generator 230 disposed on the lower layer among the three or more vibration generators 210 and 230 may substantially overlap or stack without being staggered. For example, the second portion 211a2 of the vibration generator 210 disposed on the upper layer among the three or more vibration generators 210 and 230 and the second portion 211a2 of the vibration generator 230 disposed on the lower layer among the three or more vibration generators 210 and 230 may substantially overlap or stack within the error range of the manufacturing process without being staggered.

Therefore, the vibration portion 211a of each of the first vibration generator 210 and the second vibration generator 230 may include a 1-3 composite and may be implemented as a circular vibration source (or vibrator), and thus, may be enhanced in vibration characteristic or sound output characteristic and may have a resonance frequency of 30 MHz or less, but embodiments of the present disclosure are not limited thereto. For example, the resonance frequency of the vibration portion 211a may vary based on one or more of a shape, a length, and a thickness.

Figure 15:
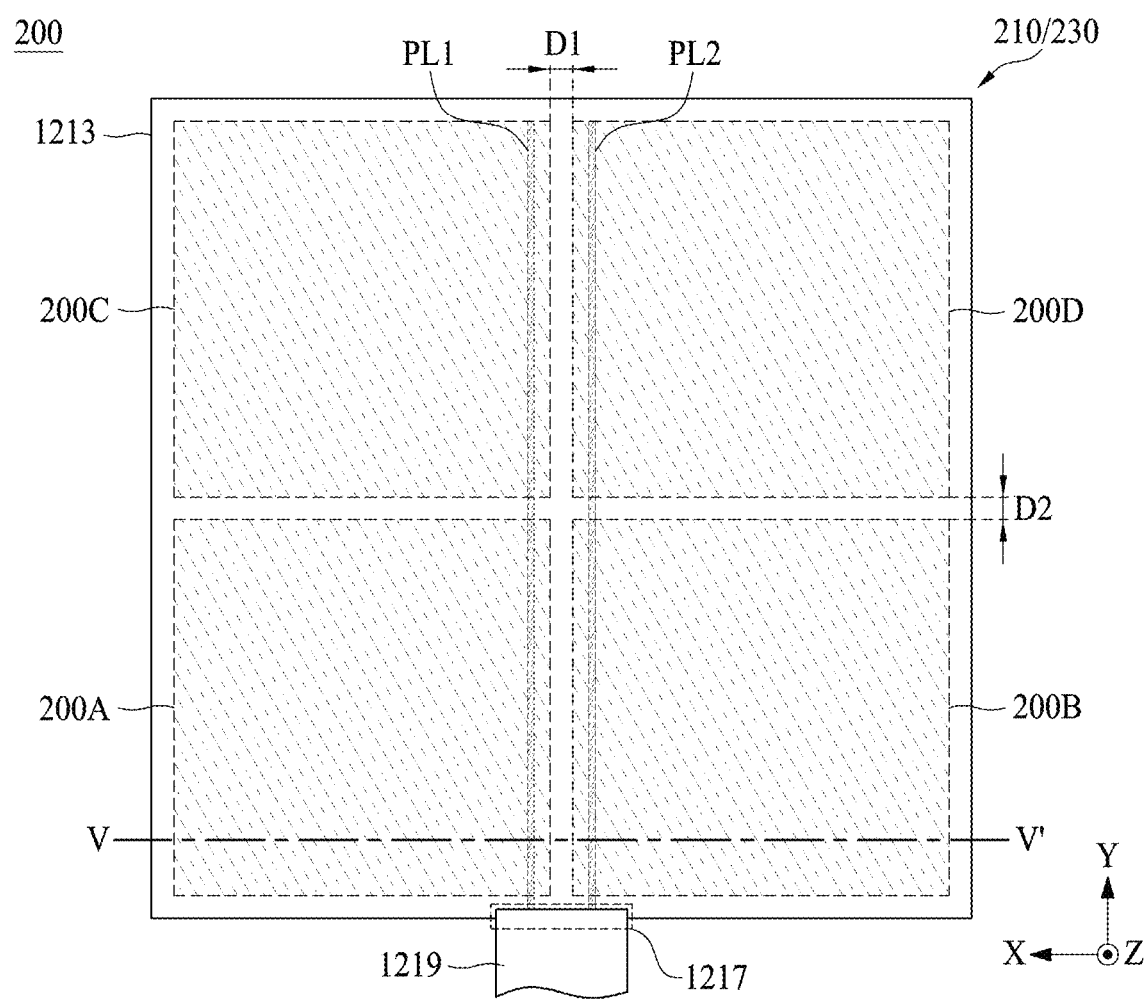
FIG. 15 illustrates a vibration apparatus according to another embodiment of the present disclosure.
Figure 16:
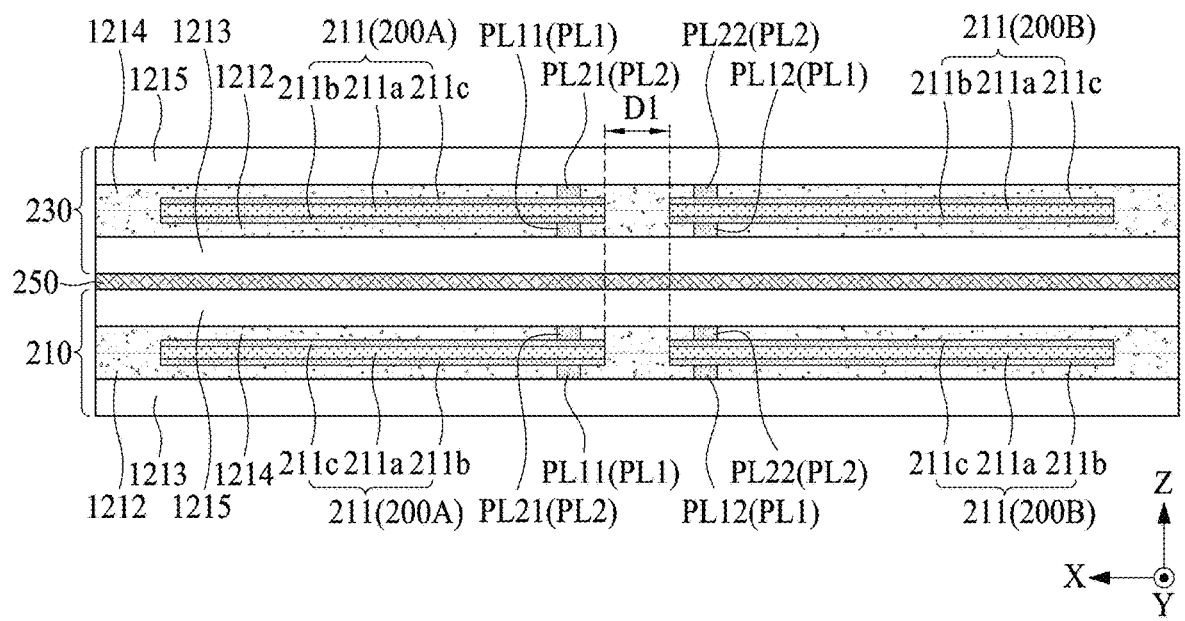
FIG. 16 is a cross-sectional view taken along line V-V' illustrated in FIG. 15.

FIG. 15 illustrates a vibration apparatus according to another embodiment of the present disclosure. FIG. 16 is a cross-sectional view taken along line V-V' illustrated in FIG. 15 and illustrates an embodiment of the present disclosure where the vibration generator illustrated in FIGS. 10 to 12 is modified.

With reference to FIGS. 15 and 16, in the vibration apparatus according to another embodiment of the present disclosure, each of the first vibration generator 210 and the second vibration generator 230 may include at least one or more vibration generating portions 200A to 200D or a plurality of vibration generating portions 200A to 200D. FIGS. 15 and 16 illustrate an example including four vibration generating portions, but each of the first vibration generator 210 and the second vibration generator 230 according to an embodiment of the present disclosure may be configured to include two or more vibration generating portions, and embodiments of the present disclosure are not limited thereto.

The plurality of vibration generating portions 200A to 200D may be electrically separated and disposed while being spaced apart from each other along each of a first direction X and a second direction Y.

Each of the plurality of vibration generating portions 200A to 200D may alternately and/or repeatedly contract and expand based on a piezoelectric effect to vibrate. Each of the plurality of vibration generating portions 200A to 200D may be arranged or tiled at a certain interval. Therefore, each of the first vibration generator 210 and the second vibration generator 230 in which the plurality of vibration generating portions 200A to 200D are tiled may be referred to as a vibration array, a vibration array portion, a vibration generating array portion, a vibration array structure, a tiling vibration array, a tiling vibration array module, or a tiling vibration film, but embodiments of the present disclosure are not limited thereto.

Each of the plurality of vibration generating portions 200A to 200D according to an embodiment of the present disclosure may have a tetragonal shape. For example, each of the plurality of vibration generating portions 200A to 200D may have a tetragonal shape having a width of about 5 cm or more. For example, each of the plurality of vibration generating portions 200A to 200D may have a square shape having a size of 5 cm×5 cm or more.

The plurality of vibration generating portions 200A to 200D may be arranged or tiled at a certain interval (or distance), and thus, may be implemented as one vibration apparatus (or a single vibration apparatus or an one vibration apparatus) which is driven as one complete single body without being independently driven. According to an embodiment of the present disclosure, with respect to the first direction X, a first separation distance D1 between the plurality of vibration generating portions 200A to 200D may be 0.1 mm or more and less than 3 cm, but embodiments of the present disclosure are not limited thereto. Also, with respect to the second direction Y, a second separation distance D2 between the plurality of vibration generating portions 200A to 200D may be 0.1 mm or more and less than 3 cm, but embodiments of the present disclosure are not limited thereto. For example, the first separation distance D1 may be the same as the second separation distance D2. For example, the first separation distance D1 may be the same as the second separation distance D2 within a process error range.

According to an embodiment of the present disclosure, the plurality of vibration generating portions 200A to 200D may be arranged or tiled to have the separation distances (or intervals) D1 and D2 of 0.1 mm or more and less than 3 cm, and thus, may be driven as one vibration apparatus, thereby increasing a reproduction band and a sound pressure level characteristic of a sound which is generated based on a single vibration of the plurality of vibration generating portions 200A to 200D. For example, the plurality of vibration generating portions 200A to 200D may be arranged at an interval of 0.1 mm or more and less than 5 mm, in order to increase a reproduction band of a sound generated based on a single vibration of the plurality of vibration generating portions 200A to 200D and to increase a sound of a low-pitched sound band (for example, a sound pressure level characteristic in 500 Hz or less).

According to an embodiment of the present disclosure, in a case where the plurality of vibration generating portions 200A to 200D are arranged at the intervals (or distances) D1 and D2 of less than 0.1 mm or without the intervals (or distances) D1 and D2, the reliability of the vibration generating portions 200A to 200D or each of the first vibration generator 210 and the second vibration generator 230 may be reduced due to damage or a crack caused by a physical contact therebetween which occurs when each of the vibration generating portions 200A to 200D vibrates.

According to an embodiment of the present disclosure, in a case where the plurality of vibration generating portions 200A to 200D are arranged at the intervals (or distances) D1 and D2 of 3 cm or more, the plurality of vibration generating portions 200A to 200D may not be driven as one vibration apparatus due to an independent vibration of each of the plurality of vibration generating portions 200A to 200D. Therefore, a reproduction band and a sound pressure level characteristic of a sound which is generated based on vibrations of the plurality of vibration generating portions 200A to 200D may be reduced. For example, in a case where the plurality of vibration generating portions 200A to 200D are arranged at the intervals (or distances) D1 and D2 of 3 cm or more, a sound characteristic and a sound pressure level characteristic of the low-pitched sound band (for example, in 500 Hz or less) may each be reduced.

According to an embodiment of the present disclosure, in a case where the plurality of vibration generating portions 200A to 200D are arranged at an interval of 5 mm, each of the plurality of vibration generating portions 200A to 200D may not be perfectly driven as one vibration apparatus, and thus, a sound characteristic and a sound pressure level characteristic of the low-pitched sound band (for example, in 200 Hz or less) may each be reduced.

According to another embodiment of the present disclosure, in a case where the plurality of vibration generating portions 200A to 200D are arranged at an interval of 1 mm, each of the plurality of vibration generating portions 200A to 200D may be driven as one vibration apparatus, and thus, a reproduction band of a sound may increase and a sound of the low-pitched sound band (for example, a sound pressure level characteristic in 500 Hz or less) may increase. For example, in a case where the plurality of vibration generating portions 200A to 200D are arranged at an interval of 1 mm, each of the first vibration generator 210 and the second vibration generator 230 may be implemented as a large-area vibrator which is enlarged based on optimization of a separation distance between the plurality of vibration generating portions 200A to 200D. Therefore, each of the first vibration generator 210 and the second vibration generator 230 may be driven as a large-area vibrator based on a single vibration of the plurality of vibration generating portions 200A to 200D, and thus, a sound characteristic and a sound pressure level characteristic may each increase in the low-pitched sound band and a reproduction band of a sound generated based on a large-area vibration of each of the first vibration generator 210 and the second vibration generator 230.

Therefore, in order to implement a single vibration (or one vibration apparatus) of the plurality of vibration generating portions 200A to 200D, a separation distance between the plurality of vibration generating portions 200A to 200D may be adjusted to 0.1 mm or more and less than 3 cm. Also, in order to implement a single vibration (or one vibration apparatus) of the plurality of vibration generating portions 200A to 200D and to increase a sound pressure level characteristic of a sound of the low-pitched sound band, the separation distance between the plurality of vibration generating portions 200A to 200D may be adjusted to 0.1 mm or more and less than 5 mm.

Each of the first vibration generator 210 and the second vibration generator 230 according to an embodiment of the present disclosure may include first to fourth vibration generating portions 200A to 200D which are electrically disconnected from one another and are disposed spaced apart from one another in each of the first direction X and the second direction Y. For example, the first to fourth vibration generating portions 200A to 200D may be arranged or tiled in 2×2 form.

According to an embodiment of the present disclosure, the first and second vibration generating portions 200A and 200B may be spaced apart from each other in the first direction X. The third and fourth vibration generating portions 200C and 200D may be spaced apart from each other in the first direction X and may be spaced apart from each of the first and second vibration generating portions 200A and 200B in the second direction Y. The first and third vibration generating portions 200A and 200C may be spaced apart from each other in the second direction Y to face each other. The second and fourth vibration generating portions 200B and 200D may be spaced apart from each other in the second direction Y to face each other.

Each of the first to fourth vibration generating portions 200A to 200D according to an embodiment of the present disclosure may include a vibration portion 211a, a first electrode portion 211b, and a second electrode portion 211c.

The vibration portion 211a may include a ceramic-based material capable of realizing a relatively high vibration. For example, the vibration portion 211a may include a 1-3 composite structure having a piezoelectric characteristic of a 1-3 vibration mode or a 2-2 composite structure having a piezoelectric characteristic of a 2-2 vibration mode. For example, the vibration portion 211a may include a piezoelectric ceramic similar to the vibration portion 211a described above with reference to FIG. 3, or may include the first portions 211a1 and the second portion 211a2 similar to the vibration portion 211a described above with reference to any one of FIGS. 10 to 14, and thus, like reference numerals refer to like elements and their repetitive descriptions may be omitted.

According to an embodiment of the present disclosure, the vibration portion 211a may be formed of a transparent, semitransparent, or opaque piezoelectric and the vibration portion 211a may be transparent, semitransparent, or opaque.

The first electrode portion 211b may be disposed at a first surface of the vibration portion 211a and may be electrically connected to the first surface of the vibration portion 211a. For example, the first electrode portion 211b may be substantially the same as the first electrode portion 211b described above with reference to any one of FIGS. 2 to 14, and thus, like reference numerals refer to like elements and their repetitive descriptions may be omitted.

The second electrode portion 211c may be disposed at a second surface of the vibration portion 211a and may be electrically connected to the second surface of the vibration portion 211a. For example, the second electrode portion 211c may be substantially the same as the second electrode portion 211c described above with reference to any one of FIGS. 2 to 14, and thus, like reference numerals refer to like elements and their repetitive descriptions may be omitted.

Each of the first vibration generator 210 and the second vibration generator 230 according to another embodiment of the present disclosure may further include a first protection member 1213 and a second protection member 1215.

The first protection member 1213 may be disposed on the first surface of each of the first vibration generator 210 and the second vibration generator 230. For example, the first protection member 1213 may cover the first electrode portion 211b disposed on a first surface of each of the plurality of vibration generating portions 200A to 200D. Thus, the first protection member 1213 may be connected to the first surface of each of the plurality of vibration generating portions 200A to 200D in common or may support the first surface of each of the plurality of vibration generating portions 200A to 200D in common. Accordingly, the first protection member 1213 may protect the first surface or the first electrode portion 211b of each of the plurality of vibration generating portions 200A to 200D.

The first protection member 1213 according to an embodiment of the present disclosure may be disposed at the first surface of each of the plurality of vibration generating portions 200A to 200D by a first adhesive layer 1212. For example, the first protection member 1213 may be disposed at the first surface of each of the plurality of vibration generating portions 200A to 200D by a film laminating process using the first adhesive layer 1212. For example, the first protection member 1213 may be directly disposed at the first surface of each of the plurality of vibration generating portions 200A to 200D by a film laminating process using the first adhesive layer 1212. Accordingly, the plurality of vibration generating portions 200A to 200D may be integrated (or disposed) or tiled with the first protection member 1213 to have the certain intervals D1 and D2.

The second protection member 1215 may be disposed on the second surface of each of the first vibration generator 210 and the second vibration generator 230. For example, the second protection member 1215 may cover the second electrode portion 211c disposed on a second surface of each of the plurality of vibration generating portions 200A to 200D, and thus, may be connected to the second surface of each of the plurality of vibration generating portions 200A to 200D in common or may support the second surface of each of the plurality of vibration generating portions 200A to 200D in common. Accordingly, the second protection member 1215 may protect the second surface or the second electrode portion 211c of each of the plurality of vibration generating portions 200A to 200D.

The second protection member 1215 according to an embodiment of the present disclosure may be disposed at the second surface of each of the plurality of vibration generating portions 200A to 200D by a second adhesive layer 1214. For example, the second protection member 1215 may be disposed at the second surface of each of the plurality of vibration generating portions 200A to 200D by a film laminating process using the second adhesive layer 1214. For example, the second protection member 1215 may be directly disposed at the second surface of each of the plurality of vibration generating portions 200A to 200D by a film laminating process using the second adhesive layer 1214. Accordingly, the plurality of vibration generating portions 200A to 200D may be integrated (or disposed) or tiled with the second protection member 1215 to have the certain intervals D1 and D2.

Each of the first protection member 1213 and the second protection member 1215 according to an embodiment of the present disclosure may be formed of a plastic material, a fiber material, or wood material, but embodiments of the present disclosure are not limited thereto. Any one of the first protection member 1213 and the second protection member 1215 may be attached on or coupled to the display panel 100 by a connection member (or a second connection member).

The first adhesive layer 1212 may be disposed between the first surface of each of the plurality of vibration generating portions 200A to 200D and between the plurality of vibration generating portions 200A to 200D. For example, the first adhesive layer 1212 may be formed at a rear surface (or an inner surface) of the first protection member 1213 facing the first surface of each of the first vibration generator 210 and the second vibration generator 230. For example, the first adhesive layer 1212 may be disposed at the first surface of each of the plurality of vibration generating portions 200A to 200D, and filled between the plurality of vibration generating portions 200A to 200D.

The second adhesive layer 1214 may be disposed between the second surface of each of the plurality of vibration generating portions 200A to 200D and between the plurality of vibration generating portions 200A to 200D. For example, the second adhesive layer 1214 may be formed at a front surface (or an inner surface) of the second protection member 1215 facing the second surface of each of the first vibration generator 210 and the second vibration generator 230. For example, the second adhesive layer 1214 may be disposed at the second surface of each of the plurality of vibration generating portions 200A to 200D, and filled between the plurality of vibration generating portions 200A to 200D.

The first and second adhesive layers 1212 and 1214 may be connected to each other between the plurality of vibration generating portions 200A to 200D. Therefore, each of the plurality of vibration generating portions 200A to 200D may be surrounded by the first and second adhesive layers 1212 and 1214. For example, the first and second adhesive layers 1212 and 1214 may entirely surround the whole plurality of vibration generating portions 200A to 200D. For example, the first and second adhesive layers 1212 and 1214 may be referred to as a cover member, but embodiments of the present disclosure are not limited thereto. When each of the first and second adhesive layers 1212 and 1214 is a cover member, the first protection member 1213 may be disposed at a first surface of the cover member, and the second protection member 1215 may be disposed at a second surface of the cover member.

Each of the first and second adhesive layers 1212 and 1214 according to an embodiment of the present disclosure may include an electric insulating material which has adhesiveness and may include a material capable of compression and decompression. For example, each of the first and second adhesive layers 1212 and 1214 may include an epoxy resin, an acryl resin, a silicone resin, or a urethane resin, but embodiments of the present disclosure are not limited thereto. For example, each of the first and second adhesive layers 1212 and 1214 may be configured to be transparent, semitransparent, or opaque.

Each of the first vibration generator 210 and the second vibration generator 230 according to another embodiment of the present disclosure may further include a first power supply line PL1 disposed at the first protection member 1213, a second power supply line PL2 disposed at the second protection member 1215, and a pad part 1217 electrically connected to the first power supply line PL1 and the second power supply line PL2.

The first power supply line PL1 may be disposed at a rear surface of the first protection member 1213 facing the first surface of each of the first vibration generator 210 and the second vibration generator 230. The first power supply line PL1 may be electrically connected to the first electrode portion 211*b* of each of the plurality of vibration generating portions 200A to 200D. For example, the first power supply line PL1 may be directly and electrically connected to the first electrode portion 211*b* of each of the plurality of vibration generating portions 200A to 200D. For example, the first power supply line PL1 may be electrically connected to the first electrode portion 211*b* of each of the plurality of vibration generating portions 200A to 200D by an anisotropic conductive film. As another embodiment of the present disclosure, the first power supply line PL1 may be electrically connected to the first electrode portion 211*b* of each of the plurality of vibration generating portions 200A to 200D by a conductive material (or particle) included in the first adhesive layer 1212.

The first power supply line PL1 according to an embodiment of the present disclosure may include a $1\text{-}1^{th}$ and a $1\text{-}2^{th}$ power lines PL11 and PL12 disposed along a second direction Y. For example, the $1\text{-}1^{th}$ power line PL11 may be electrically connected to the first electrode portion 211*b* of each of the first and third vibration generating portions 200A and 200C (or a first group or a first array group) among the plurality of vibration generating portions 200A to 200D. For example, the first and third vibration generating portions 200A and 200C may be arranged at a first column parallel to the second direction Y among the plurality of vibration generating portions 200A to 200D. The $1\text{-}2^{th}$ power line PL12 may be electrically connected to the first electrode portion 211*b* of each of the second and fourth vibration generating portions 200B and 200D (or a second group or a second array group) among the plurality of vibration generating portions 200A to 200D. For example, the second and fourth vibration generating portions 200B and 200D may be arranged at a second column parallel to the second direction Y among the plurality of vibration generating portions 200A to 200D.

The second power supply line PL2 may be disposed at a front surface of the second protection member 1215 facing the second surface of each of the first vibration generator 210 and the second vibration generator 230. The second power supply line PL2 may be electrically connected to the second electrode portion 211*c* of each of the plurality of vibration generating portions 200A to 200D. For example, the second power supply line PL2 may be directly and electrically connected to the second electrode portion 211*c* of each of the plurality of vibration generating portions 200A to 200D. For example, the second power supply line PL2 may be electrically connected to the second electrode portion 211*c* of each of the plurality of vibration generating portions 200A to 200D by an anisotropic conductive film. As another embodiment of the present disclosure, the second power supply line PL2 may be electrically connected to the second electrode portion 211*c* of each of the plurality of vibration generating portions 200A to 200D by a conductive material (or particle) included in the second adhesive layer 1214.

The second power supply line PL2 according to an embodiment of the present disclosure may include a $2\text{-}1^{th}$ and a $2\text{-}2^{th}$ power lines PL21 and PL22 disposed along a second direction Y. For example, the $2\text{-}1^{th}$ power line PL21 may be electrically connected to the second electrode portion 211*c* of each of the first and third vibration generating portions 200A and 200C (or a first group or a first array group) among the plurality of vibration generating portions 200A to 200D. For example, the first and third vibration generating portions 200A and 200C may be arranged at a first column parallel to the second direction Y among the plurality of vibration generating portions 200A to 200D. The $2\text{-}2^{th}$ power line PL22 may be electrically connected to the second electrode portion 211*c* of each of the second and fourth vibration generating portions 200B and 200D (or a second group or a second array group) among the plurality of vibration generating portions 200A to 200D. For example, the second and fourth vibration generating portions 200B and 200D may be arranged at a second column parallel to the second direction Y among the plurality of vibration generating portions 200A to 200D.

The pad part 1217 may be disposed at each of the first vibration generator 210 and the second vibration generator 230 so as to be electrically connected to one portion (or one end) of at least one or more among the first power supply line PL1 and the second power supply line PL2. The pad part 1217 according to an embodiment of the present disclosure may include a first pad electrode electrically connected to one portion of the first power supply line PL1 and a second pad electrode electrically connected to one portion of the second power supply line PL2.

The first pad electrode may be connected to one portion (or one end) of each of the $1\text{-}1^{th}$ and $1\text{-}2^{th}$ power lines PL11 and PL12 of the first power supply line PL1 in common. For example, the one portion (or one end) of each of the $1\text{-}1^{th}$ and $1\text{-}2^{th}$ power lines PL11 and PL12 may branch from the first pad electrode.

The second pad electrode may be connected to one portion (or one end) of each of the $2\text{-}1^{th}$ and $2\text{-}2^{th}$ power lines PL21 and PL22 of the second power supply line PL2 in common. For example, the one portion (or one end) of each of the $2\text{-}1^{th}$ and $2\text{-}2^{th}$ power lines PL21 and PL22 may branch from the second pad electrode.

According to an embodiment of the present disclosure, each of the first power supply line PL1, the second power supply line PL2, and the pad part 1217 may be configured to be a transparent conductive material, a semitransparent conductive material, or an opaque conductive material so as to be transparent, translucent, or opaque.

Each of the first vibration generator 210 and the second vibration generator 230 according to another embodiment of the present disclosure may further include a flexible cable 1219.

The flexible cable 1219 may be electrically connected to the pad part 1217 disposed at the each of the first vibration generator 210 and the second vibration generator 230 and may supply the each of the first vibration generator 210 and the second vibration generator 230 with one or more vibration driving signals (or a sound signal) provided from a vibration driving circuit. The flexible cable 1219 according to an embodiment of the present disclosure may include a first terminal electrically connected to the first pad electrode of the pad part 1217 and a second terminal electrically connected to the second pad electrode of the pad part 1217.

For example, the flexible cable 1219 may be a flexible printed circuit cable or a flexible flat cable, but embodiments of the present disclosure are not limited thereto.

Therefore, the vibration apparatus 200 according to another embodiment of the present disclosure may include the plurality of vibration generating portions 200A to 200D which are implemented as a single vibrator without being independently driven, and thus, may be driven as a large-area vibrator based on a single-body vibration of the plurality of vibration generating portions 200A to 200D. For example, the plurality of vibration generating portions 200A to 200D may be a single vibrator which is arranged (or tiled) at a certain interval D1 and D2. Accordingly, the vibration apparatus 200 may vibrate a large area of display panel or vibrate by itself in a large-area, thereby increasing or enhancing a sound characteristic and a sound pressure level characteristic in the low-pitched sound band and a reproduction band of a sound output from the display panel.

Figure 17:
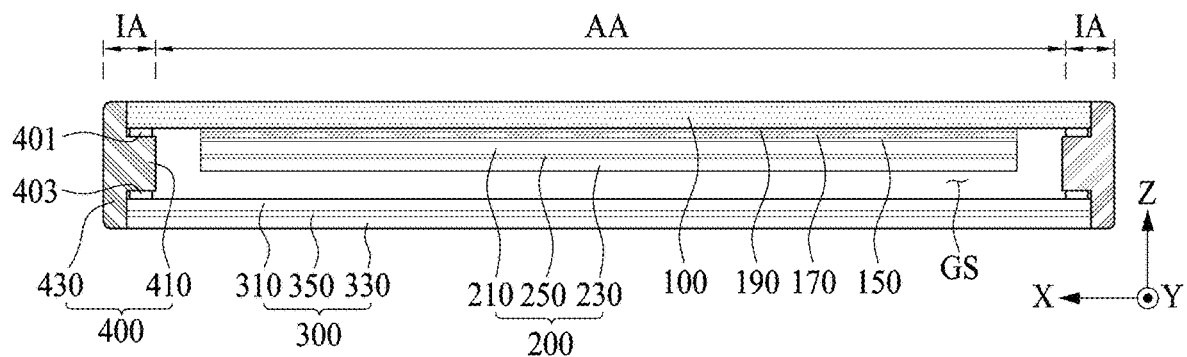
FIG. 17 illustrates an apparatus according to another embodiment of the present disclosure.

FIG. 17 illustrates an apparatus according to another embodiment of the present disclosure and is a cross-sectional view taken along line I-I' illustrated in FIG. 1. FIG. 17 illustrates an embodiment of the present disclosure where a plate is further configured in the apparatus illustrated in FIGS. 2 to 16.

With reference to FIG. 17, the apparatus according to another embodiment of the present disclosure may include a display panel 100 to display an image, and a vibration apparatus 200 to vibrate the display panel 100 on a rear surface (or a backside surface) of the display panel 100. The apparatus according to another embodiment of the present disclosure may further include a plate 170 which is disposed between the display panel 100 and the vibration apparatus 200.

Each of the display panel 100 and the vibration apparatus 200 may be substantially the same as each of the display panel 100 and the vibration apparatus 200 described above with reference to FIGS. 2 to 16, and thus, their repetitive descriptions may be omitted or will be briefly given.

The plate 170 may have the same shape and size as the rear surface of the display panel 100, or may have the same shape and size as the vibration apparatus 200. As another embodiment of the present disclosure, the plate 170 may have a size different from the display panel 100. For example, the plate 170 may be smaller than the size of the display panel 100. As another embodiment of the present disclosure, the plate 170 may have a size different from that of the vibration apparatus 200. For example, the plate 170 may be greater or smaller than the size of the vibration apparatus 200. The vibration apparatus 200 may be the same as or smaller than the size of the display panel 100.

The plate 170 according to an embodiment of the present disclosure may include a metal material. For example, the plate 170 may include one or more materials of stainless steel, aluminum (Al), a magnesium (Mg), a magnesium (Mg) alloy, a magnesium-lithium (Mg—Li) alloy, and an Al alloy, but embodiments of the present disclosure are not limited thereto.

The plate 170 may include a plurality of opening portions. The plurality of opening portions may be configured to have a predetermined size and a predetermined interval (or distance). For example, the plurality of opening portions may be provided along a first direction X and a second direction Y so as to have a predetermined size and a predetermined interval. Due to the plurality of opening portions, a sound wave (or a sound pressure) based on a vibration of the vibration apparatus 200 may not be dispersed by the plate 170, and may concentrate on the display panel 100. Thus, the loss of a vibration caused by the plate 170 may be minimized, thereby increasing a sound pressure characteristic of a sound generated based on a vibration of the display panel 100. For example, the plate 170 including the plurality of openings may have a mesh shape. For example, the plate 170 including the plurality of openings may be a mesh plate.

According to an embodiment of the present disclosure, the plate 170 may reinforce a mass of the vibration apparatus 200 which is disposed at or hung from the rear surface of the display panel 100. Thus, the plate 170 may decrease a resonance frequency of the vibration apparatus 200 based on an increase in mass of the vibration apparatus 200. Therefore, the plate 170 may increase a sound characteristic and a sound pressure level characteristic of the low-pitched sound band generated based on a vibration of the vibration apparatus 200 and may enhance the flatness of a sound pressure level characteristic. For example, the flatness of a sound pressure level characteristic may be a magnitude of a deviation between a highest sound pressure level and a lowest sound pressure level. For example, the plate 170 may be referred to as a weight member, a mass member, a sound planarization member, or the like, but embodiments of the present disclosure are not limited thereto.

According to an embodiment of the present disclosure, a displacement amount (or a bending force or a flexural force) or an amplitude displacement (or a vibration width) of the display panel 100 with the plate 170 disposed therein may decrease as a thickness of the plate 170 increases, based on the stiffness of the plate 170. Accordingly, a sound pressure level characteristic and a sound characteristic of a low-pitched sound band of a sound generated based on a displacement (or a vibration) of the display panel 100 may be decreased.

Figure 18:
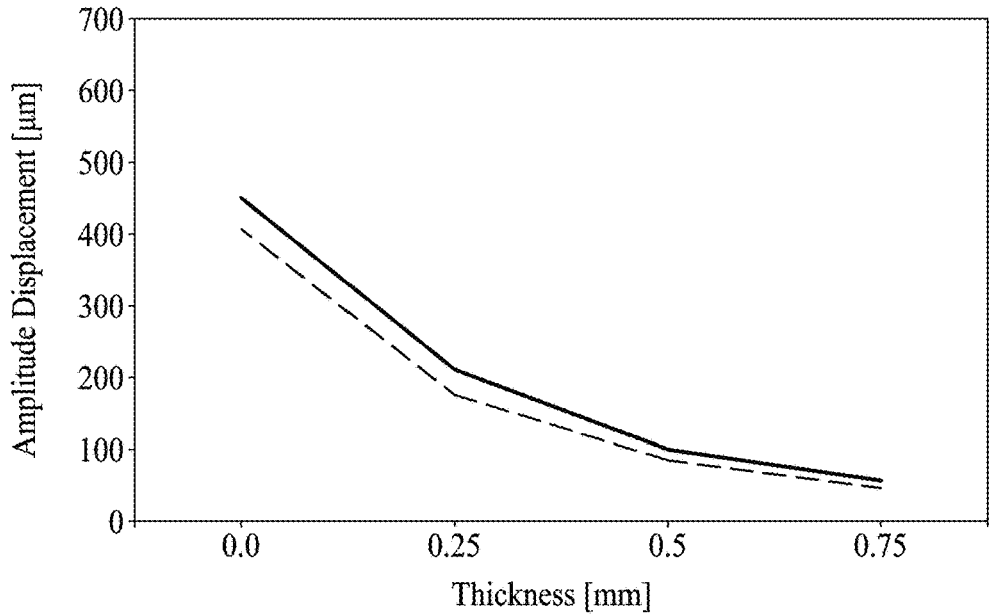
FIG. 18 illustrates an amplitude displacement of the display panel according to a thickness of the plate illustrated in FIG. 17.

According to an embodiment of the present disclosure, the displacement amount of the display panel 100 may be affected by a contact area between the vibration apparatus 200 and the plate 170, in addition to a thickness of the plate 170. For example, as illustrated in FIG. 18, when the same force is applied based on the thickness of the plate 170, the displacement amount of the display panel 100 may increase as the contact area between the vibration apparatus 200 and the plate 170 or an attachment area of the vibration apparatus 200 is progressively reduced. For example, when the thickness of the plate 170 is 0.25 mm, an amplitude displacement (or the displacement amount) of the display panel 100 based on a displacement of the vibration apparatus 200 (a thick solid line of FIG. 18) having a first size may be greater than the displacement amount of the display panel 100 based on a displacement of the vibration apparatus 200 (a dotted line of FIG. 18) having a second size which is greater than the first size. Therefore, the vibration apparatus 200 according to an embodiment of the present disclosure may include a plurality of vibration generators 210 and 230 which have the first size and overlap with each other, thereby minimizing a reduction in the displacement amount of the display panel 100 caused by the thickness of the plate 170. Also, the vibration apparatus 200 according to an embodiment of the present disclosure may include the plurality of vibration generators 210 and 230 which have the first size and overlap with each other, and thus, the displacement amount of the display panel 100 may be increased or maximized, thereby increasing or enhancing a sound pressure level characteristic and a sound characteristic of a low-pitched sound band of a sound generated based on the displacement of the display panel 100. Accordingly, in the apparatus according to another embodiment of the present disclosure, the vibration apparatus 200 may increase or maximize the displacement amount of the display panel 100 with the plate 170 disposed therein, based on a stack structure of the vibration generators 210 and 230 which overlap. The plate 170 may have a thickness which enables heat of the display panel 100 to be smoothly dissipated. For example, the plate 170 may have a thickness of 0.1 mm to 0.75 mm, but embodiments of the present disclosure are not limited thereto.

The plate 170 according to an embodiment of the present disclosure may be coupled or connected to a rear surface of the display panel 100 by a plate connection member (or a fourth connection member) 190.

The plate connection member 190 may include a material including an adhesive layer which is good in adhesive force or attaching force with respect to the rear surface of the display panel 100 and the vibration apparatus 200, respectively. For example, the plate connection member 190 may include a foam pad, a double-sided tape, or an adhesive, but embodiments of the present disclosure are not limited thereto. For example, the adhesive layer of the plate connection member 190 may include epoxy, acryl, silicone, or urethane, but embodiments of the present disclosure are not limited thereto. For example, the adhesive layer of the plate connection member 190 may be the same as the adhesive layer of the connection member 150, but embodiments of the present disclosure are not limited thereto. For example, the adhesive layer of the plate connection member 190 may include an acrylic-based material which is relatively better in adhesive force and hardness than urethane so that the vibration of the vibrating apparatus 200 may be transmitted to the display panel 100 well. For example, the adhesive layer of the plate connection member 190 may differ from the adhesive layer of the connection member 150.

The vibration apparatus 200 may be connected or coupled to a rear surface of the plate 170 by the connection member 150 described above, and thus, may be supported by or hung at the rear surface of the plate 170.

The plate 170 according to an embodiment of the present disclosure may be connected or coupled to a front surface of the vibration apparatus 200 by the connection member 150 described above. For example, the plate 170 may be connected or coupled to an uppermost vibration generator of the plurality of vibration generators 210 and 230 of the vibration apparatus 200 by the connection member 150. For example, when the vibration apparatus 200 include first and second vibration generators 210 and 230, the plate 170 may be connected or coupled to a first surface of the second vibration generator 230 or a second surface of the first vibration generator 210 by the connection member 150. The plate 170 according to an embodiment of the present disclosure may be integrated into the vibration apparatus 200, or may be provided as an element of the vibration apparatus 200. For example, the plate 170 and the vibration apparatus 200 may be configured as one structure or one component (or module), which is provided as one body. Accordingly, when the plate 170 is disposed between the rear surface of the display panel 100 and the vibration apparatus 200, an assembly process between the display panel 100 and the vibration apparatus 200 may be easily performed based on component integration (or modularization) between the plate 170 and the vibration apparatus 200.

In a case where the plate 170 and the vibration apparatus 200 are configured as one structure or one component (or module) which is provided as one body, a vibration object may be used as a vibration plate, and thus, a sound and/or a haptic feedback may be implemented based on a vibration of the vibration object. For example, the vibration object may be one or more among a non-display panel, wood, plastic, glass, cloth, a vehicle interior material, a vehicle glass window, a building indoor ceiling, a building glass window, a building interior material, an aircraft interior material, an aircraft glass window, or the like, but embodiments of the present disclosure are not limited thereto. For example, the non-display panel may be a light emitting diode lighting panel (or apparatus), an organic light emitting lighting panel (or apparatus), an inorganic light emitting lighting panel (or apparatus), the like, but embodiments of the present disclosure are not limited thereto.

According to an embodiment of the present disclosure, the plate 170 and the vibration apparatus 200 may be disposed at the non-display panel. The plate 170 may be coupled or connected to a module (or a structure) of the vibration apparatus 200 by the connection member 150. Accordingly, the plate 170 and the module (or the structure) of the vibration apparatus 200 may vibrate the non-display panel to implement a sound and/or a haptic feedback.

According to another embodiment, in a case where the plate 170 and the vibration apparatus 200 are configured as one structure or one component (or module) which is provided as one body, the plate 170 may be used as a vibration object (or a vibration plate), and thus, a sound and/or a haptic feedback may be implemented based on a vibration of the plate 170. For example, in a structure (or a structure body) of the plate 170 and the vibration apparatus 200, the plate 170 may include one or more metal materials among a stainless steel, aluminum (Al), a magnesium (Mg), a magnesium (Mg) alloy, a magnesium lithium (Mg—Li) alloy, and an aluminum (Al) alloy, but embodiments of the present disclosure are not limited thereto. For example, in the module (or the structure) of the plate 170 and the vibration apparatus 200, the plate 170 may include a single nonmetal material or a composite nonmetal material of one or more among wood, plastic, glass, cloth, and leather.

Accordingly, in the apparatus according to another embodiment of the present disclosure, as described above with reference to FIGS. 2 to 16, a sound pressure level characteristic and a sound characteristic of a low-pitched sound band of a sound generated based on the displacement of the display panel 100 may be increased or enhanced based on a stack structure of the vibration generators 210 and 230. Also, in the apparatus according to another embodiment of the present disclosure, a resonance frequency of the vibration apparatus 200 may be reduced by the plate 170, and heat of the display panel 100 may be dissipated by the plate 170.

Figure 19:
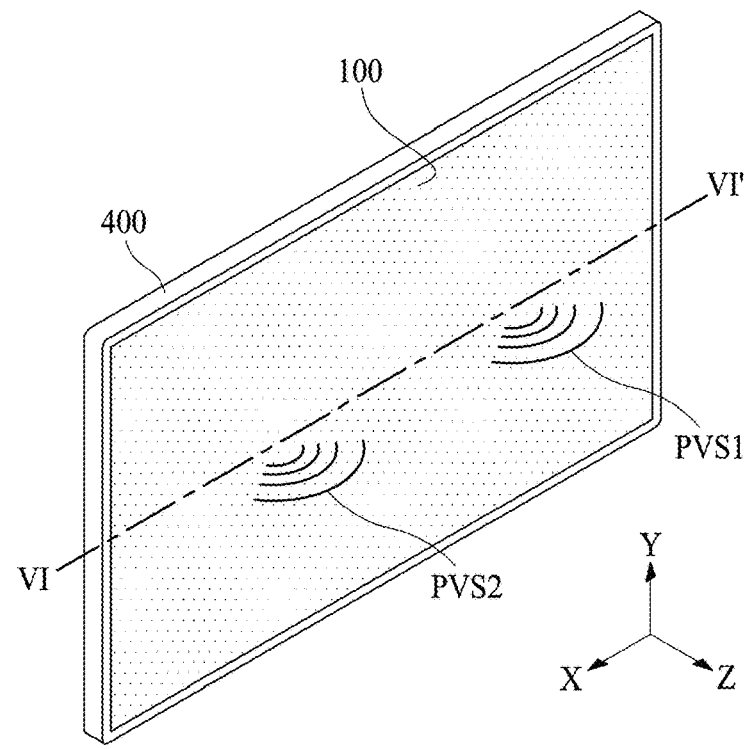
FIG. 19 illustrates a vibration apparatus according to another embodiment of the present disclosure.
Figure 20:
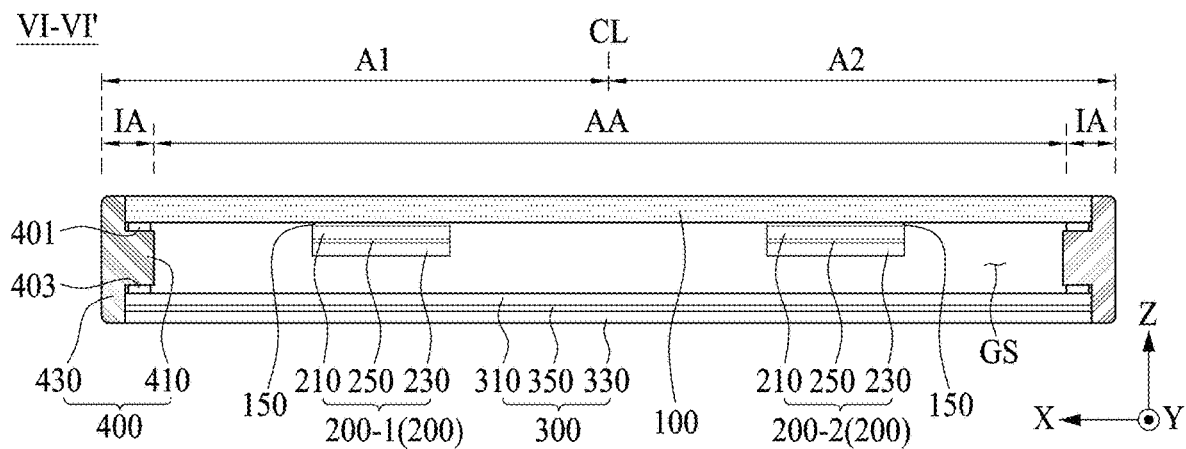
FIG. 20 is a cross-sectional view taken along line VI-VI' illustrated in FIG. 19.

FIG. 19 illustrates an apparatus according to another embodiment of the present disclosure. FIG. 20 is a cross-sectional view taken along line VI-VI' illustrated in FIG. 19. FIGS. 19 and 20 illustrate an embodiment implemented by modifying the vibration apparatus in the apparatus illustrated in FIGS. 2 to 16. Therefore, in the following description, repetitive descriptions of elements other than the vibration apparatus and elements relevant thereto may be omitted or will be briefly given.

With reference to FIGS. 19 and 20, in the apparatus according to another embodiment of the present disclosure, a rear surface (or a back surface) of a display panel 100 may include a first region (or a first rear area) A1 and a second region (or a second rear area) A2. For example, in the rear surface of the display panel 100, the first region A1 may be a left rear region, and the second region A2 may be a right rear region. The first and second regions A1 and A2 may be a left-right symmetrical with respect to a center line CL of the display panel 100 in a first direction X, but embodiments of the present disclosure are not limited thereto. For example, each of the first and second regions A1 and A2 may overlap the display area of the display panel 100.

The vibration apparatus 200 according to an embodiment of the present disclosure may include a first vibration device 200-1 and a second vibration device 200-2 disposed in the rear surface of the display panel 100.

The first vibration device 200-1 may be disposed at the first region A1 of the display panel 100. For example, the first vibration device 200-1 may be disposed close to a center or a periphery within the first region A1 of the display panel 100 with respect to the first direction X. The first vibration device 200-1 according to an embodiment of the present disclosure may vibrate the first region A1 of the display panel 100, and thus, may generate a first vibration sound PVS1 or a first haptic feedback in the first region A1 of the display panel 100. For example, the first vibration device 200-1 according to an embodiment of the present disclosure may directly vibrate the first region A1 of the display panel 100, and thus, may generate the first vibration sound PVS1 or the first haptic feedback in the first region A1 of the display panel 100. For example, the first vibration sound PVS1 may be a left sound. A size of the first vibration device 200-1 according to an embodiment of the present disclosure may have a size corresponding to half or less of the first region A1 or half or more of the first region A1 based on a characteristic of the first vibration sound PVS1 or a sound characteristic needed for an apparatus. As another embodiment of the present disclosure, the size of the first vibration device 200-1 may have a size corresponding to the first region A1 of the display panel 100. For example, the size of the first vibration device 200-1 may have the same size as the first area A1 of the display panel 100 or may have a size smaller than the first area A1 of the display panel 100.

The second vibration device 200-2 may be disposed at the second region A2 of the display panel 100. For example, the second vibration device 200-2 may be disposed close to a center or a periphery within the second region A2 of the display panel 100 with respect to the first direction X. The second vibration device 200-2 according to an embodiment of the present disclosure may vibrate the second region A2 of the display panel 100, and thus, may generate a second vibration sound PVS2 or a second haptic feedback in the second region A2 of the display panel 100. For example, the second vibration device 200-2 according to an embodiment of the present disclosure may directly vibrate the second region A2 of the display panel 100, and thus, may generate the second vibration sound PVS2 or the second haptic feedback in the second region A2 of the display panel 100. For example, the second vibration sound PVS2 may be a right sound. A size of the second vibration device 200-2 according to an embodiment of the present disclosure may have a size corresponding to half or less of the second region A2 or half or more of the second region A2 based on a characteristic of the second vibration sound PVS2 or a sound characteristic needed for an apparatus. As another embodiment of the present disclosure, the size of the second vibration device 200-2 may have a size corresponding to the second region A2 of the display panel 100. For example, the size of the second vibration device 200-2 may have the same size as the second area A2 of the display panel 100 or may have a size smaller than the second area A2 of the display panel 100. Therefore, the first vibration device 200-1 and the second vibration device 200-2 may have the same size or different sizes to each other based on a sound characteristic of left and right sounds and/or a sound characteristic of the apparatus. And, the first vibration device 200-1 and the second vibration device 200-2 may be disposed in a left-right symmetrical structure or a left-right asymmetrical structure with respect to the center line CL of the display panel 100.

Each of the first vibration device 200-1 and the second vibration device 200-2 may include one or more among the vibration apparatus 200 described above with reference to FIGS. 3, 4, 7, 8, and 10 to 14, and thus, their detailed descriptions may be omitted.

The connection member 150 according to an embodiment of the present disclosure may be disposed between each of the first vibration device 200-1 and the second vibration device 200-2 and the rear surface of the display panel 100. For example, each of the first vibration device 200-1 and the second vibration device 200-2 may be disposed at the rear surface of the display panel 100 by the connection member 150. The connection member 150 may be substantially the same as the connection member 150 described above with reference to FIG. 2, and thus, its repetitive description is omitted.

Accordingly, the apparatus according to another embodiment of the present disclosure may output, through the first vibration device 200-1 and the second vibration device 200-2, a left sound PVS1 and a right sound PVS2 to a forward region FD in front of the display panel 100 to provide a sound to a user.

Figure 21:
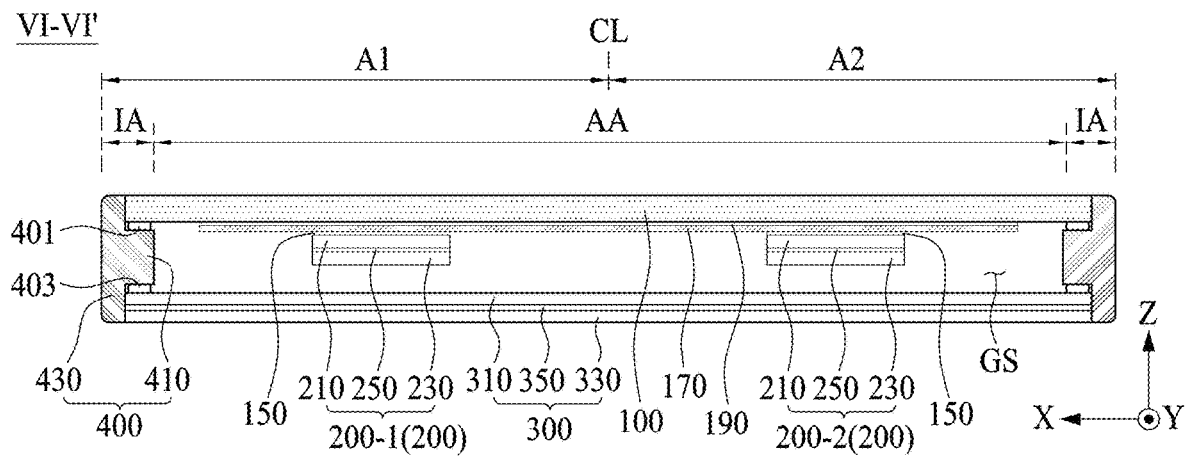
FIG. 21 is another cross-sectional view taken along line VI-VI' illustrated in FIG. 19.

FIG. 21 is another cross-sectional view taken along line VI-VI' illustrated in FIG. 19 and illustrates an embodiment where a plate is further configured in the apparatus illustrated in FIG. 20. Hereinafter, therefore, repetitive descriptions of elements other than the plate and elements relevant thereto may be omitted or will be briefly given.

With reference to FIG. 21, the apparatus according to another embodiment of the present disclosure may include a display panel 100 and a vibration apparatus 200, and may further include a plate 170 which is disposed between the display panel 100 and the vibration apparatus 200.

Each of the display panel 100 and the vibration apparatus 200 may be substantially the same as each of the display panel 100 and the vibration apparatus 200 described above with reference to FIGS. 2 to 16, and thus, their repetitive descriptions may be omitted or will be briefly given.

The plate 170 may be disposed between each of the first vibration device 200-1 and the second vibration device 200-2 of the vibration apparatus 200 and the rear surface of the display panel 100.

The plate 170 may dissipate heat generated from the display panel 100 or may reinforce a mass of the vibration apparatus 200 which is disposed at or hung from the rear surface of the display panel 100. The plate 170 may have the same shape and size as the rear surface of the display panel 100, or may have the same shape and size as the vibration apparatus 200. As another embodiment of the present disclosure, the plate 170 may have a size different from the display panel 100. For example, the plate 170 may be smaller than the size of the display panel 100. As another embodiment of the present disclosure, the plate 170 may have a size different from that of the vibration apparatus 200. For example, the plate 170 may be greater or smaller than the size of the vibration apparatus 200. The vibration apparatus 200 may be the same as or smaller than the size of the display panel 100. For example, the plate 170 may be substantially the same as the plate 170 described above with reference to FIGS. 17 and 18, and thus, their repetitive descriptions may be omitted.

The plate 170 may be coupled or connected to a rear surface of the display panel 100 by a plate connection member (or a fourth connection member) 190 described above.

Each of the first vibration device 200-1 and the second vibration device 200-2 of the vibration apparatus 200 may be connected or coupled to a rear surface of the plate 170 by the connection member 150 described above, and thus, may be supported by or hung at the rear surface of the plate 170.

Accordingly, the apparatus according to another embodiment of the present disclosure may output, through the first vibration device 200-1 and the second vibration device 200-2, a left sound PVS1 and a right sound PVS2 to a forward region FD in front of the display panel 100 to provide a sound to a user. Moreover, in the apparatus according to another embodiment of the present disclosure, a resonance frequency of the vibration apparatus 200 may decrease by the plate 170, and the heat generated from the display panel 100 may dissipate through the plate 170.

Figure 22:
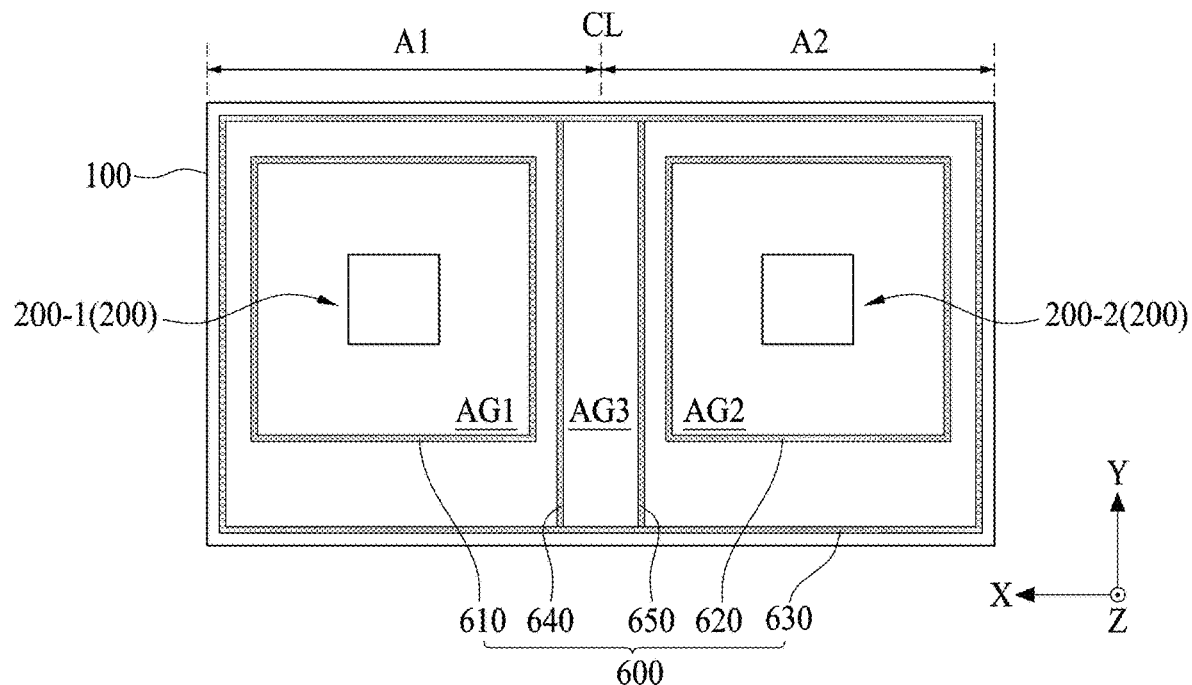
FIG. 22 illustrates an apparatus according to another embodiment of the present disclosure.

FIG. 22 illustrates an apparatus according to another embodiment of the present disclosure and illustrates an embodiment where a partition is further configured in the apparatus illustrated in FIGS. 19, and 20 or 21. Hereinafter, therefore, repetitive descriptions of elements other than the partition and elements relevant thereto may be omitted or will be briefly given.

With reference to FIGS. 19, 20, and 22, the apparatus according to another embodiment of the present disclosure may include a display panel 100 and a vibration apparatus 200, and may further include a partition 600 for dividing the first and second regions A1 and A2 of the display panel 100. The partition 600 may spatially divide the first and second regions A1 and A2 of the display panel 100.

Each of the display panel 100 and the vibration apparatus 200 may be substantially the same as each of the display panel 100 and the vibration apparatus 200 described above with reference to FIGS. 2 to 16, and thus, their repetitive descriptions may be omitted or will be briefly given.

The partition 600 may be an air gap or a space, where sounds PVS1 and PVS2 are generated when the display panel 100 is vibrated by the first and second vibration devices 200-1 and 200-2. For example, a partition 600 may separate the sounds PVS1 and PVS2 or a channel and may prevent or decrease the reduction of a sound characteristic caused by interference of the sounds PVS1 and PVS2. The partition 600 may be referred to as a sound blocking member, a sound separation member, a space separation member, an enclosure, or a baffle, or the like, but embodiments of the present disclosure are not limited thereto.

The partition 600 according to an embodiment of the present disclosure may include first and second partition members 610 and 620 disposed between the first and second vibration devices 200-1 and 200-2.

The first and second partition members 610 and 620 may be disposed between the display panel 100 and a supporting member 300 corresponding to a center region of the display panel 100.

The first partition member 610 may be disposed between the display panel 100 and the supporting member 300 corresponding to the first region A1 of the display panel 100. The first partition member 610 may individually (or independently) surround the first vibration device 200-1. The first partition member 610 according to an embodiment of the present disclosure may have a rectangular shape surrounding the first vibration device 200-1, but embodiments of the present disclosure are not limited thereto. For example, the first partition member 610 may have a shape that is the same as or different from a whole shape of the first vibration device 200-1. For example, when the first vibration device 200-1 has a square shape, the first partition member 610 may have a square shape, a circular shape or an oval shape having a size relatively larger than the first vibration device 200-1.

The second partition member 620 may be disposed between the display panel 100 and the supporting member 300 corresponding to the second region A2 of the display panel 100. The second partition member 620 may individually (or independently) surround the second vibration device 200-2. The second partition member 620 according to an embodiment of the present disclosure may have a rectangular shape surrounding the second vibration device 200-2, but embodiments of the present disclosure are not limited thereto. For example, the second partition member 620 may have a shape that is the same as or different from a whole shape of the second vibration device 200-2. For example, when the second vibration device 200-2 has a square shape, the second partition member 620 may have a square shape, a circular shape or an oval shape having a size relatively larger than the second vibration device 200-2.

According to an embodiment of the present disclosure, the first and second partition members 610 and 620 may have the same or different shapes. For example, the first and second partition members 610 and 620 may have a rectangular shape. For example, the first partition member 610 may have a rectangular ring shape, and the second partition member 620 may have a circular ring shape or an oval ring shape.

The first and second partition members 610 and 620 may separate a first vibration sound PVS1 generated by the first vibration device 200-1 and a second vibration sound PVS2 generated by the second vibration device 200-2. For example, the first and second partition members 610 and 620 may block the transfer of a vibration, generated by the first vibration device 200-1 in the first region A1 of the display panel 100, to the second region A2 of the display panel 100, or may block the transfer of a vibration, generated by the second vibration device 200-2 in the second region A2 of the display panel 100, to the first region A1 of the display panel 100. Therefore, the first and second partition members 610 and 620 may attenuate or absorb a vibration of the display panel 100 at a center of the display panel 100, and thus, the first and second partition members 610 and 620 may block the transfer of a sound of the first region A1 to the second region A2, or may block the transfer of a sound of the second region A2 to the first region A1. Accordingly, the first and second partition members 610 and 620 may separate a left sound and a right sound to further enhance a sound output characteristic of the apparatus. Thus, the apparatus according to an embodiment of the present disclosure may separate the left and right sounds by the first and second partition members 610 and 620 to output a two-channel or more sound to a forward region FD in front of the display panel 100.

According to an embodiment of the present disclosure, the partition 600 may include a material having elasticity which enables a certain degree of compression. For example, the partition 600 may include polyurethane, polyolefin, or the like, but embodiments of the present disclosure are not limited thereto. As another embodiment of the present disclosure, the partition 600 may include a single-sided tape, a single-sided foam pad, a double-sided tape, a double-sided foam tape, or the like, but embodiments of the present disclosure are not limited thereto.

As another embodiment of the present disclosure of the present disclosure, any one of the first and second partition members 610 and 620 may be omitted. For example, even when one of the first and second partition members 610 and 620 is between the first vibration device 200-1 and the second vibration device 200-2, a left sound and a right sound may be separated from each other. For example, when the second partition member 620 of the first and second partition members 610 and 620 is omitted, the first partition member 610 may be disposed between the display panel 100 and the supporting member 300 to correspond to a rear center line CL of the display panel 100.

Therefore, the first and second partition members 610 and 620 may separate a left sound and a right sound to further enhance a sound output characteristic of the apparatus. An apparatus including the first partition member 610 or the second partition member 620 may separate the left and right sounds by the first partition member 610 or the second partition member 620 to output a two-channel or more a sound to the forward region in front of the display panel 100.

The partition 600 according to an embodiment of the present embodiment may further include a third partition member 630 between the display panel 100 and the supporting member 300.

The third partition member 630 may be disposed between a rear periphery portion of the display panel 100 and a front periphery portion of the supporting member 300. The third partition member 630 may be disposed to surround all of the first and second vibration devices 200-1 and 200-2. The third partition member 630 may be referred to as an edge partition, a sound blocking member, an edge enclosure, an edge baffle, or the like, but embodiments of the present disclosure are not limited thereto. For example, the third partition member 630 may be adjacent to or in contact with the middle frame 400 described above, and may be surrounded by the middle frame 400. As another embodiment of the present disclosure, the third partition member 630 may be integrated as one body with the middle frame 400.

The third partition member 630 may provide first to third air gaps AG1 to AG3 between the display panel 100 and the supporting member 300, along with the first and second partition members 610 and 620. For example, each of the first to third air gaps AG1 to AG3 may be referred to as a vibration space, a sound pressure space, a sound box, a sound part, a resonance box, or a resonance part, but embodiments of the present disclosure are not limited thereto.

The first air gap AG1 may be provided in the first region A1 of the display panel 100, and may be surrounded by the first partition member 610 and the third partition member 630 disposed in the first region A1 of the display panel 100.

The second air gap AG2 may be provided in the second region A2 of the display panel 100, and may be surrounded by the second partition member 620 and the third partition member 630 disposed in the second region A2 of the display panel 100.

The third air gap AG3 may be provided in a rear center region of the display panel 100 surrounded by the first and second partition members 610 and 620 and the third partition member 630. For example, the third air gap AG3 may be provided between the second air gap AG2 and the first air gap AG1. For example, the third air gap AG3 may be provided between the second air gap AG2 and the first air gap AG1, including the rear center line CL of the display panel 100. The third air gap AG3 may be referred to as a sound separation space, a sound blocking space, a sound interference prevention space, or the like, but embodiments of the present disclosure are not limited thereto. The third air gap AG3 may separate the first air gap AG1 from the second air gap AG2, and thus, the third air gap AG3 may reduce or prevent a resonance phenomenon or an interference phenomenon in a certain frequency band generated in each of the first air gap AG1 and the second air gap AG2. For example, the third air gap AG3 may spatially separate the first air gap AG1 from the second air gap AG2, and thus, the third air gap AG3 may reduce or prevent a resonance phenomenon or an interference phenomenon in a certain frequency band generated in each of the first air gap AG1 and the second air gap AG2.

The first vibration device 200-1 may be surrounded by the first partition member 610 and the third partition member 630 providing the first air gap AG1. The second vibration device 200-2 may be surrounded by the second partition member 620 and the third partition member 630 providing the second air gap AG2.

When one of the first and second partition members 610 and 620 is omitted, the third air gap AG3 may be omitted.

Therefore, the third partition member 630 may surround an area between the display panel 100 and the supporting member 300, and may individually surround each of the first and second vibration devices 200-1 and 200-2, along with the first and second partition members 610 and 620, to secure a vibration space of each of the first and second vibration devices 200-1 and 200-2. Thus, the third partition member 630 may enhance a sound pressure level characteristic of left and right sounds. Further, the third partition member 630 may prevent sound or a sound pressure level from being leaked to the outside through the side surface between the display panel 100 and the supporting member 300, thereby further enhancing a sound output characteristic of the apparatus or a display apparatus.

The partition 600 according to an embodiment of the present embodiment may further include a fourth partition member 640 and a fifth partition member 650.

The fourth partition member 640 and the fifth partition member 650 may be disposed between the display panel 100 and the supporting member 300. For example, the fourth partition member 640 and the fifth partition member 650 may be between the display panel 100 and a supporting member 300 corresponding to a center region of the display panel 100. For example, the fourth partition member 640 and the fifth partition member 650 may disposed in parallel with each other in center region of the display panel 100. The fourth partition member 640 and the fifth partition member 650 may disposed at the rear center line CL of the display panel 100 and may separate the first region A1 and the second region A2 of the display panel 100. For example, the fourth partition member 640 and the fifth partition member 650 may spatially divide the first and second regions A1 and A2 of the display panel 100. For example, the fourth partition member 640 and the fifth partition member 650 may separate the first vibration sound PVS1 and the second vibration sound PVS2 respectively generated by the first vibration device 200-1 and the second vibration device 200-2. For example, the fourth partition member 640 and the fifth partition member 650 may block the transfer of a vibration, generated by the first vibration device 200-1 in the first region A1 of the display panel 100, to the second region A2 of the display panel 100, or may block the transfer of a vibration, generated by the second vibration device 200-2 in the second region A2 of the display panel 100, to the first region A1 of the display panel 100. Therefore, the fourth partition member 640 and the fifth partition member 650 may attenuate or absorb a vibration of the display panel 100 at a center of the display panel 100, and thus, the fourth partition member 640 and the fifth partition member 650 may block the transfer of a sound of the first region A1 to the second region A2, or may block the transfer of a sound of the second region A2 to the first region A1. Accordingly, the fourth partition member 640 and the fifth partition member 650 may separate a left sound and a right sound to further enhance a sound output characteristic of the apparatus. Thus, the apparatus according to an embodiment of the present disclosure may separate the left and right sounds by the fourth partition member 640 and the fifth partition member 650 to output a two-channel or more sound to a forward region FD in front of the display panel 100.

According to an embodiment of the present disclosure, the fourth partition member 640 and the fifth partition member 650 may include a material having elasticity which enables a certain degree of compression. For example, the fourth partition member 640 and the fifth partition member 650 may include polyurethane, polyolefin, or the like, but embodiments of the present disclosure are not limited thereto. As another embodiment of the present disclosure, the fourth partition member 640 and the fifth partition member 650 may include a single-sided tape, a single-sided foam pad, a double-sided tape, a double-sided foam tape, or the like, but embodiments of the present disclosure are not limited thereto.

As another embodiment of the present disclosure of the present disclosure, any one of the fourth and fifth partition members 640 and 650 may be omitted. For example, when the fifth partition member 650 of the fourth and fifth partition members 640 and 650 is omitted, the fourth partition member 640 may be disposed between the display panel 100 and the supporting member 300 to correspond to a rear center line CL of the display panel 100. Even when any one of the fourth partition member 640 and the fifth partition member 650 is disposed between the first vibration device 200-1 and the second vibration device 200-2, left and right sounds may be separated.

Therefore, the apparatus according to another embodiment of the present disclosure includes the partition 600, and thus, the sound pressure level characteristic and the sound reproduction band of each of the left and right sounds may be improved or optimized. For example, the apparatus according to another embodiment of the present disclosure may include at least one or more among the first and second partition members 610 and 620. As another embodiment of the present disclosure, the apparatus according to another embodiment of the present disclosure may include the third partition member 630 without the first partition member 610 and the second partition member 620. As another embodiment of the present disclosure, the apparatus according to another embodiment of the present disclosure may include the third partition member 630 and at least one or more among the first and second partition members 610 and 620. As another embodiment of the present disclosure, the apparatus according to another embodiment of the present disclosure may include the third partition member 630, the fourth partition member 640 and the fifth partition member 650. As another embodiment of the present disclosure, the apparatus according to another embodiment of the present disclosure may include all of the first to fifth partition members 610 to 650.

In FIG. 22 and description relevant thereto, the partition 600 has been described as disposing the display panel 100 and the supporting member 300, but embodiments of the present disclosure are not limited thereto. For example, as described above with reference to FIG. 22, the apparatus according to another embodiment of the present disclosure may further include a plate 170 disposed a rear surface of the display panel 100, in this case, the partition 600 described above may be disposed between the rear surface of the plate 170 and the support member 300. For example, the first to fifth partition members 610 to 650 of the partition 600 may be disposed between the rear surface of the plate 170 and the support member 300.

Accordingly, the apparatus according to another embodiment of the present disclosure may output, through the first vibration device 200-1 and the second vibration device 200-2, a left sound PVS1 and a right sound PVS2 to a forward region FD in front of the display panel 100 to provide a sound to a user. The apparatus according to another embodiment of the present disclosure may output a two-channel or more a sound to the forward region FD in front of the display panel 100 by separating the left and right sounds PVS1 and PVS2 according to the partition 600. Moreover, in the apparatus according to another embodiment of the present disclosure, a resonance frequency of the vibration apparatus 200 may decrease by the plate 170, and the heat generated from the display panel 100 may be dissipated through the plate 170.

Figure 23:
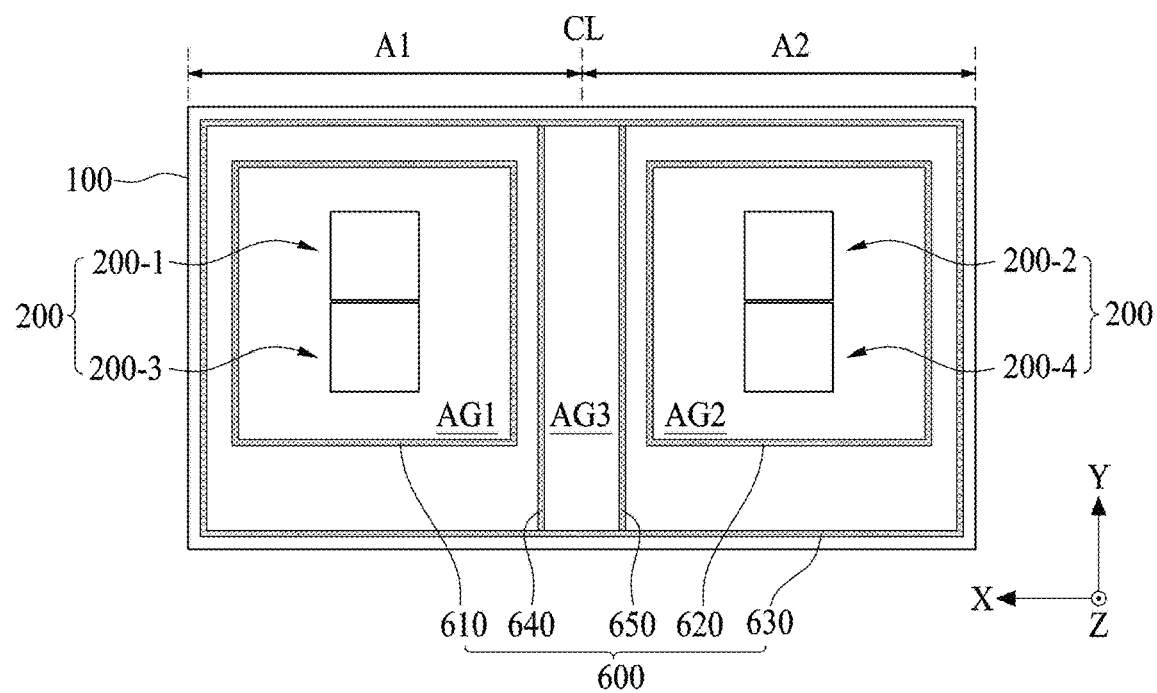
FIG. 23 illustrates an apparatus according to another embodiment of the present disclosure.

FIG. 23 illustrates an apparatus according to another embodiment of the present disclosure and illustrates an embodiment implemented by modifying the vibration apparatus in the apparatus illustrated in FIGS. 20 to 22. Therefore, in the following description, repetitive descriptions of elements other than the vibration apparatus and elements relevant thereto may be omitted or will be briefly given.

With reference to FIG. 23, in the apparatus according to another embodiment of the present disclosure, the vibration apparatus 200 may include first to fourth vibration devices 200-1 to 200-4 disposed at a rear surface of a display panel 100.

The first and third vibration devices 200-1 and 200-3 may be disposed in parallel with each other within the first region A1 of the display panel 100 along the first direction (or a widthwise direction) X. For example, the first and third vibration devices 200-1 and 200-3 may be disposed in one row within the first region A1 of the display panel 100 along the second direction (or a lengthwise direction) Y. The first and third vibration devices 200-1 and 200-3 may be surrounded by the partition 600. For example, the first and third vibration devices 200-1 and 200-3 may be surrounded by the first partition member (or a first enclosure) 610.

Each of the first and third vibration devices 200-1 and 200-3 may vibrate the first region A1 of the display panel 100 to generate a first vibration sound (or a left sound) PVS1 or a first haptic feedback in the first region A1 of the display panel 100. For example, a vibration area of the first region A1 of the display panel 100 may increase based on a parallel arrangement structure of the first and third vibration devices 200-1 and 200-3 and thus, a sound characteristic including a low-pitched sound band characteristic of a left sound may be enhanced. For example, because the third vibration device 200-3 is further disposed in addition to the first vibration device 200-1, the first vibration sound PVS1 or the first haptic feedback according to another embodiment of the present disclosure may be more enhanced than the first vibration sound PVS1 or the first haptic feedback described above with reference to FIG. 22.

According to another embodiment of the present disclosure, with respect to a center line of the first area A1 of the display panel 100 parallel to the first direction X, the first vibration device 200-1 may be disposed at an upper side of the center line of the first area A1, and the third vibration device 200-3 may be disposed at a lower side of the center line of the first area A1. The first and third vibration devices 200-1 and 200-3 may be symmetric (or vertically symmetric) with respect to the center line of the first area A1. Even in this case, a vibration area of the first region A1 of the display panel 100 may increase based on a parallel arrangement structure of the first and third vibration devices 200-1 and 200-3, and thus, a sound characteristic having a low-pitched sound band characteristic of a left sound may be enhanced.

According to an embodiment of the present disclosure, with respect to the second direction Y, an interval (or a separation distance) between the first and third vibration devices 200-1 and 200-3 may be 0.1 mm or more and less than 3 cm, but embodiments of the present disclosure are not limited thereto. Thus, damage or a crack caused by a physical contact between the first and third vibration devices 200-1 and 200-3 may be prevented.

The second and fourth vibration devices 200-2 and 200-4 may be disposed in parallel with each other within the second region A2 of the display panel 100 along the first direction (or a widthwise direction) X. For example, the second and fourth vibration devices 200-2 and 200-4 may be disposed in one row within the second region A2 of the display panel 100 along the second direction (or a lengthwise direction) Y. For example, the second and fourth vibration devices 200-2 and 200-4 may be surrounded by the partition 600. For example, the second and fourth vibration devices 200-2 and 200-4 may be surrounded by the second partition member (or a second enclosure) 620.

Each of the second and fourth vibration devices 200-2 and 200-4 may vibrate the second region A2 of the display panel 100 to generate a second vibration sound (or a right sound) PVS2 or a second haptic feedback in the second region A2 of the display panel 100. For example, a vibration area of the second region A2 of the display panel 100 may increase based on a parallel arrangement structure of the second and fourth vibration devices 200-2 and 200-4 and thus, a sound characteristic including a low-pitched sound band characteristic of a right sound may be enhanced. For example, because the fourth vibration device 200-4 is further disposed in addition to the second vibration device 200-2, the second vibration sound PVS2 or the second haptic feedback according to another embodiment of the present disclosure may be more enhanced than the second vibration sound PVS2 or the second haptic feedback described above with reference to FIG. 22.

According to another embodiment of the present disclosure, with respect to a center line of the second area A2 of the display panel 100 parallel to the first direction X, the second vibration device 200-2 may be disposed at an upper side of the center line of the first area A1, and the fourth vibration device 200-4 may be disposed at a lower side of the center line of the first area A1. The second and fourth vibration devices 200-2 and 200-4 may be symmetric (or vertically symmetric) with respect to the center line of the first area A1. Even in this case, a vibration area of the second region A1 of the display panel 100 may increase based on a parallel arrangement structure of the second and fourth vibration devices 200-2 and 200-4, and thus, a sound characteristic having a low-pitched sound band characteristic of a right sound may be enhanced.

According to an embodiment of the present disclosure, with respect to the second direction Y, an interval (or a separation distance) between the second and fourth vibration devices 200-2 and 200-4 may be 0.1 mm or more and less than 3 cm, but embodiments of the present disclosure are not limited thereto. Thus, damage or a crack caused by a physical contact between the second and fourth vibration devices 200-2 and 200-4 may be prevented.

The vibration portion of each of the plurality of vibration generating portions included in each of the first to fourth vibration devices 200-1 to 200-4 may be the same or differ. For example, based on a sound characteristic needed for an apparatus, the vibration portion 211a of each of the plurality of vibration generating portions included in each of the first to fourth vibration devices 200-1 to 200-4 may include the same vibration portion as one or more of the vibration portions 211a described above with reference to FIGS. 3, 11, 13, and 14, or may include different vibration portions 211a. When the vibration portion of each of the plurality of vibration generating portions included in each of the first to fourth vibration devices 200-1 to 200-4 may include different vibration portion of the vibration portions 211a described above with reference to FIGS. 3, 11, 13, and 14, the vibration apparatus 200 may have various resonance frequencies, and thus, a reproduction band and a sound pressure level characteristic of a sound which is generated based on a vibration of the vibration apparatus 200 may considerably increase.

According to an embodiment of the present disclosure, in FIG. 23 and description relevant thereto, the vibration apparatus 200 according to an embodiment of the present disclosure has been described that the first and third vibration devices 200-1 and 200-3 may be in parallel with each other along the first direction (or a widthwise direction) X, or may be in one row, but embodiments of the present disclosure are not limited thereto. For example, the first and third vibration devices 200-1 and 200-3 may be configured to have a parallel arrangement structure which is disposed in parallel with each other along the second direction (or a lengthwise direction) Y or in one row along the first direction (or a widthwise direction) X, and even in this case, the same effect as FIG. 23 may be obtained. Similarly, the second and fourth vibration devices 200-2 and 200-4 may be configured to have a parallel arrangement structure which is disposed in parallel with each other along the second direction (or a lengthwise direction) Y or in one row along the first direction (or a widthwise direction) X, and even in this case, the same effect as FIG. 23 may be obtained.

Figure 24:
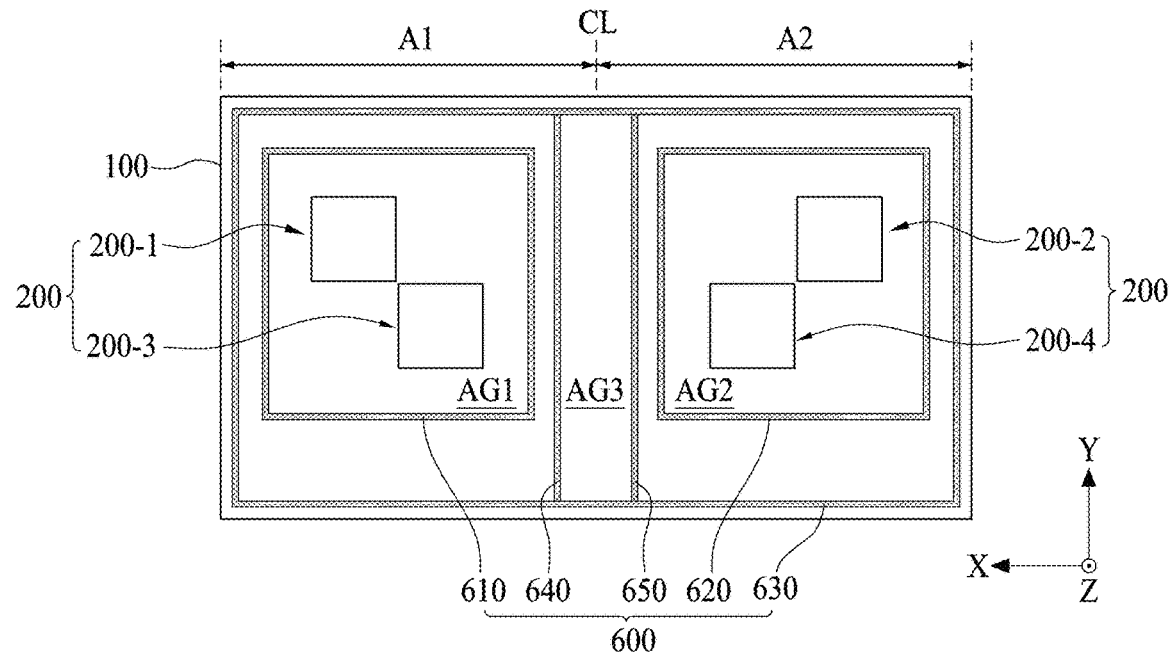
FIG. 24 illustrates an apparatus according to another embodiment of the present disclosure.

FIG. 24 illustrates an apparatus according to another embodiment of the present disclosure and illustrates an embodiment implemented by modifying the vibration apparatus in the apparatus illustrated in FIGS. 20 to 22. Therefore, in the following description, repetitive descriptions of elements other than the vibration apparatus and elements relevant thereto may be omitted or will be briefly given.

With reference to FIG. 24, in an apparatus according to another embodiment of the present disclosure, the vibration apparatus 200 may include first to fourth vibration devices 200-1 to 200-4 disposed at a rear surface of a display panel 100.

The first and third vibration devices 200-1 and 200-3 may be staggered or disposed in a diagonal direction within the first area A1 of the display panel 100, and thus, the first and third vibration devices 200-1 and 200-3 may increase a vibration area of the first region A1 of the display panel 100. For example, the diagonal direction may be a direction between the first direction X and the second direction Y. The first and third vibration devices 200-1 and 200-3 may be surrounded by the partition 600. For example, the first and third vibration devices 200-1 and 200-3 may be surrounded by the fourth partition member (or a first enclosure) 640.

Each of the first and third vibration devices 200-1 and 200-3 may vibrate the first region A1 of the display panel 100 to generate a first vibration sound (or a left sound) PVS1 or a first haptic feedback in the first region A1 of the display panel 100. For example, a vibration area of the first region A1 of the display panel 100 may increase based on a diagonal arrangement structure of the first and third vibration devices 200-1 and 200-3 and thus, a low-pitched sound band characteristic of a left sound may be enhanced. For example, because the third vibration device 200-3 is further disposed in addition to the first vibration device 200-1, the first vibration sound PVS1 or the first haptic feedback according to another embodiment of the present disclosure may be more enhanced than the first vibration sound PVS1 or the first haptic feedback described above with reference to FIG. 22.

According to an embodiment of the present disclosure, the first vibration device 200-1 may be disposed close to a periphery portion of the first region A1 of the display panel 100. For example, the first vibration device 200-1 may be disposed in a left upper region, which is adjacent to a periphery portion of the display panel 100, within the first region A1 of the display panel 100. The third vibration device 200-3 may be disposed close to a center line CL of the display panel 100 within the first region A1 of the display panel 100. For example, the third vibration device 200-3 may be disposed in a right lower region, which is adjacent to the center line CL of the display panel 100, within the first region A1 of the display panel 100. The third vibration device 200-3 may be staggered with respect to the first vibration device 200-1 within the first region A1 of the display panel 100, and thus, may not overlap the first vibration device 200-1 in a first direction X and a second direction Y.

The diagonal arrangement structure of the first and third vibration devices 200-1 and 200-3 may have an effect in which two vibration devices may be disposed in a 2×2 structure in the first region A1 of the display panel 100. Thus, the number of vibration devices for vibrating the first region A1 of the display panel 100 may decrease by half.

The second and fourth vibration devices 200-2 and 200-4 may be staggered or disposed in a diagonal direction within the second area A2 of the display panel 100, and thus, the second and fourth vibration devices 200-2 and 200-4 may increase a vibration area of the second region A2 of the display panel 100. The second and fourth vibration devices 200-2 and 200-4 may be surrounded by the partition 600. For example, the second and fourth vibration devices 200-2 and 200-4 may be surrounded by the fifth partition member (or a second enclosure) 650.

Each of the second and fourth vibration devices 200-2 and 200-4 may vibrate the second region A2 of the display panel 100 to generate a second vibration sound (or a right sound) PVS2 or a second haptic feedback in the second region A2 of the display panel 100. For example, a vibration area of the second region A2 of the display panel 100 may increase based on a diagonal arrangement structure of the second and fourth vibration devices 200-2 and 200-4 and thus, a low-pitched sound band characteristic of a right sound may be enhanced. For example, because the fourth vibration device 200-4 is further disposed in addition to the second vibration device 200-2, the second vibration sound PVS2 or the second haptic feedback according to another embodiment of the present disclosure may be more enhanced than the second vibration sound PVS2 or the second haptic feedback described above with reference to FIG. 22.

According to an embodiment of the present disclosure, the second vibration device 200-2 may be disposed close to a periphery portion of the second region A2 of the display panel 100. For example, the second vibration device 200-2 may be disposed in a right upper region, which is adjacent to a periphery portion of the display panel 100, within the second region A2 of the display panel 100. Also, the first and second vibration devices 200-1 and 200-2 may be a left-right symmetrical with respect to a center line CL of the display panel 100 in a first direction X, but embodiments of the present disclosure are not limited thereto. The fourth vibration device 200-4 may be disposed close to a center line CL of the display panel 100 within the second region A2 of the display panel 100. For example, the fourth vibration device 200-4 may be disposed in a left lower region, which is adjacent to the center line CL of the display panel 100, within the second region A2 of the display panel 100. The fourth vibration device 200-4 may be staggered with respect to the second vibration device 200-2 within the second region A2 of the display panel 100, and thus, may not overlap the second vibration device 200-2 in a first direction X and a second direction Y. Also, the second vibration device 200-2 may be a left-right symmetric structure with the first vibration device 200-1 with respect to a center line CL of the display panel 100, and the fourth vibration device 200-4 may be a left-right symmetric structure with the third vibration device 200-3 with respect to a center line CL of the display panel 100.

The diagonal arrangement structure of the second and fourth vibration devices 200-2 and 200-4 may have an effect in which two vibration devices may be disposed in a 2×2 structure in the second region A2 of the display panel 100. Thus, the number of vibration devices for vibrating the second region A2 of the display panel 100 may decrease by half.

The vibration portion 211a of each of the plurality of vibration generating portions included in each of the first to fourth vibration devices 200-1 to 200-4 may be the same or differ. For example, based on a sound characteristic needed for an apparatus, the vibration portion 211a of each of the plurality of vibration generating portions included in each of the first to fourth vibration devices 200-1 to 200-4 may include the same vibration portion as one or more of the vibration portions 211a described above with reference to FIGS. 3, 11, 13, and 14, or may include different vibration portions 211a. When the vibration portion of each of the plurality of vibration generating portions included in each of the first to fourth vibration devices 200-1 to 200-4 may include different vibration portion of the vibration portions 211a described above with reference to FIGS. 3, 11, 13, and 14, the vibration apparatus 200 may have various resonance frequencies, and thus, a reproduction band and a sound pressure level characteristic of a sound which is generated based on a vibration of the vibration apparatus 200 may considerably increase.

An arrangement structure of the first to fourth vibration devices 200-1 to 200-4 is not limited to the arrangement structure illustrated in FIG. 24. For example, in each of the first region A1 and the second region A2 of the display panel 100, when a direction between a left upper portion and a right lower portion is referred to as a first diagonal direction and a direction between a right upper portion and a left lower portion is referred to as a second diagonal direction, the first and third vibration devices 200-1 and 200-3 may be disposed in the first diagonal direction or the second diagonal direction, and the second and fourth vibration devices 200-2 and 200-4 may be disposed in a diagonal direction, which is the same as or different from a diagonal arrangement direction of the first and third vibration devices 200-1 and 200-3, among the first diagonal direction and the second diagonal direction. For example, the first vibration device 200-1 and the second vibration device 200-2 may be disposed in a left-right symmetrical structure or a left-right asymmetrical structure with respect to the center line CL of the display panel 100. Also, the third vibration device 200-3 and the fourth vibration device 200-4 may be disposed in a left-right symmetrical structure or a left-right asymmetrical structure with respect to the center line CL of the display panel 100.

Therefore, the apparatus according to another embodiment of the present disclosure may be provide a sound to the user in the same manner as the apparatus described above with reference to FIG. 22, and may output a two-channel or more a sound to the forward region FD in front of the display panel 100. Moreover, in the apparatus according to another embodiment of the present disclosure, a resonance frequency of the vibration apparatus 200 may decrease, and the heat generated from the display panel 100 may be dissipated. In addition, in the apparatus according to another embodiment of the present specification, a vibration area of each of the first and second region A1 and A2 of the display panel 100 may increase based on the diagonal arrangement direction of the first and third vibration devices 200-1 and 200-3 and the diagonal arrangement direction of the second and fourth vibration devices 200-2 and 200-4, and thus, a low-pitched sound band characteristic of a sound may be further enhanced.

Figure 25:
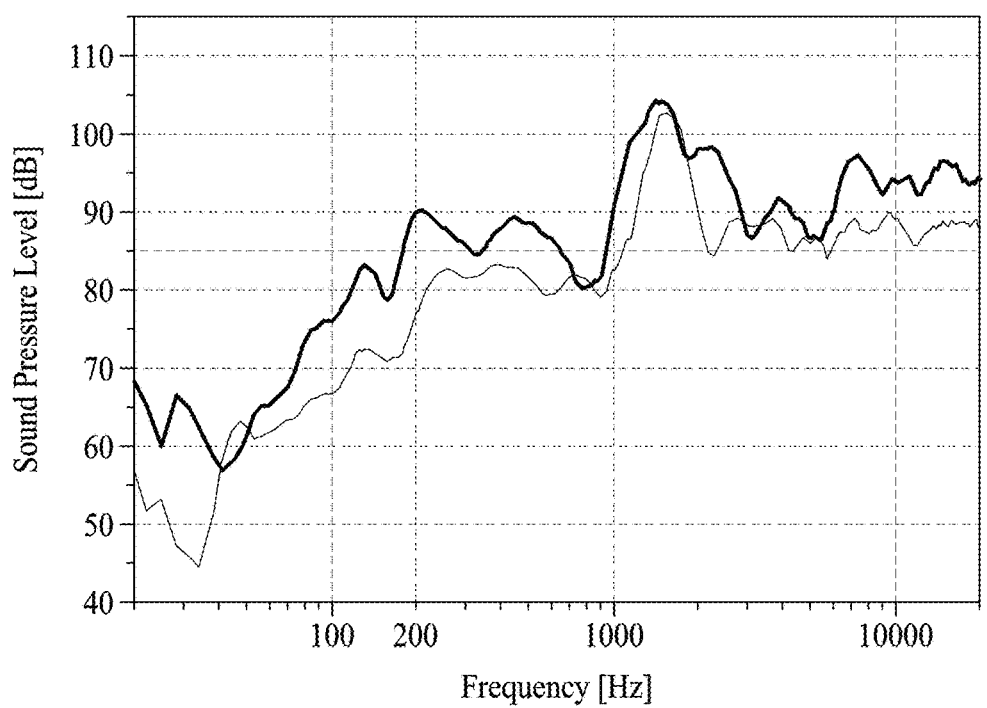
FIG. 25 illustrates a sound output characteristic of each of an apparatus according to an embodiment of the present disclosure and an apparatus according to the experimental example.

FIG. 25 illustrates a sound output characteristic of each of an apparatus according to an embodiment of the present disclosure and an apparatus according to the comparative example.

A sound output characteristic may be measured by a sound analysis apparatus. The sound analysis apparatus may include a sound card which transmits or receives a sound to or from a control personal computer (PC), an amplifier which amplifies a signal generated from the sound card and transfers the amplified signal to a vibration device, and a microphone which collects a sound generated based on driving of the vibration device in a display panel. The sound collected through the microphone may be input to the control PC through the sound card, and a control program may check the input sound to analyze a sound output characteristic of the vibration device.

A thin solid line of FIG. 25 represents a result obtained by measuring a sound output characteristic of the display apparatus according to the comparative example. A thick solid line of FIG. 25 represents a result obtained by measuring a sound output characteristic of the display apparatus according to an embodiment of the present disclosure, and the display apparatus according to an embodiment of the present disclosure includes a vibration apparatus having a plurality of or a stacked structure of vibration generators. In FIG. 25, the abscissa axis represents a frequency (Hz), and the ordinate axis represents a sound pressure level (SPL) (dB).

With reference to FIG. 25, comparing with the display apparatus according to the comparative example, it may be seen that the display apparatus according to an embodiment of the present disclosure has a high sound pressure level in the middle-low-pitched sound band (for example, about 50 Hz to about 1000 Hz). Therefore, comparing with the display apparatus according to the comparative example, the display apparatus according to an embodiment of the present disclosure has a high sound pressure level in the middle-low-pitched sound band (for example, about 50 Hz to about 1000 Hz) due to the stacked structure of the plurality of vibration generators.

An apparatus according to an embodiment of the present disclosure will be described below.

An apparatus according to an embodiment of the present disclosure may include a display panel configured to display an image, and a vibration apparatus at a rear surface of the display panel to vibrate the display panel, the vibration apparatus may include a plurality of vibration generators overlapping one another.

According to some embodiments of the present disclosure, each of the plurality of vibration generators may be displaced in the same direction.

According to some embodiments of the present disclosure, each of the plurality of vibration generators may be configured to vibrate in the same direction.

According to some embodiments of the present disclosure, each of the plurality of vibration generators may have the same size.

According to some embodiments of the present disclosure, an end portion of each of the plurality of vibration generators maybe aligned on a virtual extension line extending in a thickness direction of the display panel.

An apparatus according to an embodiment of the present disclosure may include a display panel configured to display an image, a vibration apparatus at a rear surface of the display panel, and a plate disposed between the display panel and the vibration apparatus, the vibration apparatus may include a plurality of vibration generators stacked to be displaced in the same direction, and an adhesive member between the plurality of vibration generators.

According to some embodiments of the present disclosure, the plurality of vibration generators may be symmetric to each other with respect to the adhesive member.

According to some embodiments of the present disclosure, the display panel may include a first region and a second region, the vibration apparatus may include a first vibration device disposed at the first region and a second vibration device disposed at the second region, and each of the first vibration device and the second vibration device may include the plurality of vibration generators and the adhesive member.

According to some embodiments of the present disclosure, the apparatus may further include a supporting member disposed at the rear surface of the display panel, and a partition disposed between the rear surface of the display panel and the supporting member, the partition being between the first region and the second region.

According to some embodiments of the present disclosure, the vibration apparatus may further include a third vibration device disposed in the first region, and a fourth vibration device disposed in the second region, and each of the third vibration device and the fourth vibration device may include the plurality of vibration generators and the adhesive member.

According to some embodiments of the present disclosure, the first and third vibration devices may be disposed in parallel or to be staggered in the first region, and the second and fourth vibration devices may be disposed in parallel or to be staggered in the second region.

According to some embodiments of the present disclosure, each of the plurality of vibration generators may include a vibration structure, a first protection member disposed at a first surface of the vibration structure, and a second protection member disposed at a second surface different from the first surface of the vibration structure.

According to some embodiments of the present disclosure, the vibration structure may include a vibration portion, a first electrode portion disposed between the vibration portion and the first protection member, and a second electrode portion disposed between the vibration portion and the second protection member.

According to some embodiments of the present disclosure, each of the plurality of vibration generators may include a vibration portion including a plurality of inorganic material portions having a piezoelectric characteristic and an organic material portion having an organic material between the plurality of inorganic material portions, a first electrode portion disposed at a first surface of the vibration portion, and a second electrode portion disposed at a second surface different from the first surface of the vibration portion.

According to some embodiments of the present disclosure, an inorganic material portion of a vibration generator disposed at an upper layer among the plurality of vibration generators may overlap an inorganic material portion of a vibration generator disposed at a lower layer among the plurality of vibration generators, and/or the organic material portion of the vibration generator disposed at the upper layer may overlap the organic material portion of the vibration generator disposed at the lower layer.

According to some embodiments of the present disclosure, the adhesive member may include a first adhesive layer and a second adhesive layer, and each of the plurality of vibration generators may include a plurality of vibration generating portions arranged in a first direction and a second direction crossing the first direction, a first protection member disposed at a first surface of each of the plurality of vibration generating portions by the first adhesive layer, and a second protection member disposed at a second surface of each of the plurality of vibration generating portions by the second adhesive layer.

According to some embodiments of the present disclosure, the plurality of vibration generating portions may be electrically separated and spaced apart from each other having a distance.

According to some embodiments of the present disclosure, the distance may be within a range from 0.1 mm to 3 cm.

According to some embodiments of the present disclosure, the first adhesive layer and the second adhesive layer may be coupled to each other to surround the plurality of vibration generation portions.

According to some embodiments of the present disclosure, each of the plurality of vibration generating portions may include a vibration portion, a first electrode portion disposed at a first surface of the vibration portion, and a second electrode portion disposed at a second surface different from the first surface of the vibration portion.

According to some embodiments of the present disclosure, the vibration portion may include a plurality of inorganic material portions, and an organic material portion having an organic material between the plurality of inorganic material portions.

According to some embodiments of the present disclosure, an inorganic material portion of a vibration generator disposed at an upper layer among the plurality of vibration generators may overlap an inorganic material portion of a vibration generator disposed at a lower layer among the plurality of vibration generators, and/or the organic material portion of the vibration generator disposed at the upper layer may overlap the organic material portion of the vibration generator disposed at the lower layer.

According to some embodiments of the present disclosure, each of the plurality of vibration generators may include a vibration portion, a first electrode portion disposed on a first surface of the vibration portion, and a second electrode portion disposed on a second surface different from the first surface of the vibration portion, and the first electrode portion of each of the plurality of vibration generators may be disposed closer to the display panel than the second electrode portion.

According to some embodiments of the present disclosure, the apparatus my further include a vibration driving circuit including a plurality of amplifiers respectively connected to the plurality of vibration generators, the plurality of vibration generators may include a first group and a second group, the plurality of amplifiers may include a first amplifier group and a second amplifier group, an amplifier of the first amplifier group may include a first output terminal connected to a first electrode portion of a vibration generator of the first group, and a second output terminal connected to a second electrode portion of a vibration generator of the first group, and an amplifier of the second amplifier group may include a first output terminal connected to a second electrode portion of a vibration generator of the second group, and a second output terminal connected to a first electrode portion of a vibration generator of the second group.

According to some embodiments of the present disclosure, each of the plurality of vibration generators may include a vibration portion, a first electrode portion disposed at a first surface of the vibration portion, and a second electrode portion disposed at a second surface different from the first surface of the vibration portion, the plurality of vibration generators may a first group and a second group, in a vibration generator of the first group, the first electrode portion may be disposed closer to the display panel than the second electrode portion, and in a vibration generator of the second group, the second electrode portion may be disposed closer to the display panel than the first electrode portion.

According to some embodiments of the present disclosure, the apparatus my further include a vibration driving circuit including a plurality of amplifiers respectively connected to the plurality of vibration generators, each of the plurality of amplifiers may include a first output terminal connected to a first electrode portion of a corresponding vibration generator of the plurality of vibration generators; and a second output terminal connected to a second electrode portion of a corresponding vibration generator of the plurality of vibration generators.

A vibration apparatus according to an embodiment of the present disclosure may include a plurality of vibration generators stacked to be displaced in the same direction, and an adhesive member between the plurality of vibration generators.

According to some embodiments of the present disclosure, the plurality of vibration generators may be symmetric to each other with respect to the adhesive member.

According to some embodiments of the present disclosure, each of the plurality of vibration generators may have the same size.

According to some embodiments of the present disclosure, an end portion of each of the plurality of vibration generators may be aligned in a direction perpendicular to a front surface of the vibration apparatus.

According to some embodiments of the present disclosure, an end portion of each of the plurality of vibration generators may be aligned on a virtual extension line extending in a thickness direction of the vibration apparatus.

According to some embodiments of the present disclosure, the vibration apparatus may further include a plate disposed at an uppermost vibration generator among the plurality of vibration generators.

According to some embodiments of the present disclosure, each of the plate and the plurality of vibration generators may have the same size.

According to some embodiments of the present disclosure, the plate may include a metal material, or comprises one or more single nonmetal materials or composite nonmetal materials of wood, plastic, glass, cloth, and leather.

According to some embodiments of the present disclosure, the adhesive member may include a first adhesive layer and a second adhesive layer, and each of the plurality of vibration generators may be include a plurality of vibration generating portions arranged in a first direction and a second direction crossing the first direction, a first protection member disposed at a first surface of each of the plurality of vibration generating portions by the first adhesive layer, and a second protection member disposed at a second surface of each of the plurality of vibration generating portions by the second adhesive layer.

According to some embodiments of the present disclosure, the plurality of vibration generating portions may be electrically separated and spaced apart from each other having a distance.

According to some embodiments of the present disclosure, the distance may be within a range from 0.1 mm to 3 cm.

According to some embodiments of the present disclosure, the first adhesive layer and the second adhesive layer may be coupled to each other to surround the plurality of vibration generation portions.

According to some embodiments of the present disclosure, each of the plurality of vibration generating portions may include a vibration portion, a first electrode portion disposed at a first surface of the vibration portion, and a second electrode portion disposed at a second surface different from the first surface of the vibration portion.

According to some embodiments of the present disclosure, the vibration portion may include a plurality of inorganic material portions, and an organic material portion between the plurality of inorganic material portions.

According to some embodiments of the present disclosure, an inorganic material portion of a vibration generator disposed at an upper layer among the plurality of vibration generators may overlap an inorganic material portion of a vibration generator disposed at a lower layer among the plurality of vibration generators, and/or the organic material portion of the vibration generator disposed at the upper layer may overlap the organic material portion of the vibration generator disposed at the lower layer.

According to some embodiments of the present disclosure, each of the plurality of vibration generators may include a vibration portion including a plurality of inorganic material portions having a piezoelectric characteristic and an organic material portion between the plurality of inorganic material portions, a first electrode portion disposed at a first surface of the vibration portion, and a second electrode portion disposed at a second surface different from the first surface of the vibration portion.

According to some embodiments of the present disclosure, the vibration apparatus may further include a vibration driving circuit including a plurality of amplifiers respectively connected to the plurality of vibration generators, the plurality of vibration generators may include a first group and a second group, the plurality of amplifiers may include a first amplifier group and a second amplifier group, an amplifier of the first amplifier group may include a first output terminal connected to a first electrode portion of a vibration generator of the first group, and a second output terminal connected to a second electrode portion of a vibration generator of the first group, and an amplifier of the second amplifier group may include a first output terminal connected to a second electrode portion of a vibration generator of the second group, and a second output terminal connected to a first electrode portion of a vibration generator of the second group.

An apparatus according to an embodiment of the present disclosure may include a vibration object, and a vibration apparatus in the vibration object, the vibration apparatus may include a plurality of vibration generators stacked to be displaced in the same direction, and an adhesive member between the plurality of vibration generators.

According to some embodiments of the present disclosure, the plurality of vibration generators may be symmetric to each other with respect to the adhesive member.

According to some embodiments of the present disclosure, each of the plurality of vibration generators may have the same size.

According to some embodiments of the present disclosure, an end portion of each of the plurality of vibration generators may be aligned on a virtual extension line extending in a thickness direction of the vibration apparatus.

According to some embodiments of the present disclosure, the vibration object may include a plate, and the plate may include a metal material, or comprises one or more single nonmetal materials or composite nonmetal materials of wood, plastic, glass, cloth, and leather.

According to some embodiments of the present disclosure, each of the plate and the plurality of vibration generators may have the same size.

According to some embodiments of the present disclosure, the vibration object may include a display panel including a plurality of pixels configured to display an image, or comprises a non-display panel of any one among a light emitting diode lighting panel, an organic light emitting lighting panel, and an inorganic light emitting lighting panel.

According to some embodiments of the present disclosure, the vibration object may include a display panel including a plurality of pixels configured to display an image, or include one or more among a vehicle interior material, a vehicle glass window, a building ceiling, a building glass window, a building interior material, an aircraft interior material, and an aircraft glass window.

According to some embodiments of the present disclosure, each of the plurality of vibration generators may include a vibration portion including a plurality of inorganic material portions having a piezoelectric characteristic and an organic material portion having an organic material between the plurality of inorganic material portions, a first electrode portion disposed at a first surface of the vibration portion, and a second electrode portion disposed at a second surface different from the first surface of the vibration portion.

It will be apparent to those skilled in the art that various modifications and variations can be made in the vibration apparatus and the apparatus including the same of the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An apparatus, comprising:
a display panel configured to display an image; and
a vibration apparatus at a rear surface of the display panel to vibrate the display panel,
wherein the vibration apparatus comprises a plurality of vibration generators overlapping one another,
wherein each of the plurality of vibration generators comprises:
a vibration structure;
a first adhesive layer disposed on one side of the vibration structure; and
a second adhesive layer disposed on the other side of the vibration structure, and
wherein the first adhesive layer and the second adhesive layer are coupled to each other to totally cover the vibration structure and are in contact with lateral surfaces of the vibration structure.

2. The apparatus of claim 1, wherein each of the plurality of vibration generators is displaced in the same direction.

3. The apparatus of claim 1, wherein each of the plurality of vibration generators has the same size.

4. The apparatus of claim 1, wherein an end portion of each of the plurality of vibration generators is aligned on a virtual extension line extending in a thickness direction of the display panel.

5. The apparatus of claim 1, wherein each of the plurality of vibration generators further comprises:
a first protection member disposed at a first surface of the vibration structure; and
a second protection member disposed at a second surface different from the first surface of the vibration structure.

6. The apparatus of claim 5, wherein the vibration structure comprises:
a vibration portion;
a first electrode portion disposed between the vibration portion and the first protection member; and
a second electrode portion disposed between the vibration portion and the second protection member.

7. The apparatus of claim 1, wherein the vibration structure comprises:
a vibration portion including a plurality of inorganic material portions having a piezoelectric characteristic and an organic material portion having an organic material between the plurality of inorganic material portions;
a first electrode portion disposed at a first surface of the vibration portion; and
a second electrode portion disposed at a second surface different from the first surface of the vibration portion.

8. The apparatus of claim 7,
wherein an inorganic material portion of a vibration generator disposed at an upper layer among the plurality of vibration generators overlaps an inorganic material portion of a vibration generator disposed at a lower layer among the plurality of vibration generators, and/or
wherein the organic material portion of the vibration generator disposed at the upper layer among the plurality of vibration generators overlaps the organic material portion of the vibration generator disposed at the lower layer among the plurality of vibration generators.

9. The apparatus of claim 1, wherein the vibration structure comprises:
a plurality of vibration generating portions arranged in a first direction and a second direction crossing the first direction;
a first protection member disposed at a first surface of each of the plurality of vibration generating portions by the first adhesive layer; and
a second protection member disposed at a second surface of each of the plurality of vibration generating portions by the second adhesive layer.

10. The apparatus of claim 9, wherein the plurality of vibration generating portions are electrically separated and spaced apart from each other having a distance.

11. The apparatus of claim 10, wherein the distance is within a range from 0.1 mm to 3 cm.

12. The apparatus of claim 9, wherein the first adhesive layer and the second adhesive layer are coupled to each other to surround the plurality of vibration generation portions.

13. The apparatus of claim 9, wherein each of the plurality of vibration generating portions comprises:
a vibration portion;
a first electrode portion disposed at a first surface of the vibration portion; and
a second electrode portion disposed at a second surface different from the first surface of the vibration portion.

14. The apparatus of claim 13, wherein the vibration portion comprises:
a plurality of inorganic material portions; and
an organic material portion between the plurality of inorganic material portions.

15. The apparatus of claim 14,
wherein an inorganic material portion of a vibration generator disposed at an upper layer among the plurality of vibration generators overlaps an inorganic material portion of a vibration generator disposed at a lower layer among the plurality of vibration generators, and/or
wherein the organic material portion of the vibration generator disposed at the upper layer among the plurality of vibration generators overlaps the organic material portion of the vibration generator disposed at the lower layer among the plurality of vibration generators.

16. The apparatus of claim 1,
wherein each of the plurality of vibration generators comprises:
a vibration portion;
a first electrode portion disposed at a first surface of the vibration portion; and
a second electrode portion disposed at a second surface different from the first surface of the vibration portion, and
wherein the first electrode portion of each of the plurality of vibration generators is disposed closer to the display panel than the second electrode portion.

17. The apparatus of claim 16, further comprising a vibration driving circuit including a plurality of amplifiers respectively connected to the plurality of vibration generators,
wherein the plurality of vibration generators comprise a first group and a second group,
wherein the plurality of amplifiers comprise a first amplifier group and a second amplifier group,
wherein an amplifier of the first amplifier group comprises a first output terminal connected to a first electrode portion of a vibration generator of the first group, and a second output terminal connected to a second electrode portion of a vibration generator of the first group, and
wherein an amplifier of the second amplifier group comprises a first output terminal connected to a second electrode portion of a vibration generator of the second group, and a second output terminal connected to a first electrode portion of a vibration generator of the second group.

18. The apparatus of claim 1, wherein each of the plurality of vibration generators comprises:
a vibration portion;
a first electrode portion disposed at a first surface of the vibration portion; and
a second electrode portion disposed at a second surface different from the first surface of the vibration portion,
wherein the plurality of vibration generators comprise a first group and a second group,
wherein in a vibration generator of the first group, the first electrode portion is disposed closer to the display panel than the second electrode portion, and
wherein in a vibration generator of the second group, the second electrode portion is disposed closer to the display panel than the first electrode portion.

19. The apparatus of claim 18, further comprising a vibration driving circuit including a plurality of amplifiers respectively connected to the plurality of vibration generators,
wherein each of the plurality of amplifiers comprises:
a first output terminal connected to a first electrode portion of a corresponding vibration generator of the plurality of vibration generators; and
a second output terminal connected to a second electrode portion of a corresponding vibration generator of the plurality of vibration generators.

20. An apparatus, comprising:
a display panel configured to display an image;
a vibration apparatus at a rear surface of the display panel; and
a plate disposed between the display panel and the vibration apparatus,
wherein the vibration apparatus comprises:
a plurality of vibration generators stacked to be displaced in the same direction; and
an adhesive member between the plurality of vibration generators,
wherein each of the plurality of vibration generators comprises:
a vibration structure;
a first adhesive layer disposed on one side of the vibration structure; and
a second adhesive layer disposed on the other side of the vibration structure, and
wherein the first adhesive layer and the second adhesive layer are coupled to each other to totally cover the vibration structure and are in contact with lateral surfaces of the vibration structure.

21. The apparatus of claim 20, wherein the plurality of vibration generators are symmetric to each other with respect to the adhesive member.

22. The apparatus of claim 20,
wherein the display panel comprises a first region and a second region,
the vibration apparatus comprises a first vibration device disposed at the first region and a second vibration device disposed at the second region, and
wherein each of the first vibration device and the second vibration device comprises the plurality of vibration generators and the adhesive member.

23. The apparatus of claim 22, further comprising:
a supporting member disposed at the rear surface of the display panel; and
a partition disposed between the rear surface of the display panel and the supporting member, the partition being between the first region and the second region.

24. The apparatus of claim 22,
wherein the vibration apparatus further comprises:
a third vibration device disposed in the first region; and
a fourth vibration device disposed in the second region, and
wherein each of the third vibration device and the fourth vibration device comprises the plurality of vibration generators and the adhesive member.

25. The apparatus of claim 24,
wherein the first and third vibration devices are disposed in parallel or to be staggered in the first region, and
wherein the second and fourth vibration devices are disposed in parallel or to be staggered in the second region.

* * * * *